(12) United States Patent
Yuan et al.

(10) Patent No.: US 12,720,957 B2
(45) Date of Patent: Aug. 25, 2026

(54) DISPLAY SUBSTRATE AND DISPLAY APPARATUS

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Yu Wang, Beijing (CN); Dacheng Zhang, Beijing (CN); Xinxin Wang, Beijing (CN); Bin Zhou, Beijing (CN); Ning Liu, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 377 days.

(21) Appl. No.: 18/558,291

(22) PCT Filed: Apr. 29, 2022

(86) PCT No.: PCT/CN2022/090408
§ 371 (c)(1),
(2) Date: Oct. 31, 2023

(87) PCT Pub. No.: WO2023/206402
PCT Pub. Date: Nov. 2, 2023

(65) Prior Publication Data

US 2025/0098416 A1 Mar. 20, 2025

(51) Int. Cl.
*H10K 59/121* (2023.01)
*H10K 59/124* (2023.01)
(Continued)

(52) U.S. Cl.
CPC ....... *H10K 59/1213* (2023.02); *H10K 59/124* (2023.02); *H10K 59/1315* (2023.02); *H10K 59/351* (2023.02); *H10K 59/353* (2023.02)

(58) Field of Classification Search
CPC ............. H10K 59/1213; H10K 59/124; H10K 59/1315; H10K 59/351; H10K 59/353;
(Continued)

(56) References Cited

U.S. PATENT DOCUMENTS 9,419,068 B2 8/2016 Matsumoto
2010/0194272 A1 8/2010 Kubota
(Continued)

FOREIGN PATENT DOCUMENTS

CN 101901569 A 12/2010
CN 104064686 A 9/2014
(Continued)

OTHER PUBLICATIONS

Extended European Search Report from Application No. 22939250.1; Mailing date: Apr. 23, 2025.
(Continued)

*Primary Examiner* — William B Partridge
*Assistant Examiner* — Chevy J Boegel
(74) *Attorney, Agent, or Firm* — Dilworth & Barrese, LLP.; Michael J. Musella, Esq.

(57) ABSTRACT

A display substrate and a display apparatus are provided. In the display substrate, the light emitting device includes a common electrode connected to a common voltage terminal. The display unit includes an auxiliary electrode line, a first auxiliary electrode and an auxiliary insulation layer. The auxiliary electrode line includes a longitudinal portion located in the display region and a transverse portion at least partially located in the non-light-emitting region, and the transverse portion is connected with the longitudinal por-
(Continued)

tion; the first auxiliary electrode is located in the non-luminous region and electrically connected with the common electrode; the auxiliary insulation layer includes a first auxiliary via hole located in the non-light emitting region and exposing at least part of the lateral portion, and the first auxiliary electrode is connected with the lateral portion through the first auxiliary via hole.

20 Claims, 22 Drawing Sheets

(51) Int. Cl.
*H10K 59/131* (2023.01)
*H10K 59/35* (2023.01)

(58) Field of Classification Search
CPC .... H10K 59/123; H10K 59/131; H10K 59/35; H10K 59/80517; H10K 59/80522
See application file for complete search history.

(56) References Cited

U.S. PATENT DOCUMENTS

| | | | |
|---|---|---|---|
| 2011/0032442 | A1 | 2/2011 | Van Aerle et al. |
| 2014/0313107 | A1 | 10/2014 | Lee |
| 2016/0189591 | A1 | 6/2016 | Yoon et al. |
| 2019/0035874 | A1 | 1/2019 | Han et al. |
| 2019/0057977 | A1 | 2/2019 | Ren et al. |
| 2019/0173057 | A1 | 6/2019 | Jung et al. |
| 2019/0229163 | A1 | 7/2019 | Murai et al. |
| 2020/0058896 | A1 | 2/2020 | Wang et al. |
| 2022/0013610 | A1 | 1/2022 | Li et al. |
| 2022/0020947 | A1 | 1/2022 | Park |
| 2022/0020953 | A1 | 1/2022 | Huang et al. |
| 2022/0052147 | A1 | 2/2022 | Liu et al. |
| 2022/0123069 | A1 | 4/2022 | Kim et al. |
| 2022/0199746 | A1 | 6/2022 | Kim et al. |
| 2022/0246711 | A1 | 8/2022 | Zhang |
| 2023/0060545 | A1 | 3/2023 | Du et al. |
| 2023/0363223 | A1 | 11/2023 | Zhang et al. |

FOREIGN PATENT DOCUMENTS

| | | | | | |
|---|---|---|---|---|---|
| CN | 105633120 | A | | 6/2016 | |
| CN | 106876436 | A | | 6/2017 | |
| CN | 109148527 | A | | 1/2019 | |
| CN | 109904202 | A | | 6/2019 | |
| CN | 110265458 | A | | 9/2019 | |
| CN | 209859955 | U | | 12/2019 | |
| CN | 110718571 | A | | 1/2020 | |
| CN | 110729337 | A | | 1/2020 | |
| CN | 112331714 | A | | 2/2021 | |
| CN | 113471268 | A | * | 10/2021 | ........... H10K 59/123 |
| CN | 114300522 | A | | 12/2021 | |
| CN | 113964154 | A | | 1/2022 | |
| CN | 114664895 | A | | 6/2022 | |
| EP | 4050662 | A1 | | 8/2022 | |
| JP | 2007156387 | A | | 6/2007 | |
| JP | 2015201325 | A | | 11/2015 | |
| KR | 1020160092183 | A | | 8/2016 | |
| KR | 1020180079095 | A | | 7/2018 | |
| KR | 20200077677 | A | * | 7/2020 | ........... H10K 59/124 |
| KR | 1020200077677 | A | | 7/2020 | |
| WO | 2020233531 | A1 | | 11/2020 | |
| WO | 2022057527 | A1 | | 3/2022 | |

OTHER PUBLICATIONS

Extended European Search Report from Application No. 22939249.3; Mailing date: May 8, 2025.

US Office Action in U.S. Appl. No. 18/558,269; Mailing date: Mar. 3, 2025.

US Office Action in U.S. Appl. No. 18/558,277; Mailing date: Mar. 13, 2025.

Korean Office Action from Application No. 10-2024-7024143; Mailing Date: Nov. 12, 2025.

First Office Action from Japanese Application No. 2024-542370; Mailing Date: Jun. 2, 2026.

* cited by examiner 400
901
901
902
21/2a
901
31
30
32
22/2a
901

DISPLAY SUBSTRATE AND DISPLAY APPARATUS

TECHNICAL FIELD

At least one embodiment of the present disclosure relates to a display substrate and a display apparatus.

BACKGROUND

With the continuous development of display technology, OLED technology is increasingly employed in transparent display. Transparent display is an important personalized display field of display technology, refers to a case that an image is displayed in a transparent state, the viewer can not only see the image in the display apparatus, but also see the scene behind the display apparatus. A transparent display apparatus adopting AMOLED technology usually divides each pixel into a display region and a non-light-emitting region, the display region is provided with a pixel driving circuit and a light-emitting device to achieve image display, and the non-light-emitting region achieves light transmission.

SUMMARY

At least one embodiment of the present disclosure further provides a display substrate, and the display substrate includes a base substrate and a display unit provided on the base substrate. The display unit includes a display region and a non-light-emitting region, the display region includes a sub-pixel, the sub-pixel includes a driving transistor and a light-emitting device, the driving transistor is configured to control magnitude of a driving current flowing through the light-emitting device, and the light-emitting device is configured to receive the driving current and be driven by the driving current to emit light; the light-emitting device includes a first electrode and a common electrode, and the common electrode is connected to a common voltage terminal; the display unit includes an auxiliary electrode line, a first auxiliary electrode, and an auxiliary insulation layer; the auxiliary electrode line includes a longitudinal portion located in the display region and a lateral portion at least partially located in the non-light-emitting region, and the lateral portion is connected to the longitudinal portion; the first auxiliary electrode is located in the non-light-emitting region and is electrically connected to the common electrode; the auxiliary insulation layer includes a first auxiliary via hole located in the non-light-emitting region and exposing at least part of the lateral portion, and the first auxiliary electrode is connected to the lateral portion through the first auxiliary via hole; the lateral portion, the first auxiliary electrode, and the first auxiliary via hole constitute one auxiliary unit, and the display unit includes a plurality of the auxiliary units; and the lateral portion of the auxiliary electrode line extends along a first direction, the longitudinal portion of the auxiliary electrode line extends along a second direction intersecting with the first direction, and the plurality of the auxiliary units are arranged at intervals in the second direction.

For example, in the display substrate provided by at least one embodiment of the present disclosure, the plurality of the auxiliary units comprise a first auxiliary unit and a second auxiliary unit, and the first auxiliary unit and the second auxiliary unit are respectively the one auxiliary unit; and a distance between a first auxiliary via hole of the second auxiliary unit and the display region in the first direction is greater than a distance between a first auxiliary via hole of the first auxiliary unit and the display region in the first direction.

For example, in the display substrate provided by at least one embodiment of the present disclosure, a length of the lateral portion of the second auxiliary unit in the first direction is greater than a length of the lateral portion of the first auxiliary unit in the first direction.

For example, in the display substrate provided by at least one embodiment of the present disclosure, the first auxiliary electrode comprises: a first sub-conductive layer, a first stacked portion, and a second stacked portion. The first sub-conductive layer is connected to the lateral portion through the first auxiliary via hole; the first stacked portion is electrically connected to the first sub-conductive layer and stacked with the first stacked portion in a direction perpendicular to the base substrate, located on a side of the first sub-conductive layer away from the base substrate, and comprises a first stacked layer and a second stacked layer that are stacked with each other in the direction perpendicular to the base substrate, the second stacked layer is located on a side of the first stacked layer away from the base substrate and is connected to the common electrode; the second stacked portion is stacked with the first sub-conductive layer in the direction perpendicular to the base substrate, located on the side of the first sub-conductive layer away from the base substrate and located on a side of the first stacked portion away from the base substrate, electrically connected to the first stacked portion through the first sub-conductive layer, and comprises a third stacked layer and a fourth stacked layer that are stacked with each other in the direction perpendicular to the base substrate; the third stacked layer, the first stacked layer and a light-emitting layer of the light-emitting device located in the display region are made of a same material, in a same layer, and spaced apart from each other in a direction parallel to the base substrate, and the fourth stacked layer, the second stacked layer and the common electrode of the light-emitting device located in the display region are in a same layer, and spaced apart from each other in the direction parallel to the base substrate; and the first stacked layer of the first stacked portion of the second auxiliary unit comprises an intermediate via hole, and the second stacked layer of the first stacked portion of the second auxiliary unit is electrically connected to the first sub-conductive layer of the second auxiliary unit through the intermediate via hole.

For example, in the display substrate provided by at least one embodiment of the present disclosure, an area of a planar shape of a first auxiliary via hole of the second auxiliary unit is larger than an area of a planar shape of a first auxiliary via hole of the first auxiliary unit.

For example, in the display substrate provided by at least one embodiment of the present disclosure, one display unit comprises at least two first auxiliary units, and an amount of the second auxiliary units is greater than or equal to one.

For example, in the display substrate provided by at least one embodiment of the present disclosure, the one display unit comprises at least three first auxiliary units, and in the second direction, at least one second auxiliary unit is located between the at least three first auxiliary units.

For example, in the display substrate provided by at least one embodiment of the present disclosure, the display unit comprises a plurality of sub-pixels arranged in an array, and the array comprises a first pixel row extending along the first direction and a second pixel row extending along the first direction; the first pixel row comprises a first sub-pixel and a second sub-pixel that are arranged adjacent to each other, and the second pixel row comprises a third sub-pixel and a fourth sub-pixel that are arranged adjacent to each other; in one display unit, the at least two first auxiliary units comprise No. 1 first auxiliary unit, No. 2 first auxiliary unit and No. 3 first auxiliary unit; and the No. 1 first auxiliary unit and the No. 2 first auxiliary unit are in the second sub-pixel, and the No. 3 auxiliary unit and the second auxiliary unit are in the fourth sub-pixel.

For example, in the display substrate provided by at least one embodiment of the present disclosure, each sub-pixel of the display unit comprises: a connection structure and a first transfer electrode. The connection structure electrically connects a first portion of the first electrode and a second portion of the first electrode, and comprises a connection portion located in the non-light-emitting region; and the first transfer electrode is electrically connected to a first pole of the driving transistor and comprising a portion located in the non-light-emitting region, the connection portion is electrically connected, in the non-light-emitting region, to the portion of the first transfer electrode located in the non-light-emitting region; the first transfer electrode comprises a first transfer portion, the first transfer portion is located in the display region and electrically connected to the first pole of the driving transistor; a portion of the first transfer electrode located in the non-light-emitting region is a second transfer portion of the first transfer electrode, the second transfer portion is electrically connected to the first transfer portion, the connection portion and the second transfer portion are respectively in different layers, and the connection portion is electrically connected, in the non-light-emitting region, to the second transfer portion through a first via hole; the No. 1 first auxiliary unit and the No. 2 first auxiliary unit are respectively located on two opposite sides of the connection portion of the second sub-pixel in the second direction, and the No. 3 first auxiliary unit and the second auxiliary unit are respectively located on two opposite sides of the connection portion of the fourth sub-pixel in the second direction.

For example, in the display substrate provided by at least one embodiment of the present disclosure, in the second direction, the second auxiliary unit is located on a side of the connection portion of the fourth sub-pixel close to a junction of the fourth sub-pixel and the second sub-pixel; or, in the second direction, the second auxiliary unit is located on a side of the connection portion of the fourth sub-pixel away from the junction of the fourth sub-pixel and the second sub-pixel.

For example, in the display substrate provided by at least one embodiment of the present disclosure, an area of a planar shape of the first auxiliary via hole of the first auxiliary unit is larger than an area of a planar shape of the first via hole.

For example, in the display substrate provided by at least one embodiment of the present disclosure, in one auxiliary unit of the at least one auxiliary unit, the first auxiliary electrode comprises: a first sub-conductive layer, a first stacked portion, and a second stacked portion. The first sub-conductive layer is connected to the lateral portion through the first auxiliary via hole; the first stacked portion is electrically connected to the first sub-conductive layer and stacked with the first sub-conductive layer in a direction perpendicular to the base substrate, located on a side of the first sub-conductive layer away from the base substrate, and comprises a first stacked layer and a second stacked layer that are stacked with each other in the direction perpendicular to the base substrate, wherein the second stacked layer is located on a side of the first stacked layer away from the base substrate and is connected to the common electrode; the second stacked portion is stacked with the first sub-conductive layer in the direction perpendicular to the base substrate, located on the side of the first sub-conductive layer away from the base substrate and located on a side of the first stacked portion away from the base substrate, electrically connected to the first stacked portion through the first sub-conductive layer, and comprises a third stacked layer and a fourth that are stacked layer stacked with each other in the direction perpendicular to the base substrate, wherein the third stacked layer and the first stacked layer are made of a same material, in a same layer, and spaced apart from each other in a direction parallel to the base substrate, and the fourth stacked layer and the second stacked layer are made of a same material, in a same layer, and spaced apart from each other in the direction parallel to the base substrate.

For example, in the display substrate provided by at least one embodiment of the present disclosure, the second stacked layer is electrically connected to the common electrode and is in contact with the first sub-conductive layer; the first stacked layer is in contact with the first sub-conductive layer; and the second stacked layer comprises an upper portion covering an upper surface of the first stacked layer away from the base substrate and a side portion covering a side surface of the first stacked layer intersecting with the upper surface of the first stacked layer, and the side portion is in contact with the first sub-conductive layer.

For example, in the display substrate provided by at least one embodiment of the present disclosure, the second stacked portion further comprises: a fifth stacked layer and a sixth stacked layer. The fifth stacked layer is located between the first sub-conductive layer and the third stacked layer; the sixth stacked layer is located between the fifth stacked layer and the third stacked layer, wherein the fifth stacked layer and the sixth stacked layer are stacked with the first sub-conductive layer, the third stacked layer, and the fourth stacked layer in a direction perpendicular to the base substrate and are electrically connected to each other, and the fifth stacked layer and the sixth stacked layer are both spaced apart from both of the first stacked layer and the second stacked layer in a direction parallel to the base substrate; an orthographic projection of the sixth stacked layer on the base substrate comprises a middle region and an edge region surrounding the middle region, and an orthographic projection of the fifth stacked layer on the base substrate overlaps with the middle region, and does not overlap with the edge region; the second stacked layer is in contact with the first sub-conductive layer in a first region, and an orthographic projection of the first region on the base substrate is at least partially within an orthographic projection of the edge region on the base substrate.

For example, in the display substrate provided by at least one embodiment of the present disclosure, the light-emitting device further comprises a first electrode and a light-emitting layer that are located in the display region, the light-emitting layer is sandwiched between the first electrode and the common electrode, and the first electrode comprises a first sub-electrode layer, a second sub-electrode layer and a third sub-electrode layer that are sequentially stacked in the direction perpendicular to the base substrate and along a direction from a position close to the base substrate to a position away from the base substrate; the first sub-conductive layer of the first auxiliary electrode and the first sub-electrode layer are made of a same material and in a same layer, the first stacked layer and the light-emitting layer constitute a continuous and integrated structure, the second stacked layer and the common electrode constitute a continuous and integrated structure, the third stacked layer and the light-emitting layer are made of a same material and in a same layer, the fourth stacked layer, the second stacked layer, and the common electrode are made of a same material and in a same layer, the fifth stacked layer and the second sub-electrode layer are made of a same material and in a same layer, and the sixth stacked layer and the third sub-electrode layer are made of a same material and in a same layer.

For example, in the display substrate provided by at least one embodiment of the present disclosure, the display unit further comprises a second auxiliary electrode, the second auxiliary electrode is located in the display region and electrically connected to the common electrode; the auxiliary insulation layer further comprises a second auxiliary via hole which is located in the display region and exposes at least part of the longitudinal portion of the auxiliary electrode line, and the second auxiliary electrode is connected to the longitudinal portion of the auxiliary electrode line through the second auxiliary via hole.

For example, in the display substrate provided by at least one embodiment of the present disclosure, the second auxiliary electrode comprises a second sub-conductive layer and a second stacked portion, the second sub-conductive layer is connected to the longitudinal portion of the auxiliary electrode line through the second auxiliary via hole; the first stacked portion is electrically connected to the second sub-conductive layer of the second auxiliary electrode and stacked in a direction perpendicular to the base substrate, located on a side of the second sub-conductive layer of the second auxiliary electrode away from the base substrate, and comprises a first stacked layer and a second stacked layer stacked on each other in the direction perpendicular to the base substrate, wherein the second stacked layer of the second auxiliary electrode is located on a side of the first stacked layer of the second auxiliary electrode away from the base substrate and is connected to the common electrode; the second stacked portion is stacked on the second sub-conductive layer of the second auxiliary electrode in the direction perpendicular to the base substrate, located on the side of the second sub-conductive layer of the second auxiliary electrode away from the base substrate and located on a side of the first stacked portion of the second auxiliary electrode away from the base substrate, electrically connected to the first stacked portion of the second auxiliary electrode through the second sub-conductive layer, and comprises a third stacked layer and a fourth stacked layer that are stacked with each other in the direction perpendicular to the base substrate; the third stacked layer of the second auxiliary electrode and the first stacked layer of the second auxiliary electrode are made of a same material, in a same layer, and spaced apart from each other in a direction parallel to the base substrate, and the fourth stacked layer of the second auxiliary electrode and the second stacked layer of the second auxiliary electrode are made of a same material, in a same layer, and spaced apart from each other in the direction parallel to the base substrate.

For example, in the display substrate provided by at least one embodiment of the present disclosure, the second stacked layer of the second auxiliary electrode is connected to the common electrode and in contact with the second sub-conductive layer of the second auxiliary electrode.

For example, in the display substrate provided by at least one embodiment of the present disclosure, the lateral portion of the auxiliary electrode line extends along a first direction, and the longitudinal portion of the auxiliary electrode line extends along a second direction intersecting with the first direction; the display substrate further comprises a first power supply line, the first power supply line is connected to a first voltage terminal and configured to provide a first power supply voltage different from a common voltage to the sub-pixel, and comprising a longitudinal portion extending along the second direction as a whole; the longitudinal portion of the first power supply line and the longitudinal portion of the auxiliary electrode line are arranged at intervals in the first direction, and are respectively located at a first edge of the display region in the first direction and at a second edge, opposite the first edge, of the display region in the first direction; a region, between an edge of the longitudinal portion of the first power supply line away from the longitudinal portion of the auxiliary electrode line and an edge of the longitudinal portion of the auxiliary electrode line away from the longitudinal portion of the first power supply line, is the display region.

At least one embodiment of the present disclosure provides a display apparatus, the display apparatus comprises the display substrate according to any one of the display substrates provided by the embodiments of the present disclosure.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1A:
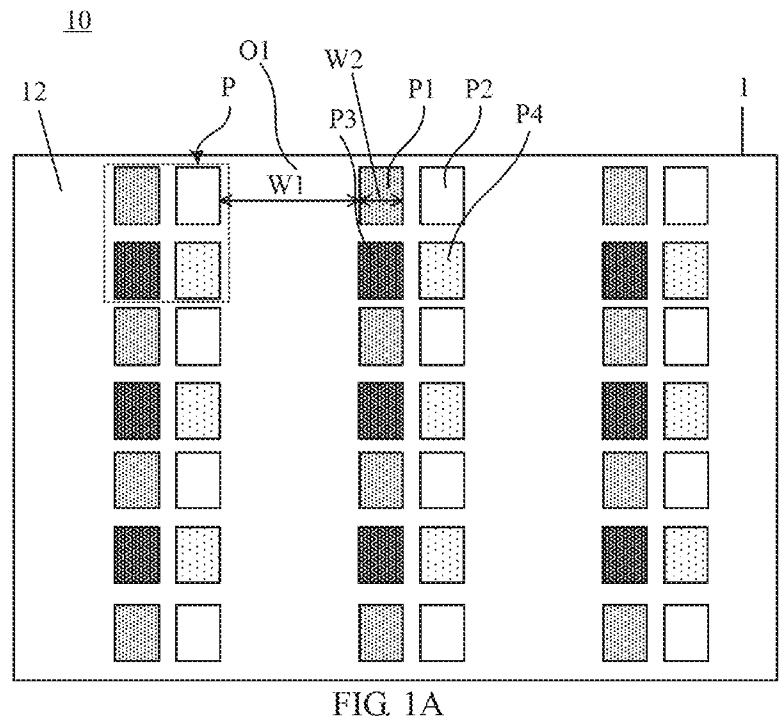
FIG. 1A is a schematic overall planar view of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In the present disclosure, an orthographic projection of a certain structure on a base substrate refers to an orthographic projection of the structure on a surface of the base substrate on which various transistors and various signal lines are provided.

In the present disclosure, the description that structure A and structure B constitute a continuous and integrated structure means that structure A and structure B are made of the same material and have no seams between each other, and are an integrated structure with uniform texture, for example, structure A and structure B are formed through the same patterning process. The letters A, B are used to refer to the corresponding structures described in the present disclosure.

At least one embodiment of the present disclosure provides a display substrate, and the display substrate includes a base substrate and a display unit. The display unit is provided on the base substrate and includes a display region and a non-light-emitting region; the display region includes a sub-pixel, and the sub-pixel includes a driving transistor and a light-emitting device; the driving transistor is configured to control magnitude of a driving current flowing through the light-emitting device, and includes a gate electrode, a first pole and a second pole; the light-emitting device is configured to receive the driving current and be driven by the driving current to emit light, and includes a first electrode, and the first electrode includes a first portion and a second portion that are spaced apart from each other; the display unit further includes a connection structure and a first transfer electrode, and the connection structure is connected to the first portion of the first electrode and the second portion of the first electrode, and includes a connection portion located in the non-light-emitting region; and the first transfer electrode is connected to the first pole of the driving transistor and includes a portion located in the non-light-emitting region, and the connection portion is electrically connected, in the non-light-emitting region, to the portion of the first transfer electrode located in the non-light-emitting region.

At least one embodiment of the present disclosure further provides a display substrate, and the display substrate includes a base substrate, a display unit, a scanning signal line, and a longitudinal signal line. The display unit is provided on the base substrate and includes a display region and a non-light-emitting region; the display region includes a sub-pixel, the sub-pixel includes a driving transistor and a light-emitting device, the driving transistor is configured to control magnitude of a driving current flowing through the light-emitting device, and the light-emitting device is configured to receive the driving current and be driven by the driving current to emit light; the scanning signal line is provided on the base substrate, extends along a first direction as a whole, passes through the non-light-emitting region and the display region, and transmits a scanning signal; the longitudinal signal line is provided on the base substrate and located in the display region, and extends along a second direction intersecting with the first direction as a whole; and the scanning signal line includes at least one outer ring portion, and each of the at least one outer ring portion includes a first conductive line and a second conductive line. The first conductive line extends along the first direction as a whole, and extends from the non-light-emitting region to the display region; the second conductive line extends along the first direction as a whole, extends from the non-light-emitting region to the display region, and is spaced apart from the first conductive line in the second direction; both the first conductive line and the second conductive line overlap with the longitudinal signal line in a direction perpendicular to the base substrate; and the scanning signal line includes a trunk portion extending along the first direction as a whole, and both the first conductive line and the second conductive line are electrically connected to the trunk portion. In the display substrate, the first conductive line and the second conductive line transmit the same scanning signal, and the first conductive line and the second conductive line of at least one outer ring portion extend from the non-light-emitting region to the display region to overlap with the longitudinal signal line.

At least one embodiment of the present disclosure further provides a display substrate, and the display substrate includes a base substrate and a display unit. The display unit is provided on the base substrate and includes a display region; the display region includes a plurality of sub-pixels, each sub-pixel in the plurality of sub-pixels includes a driving transistor and a light-emitting device, and the driving transistor is configured to control magnitude of a driving current flowing through the light-emitting device, and includes a gate electrode, a first pole and a second pole; the light-emitting device is configured to receive the driving current and be driven by the driving current to emit light, and includes a first electrode, and the first electrode is connected to the first pole of the driving transistor; the display unit further includes a pixel definition layer, and the pixel definition layer defines opening regions of the plurality of sub-pixels; two adjacent sub-pixels among the plurality of sub-pixels of the display unit are respectively an upper sub-pixel and a lower sub-pixel, and a direction perpendicular to an arrangement direction of the upper sub-pixel and the lower sub-pixel is a reference direction; a first electrode of the upper sub-pixel includes a first edge close to the lower sub-pixel and a second edge which intersects with the first edge of the first electrode and is located on a first side of the first edge of the first electrode in the reference direction; an opening region of the upper sub-pixel includes a first edge close to the lower sub-pixel and a second edge which intersects the first edge of the opening region and is located on a first side of the first edge of the opening region in the reference direction; and a distance between the first edge of the first electrode of the upper sub-pixel and the first edge of the opening region of the upper sub-pixel is a first distance, a distance between the second edge of the first electrode of the upper sub-pixel and the second edge of the opening region of the upper sub-pixel is a second distance, and the first distance is greater than the second distance.

At least one embodiment of the present disclosure further provides a display substrate, and the display substrate includes a base substrate and a display unit provided on the base substrate. The display unit includes a display region and a non-light-emitting region, the display region includes a sub-pixel, the sub-pixel includes a driving transistor and a light-emitting device, the driving transistor is configured to control magnitude of a driving current flowing through the light-emitting device, and the light-emitting device is configured to receive the driving current and be driven by the driving current to emit light; the light-emitting device includes a first electrode and a common electrode, and the common electrode is connected to a common voltage terminal; the display unit includes an auxiliary electrode line, a first auxiliary electrode, and an auxiliary insulation layer; the auxiliary electrode line includes a longitudinal portion located in the display region and a lateral portion at least partially located in the non-light-emitting region, and the lateral portion is connected to the longitudinal portion; the first auxiliary electrode is located in the non-light-emitting region and is electrically connected to the common electrode; the auxiliary insulation layer includes a first auxiliary via hole located in the non-light-emitting region and exposing at least part of the lateral portion, and the first auxiliary electrode is connected to the lateral portion through the first auxiliary via hole; the lateral portion, the first auxiliary electrode, and the first auxiliary via hole constitute one auxiliary unit, and the display unit includes a plurality of the auxiliary units; and the lateral portion of the auxiliary electrode line extends along a first direction, the longitudinal portion of the auxiliary electrode line extends along a second direction intersecting with the first direction, and the plurality of the auxiliary units are arranged at intervals in the second direction.

At least one embodiment of the present disclosure further provides a display apparatus, and the display apparatus includes any one of the display substrates provided by the embodiments of the present disclosure.

The display substrate provided by the present disclosure can be applied to a transparent display apparatus, such as a large-sized transparent display apparatus, for example, the large-size transparent display apparatus includes a display panel larger than 55 inches. The transparent display apparatus displays images in a transparent state, and the viewer can not only see the image displayed in the display apparatus, but also see the scene behind the display apparatus.

Organic Light Emitting Diode (OLED) is an active light-emitting display apparatus, which has the advantages of light emission, ultra-thin, wide viewing angle, high brightness, high contrast, low power consumption, and extremely high response speed. According to different driving methods, OLED is divided into passive matrix (PM) drive type and active matrix (AM) drive type. AMOLED is a current-driving device, and adopts an independent thin film transistor (TFT) to control each sub-pixel, and each sub-pixel can be continuously and independently driven to emit light. A transparent display apparatus adopting AMOLED technology usually divides each pixel into a display region and a non-light-emitting region, the display region is provided with a pixel driving circuit and a light-emitting device to achieve image display, and the non-light-emitting region achieves light transmission.

Deterioration of characteristics or an internal short circuit fault of a thin film transistor may occur in a circuit of a display apparatus, or a manufacturing process of the thin film transistor, or a manufacturing process of an organic light emitting diode.

If a thin film transistor is not normally driven, one pixel or sub-pixel may become a dark spot because current or voltage is not applied to an organic light emitting diode connected to the thin film transistor. Alternatively, if a source electrode and a drain electrode of a driving thin film transistor are short-circuited, the driving thin film transistor cannot be driven normally, and the voltage applied to the source electrode is directly applied to the drain electrode without turning on/off, thereby the sub-pixel is always kept in the on state, and thus a bright spot appears.

Because the bright spot is easily seen by user's eyes due to its good visibility, the bright spot degrades the display quality. For this reason, even if only one bright spot appears in the display region, the display apparatus is considered to be defective, resulting in a problem that the display apparatus cannot be manufactured as a final product. In particular, because the dark spot or the bright spot in a transparent display apparatus or a top emission type large-sized display apparatus may be seen by user's eyes, a solution that can avoid or minimize the dark spot or the bright spot is required.

In the transparent display apparatus, due to the need to reserve a sufficient non-light-emitting region, the space in the display region for providing a pixel driving circuit is limited, and the circuit wiring in the display region needs to be minimized.

At least one embodiment of the disclosure provides a display substrate, and the display substrate includes a base substrate and a display unit. The display unit is provided on the base substrate and includes a display region and a non-light-emitting region; the display region includes a sub-pixel, and the sub-pixel includes a driving transistor and a light-emitting device; the driving transistor is configured to control magnitude of a driving current flowing through the light-emitting device, and includes a gate electrode, a first pole and a second pole; the light-emitting device is configured to receive the driving current and be driven by the driving current to emit light, and includes a first electrode, and the first electrode includes a first portion and a second portion that are spaced apart from each other; the display unit further includes a connection structure and a first transfer electrode, and the connection structure is connected to the first portion of the first electrode and the second portion of the first electrode, and includes a connection portion located in the non-light-emitting region; and the first transfer electrode is connected to the first pole of the driving transistor and includes a portion located in the non-light-emitting region, and the connection portion is electrically connected, in the non-light-emitting region, to the portion of the first transfer electrode that is located in the non-light-emitting region.

Exemplarily, FIG. 1A is a schematic overall planar view of a display substrate provided by an embodiment of the present disclosure. As illustrated in FIG. 1A, the display substrate 10 includes a base substrate 1 and a display unit P provided on the base substrate, for example, includes a plurality of display units P, for example, the plurality of display units P are arranged in an array. Each display unit P includes a display region 11 and a non-light-emitting region 12, the display region 11 includes a sub-pixel, for example, the display unit P includes a plurality of sub-pixels arranged in an array, and the array includes a first pixel row extending along a first direction D1 and a second pixel row extending along the first direction D1; the first pixel row includes a first sub-pixel P1 and a second sub-pixel P2 that are arranged adjacent to each other, and the second pixel row includes a third sub-pixel P3 and a fourth sub-pixel P4 that are arranged adjacent to each other. FIG. 1A takes the case where the display region 11 of each display unit P includes the first sub-pixel P1, the second sub-pixel P2, the third sub-pixel P3 and the fourth sub-pixel P4 as an example. Of course, in other embodiments, the display region 11 of each display unit P may includes more than or less than four sub-pixels.

For example, the first sub-pixel P1 is a red sub-pixel (R) emitting red light, the second sub-pixel P2 is a green sub-pixel (G) emitting green light, the third sub-pixel P3 is a white sub-pixel (W) emitting white light, and the fourth sub-pixel P4 is blue white sub-pixel (B) emitting blue light. Of course, the emitting colors of the first sub-pixel P1, the second sub-pixel P2, the third sub-pixel P3 and the fourth sub-pixel P4 are not limited to the above-mentioned case, and the embodiments of the present disclosure are not limited in this aspect.

In some embodiments, the shape of each sub-pixel may be a rectangle, a rhombus, a pentagon or a hexagon. In an exemplary embodiment, four sub-pixels may be arranged horizontally in parallel to form an RWBG pixel arrangement. In some other embodiments, the four sub-pixels may be arranged in a square of a diamond arrangement or arranged vertically in parallel, which is not limited in the present disclosure.

Figure 2A:
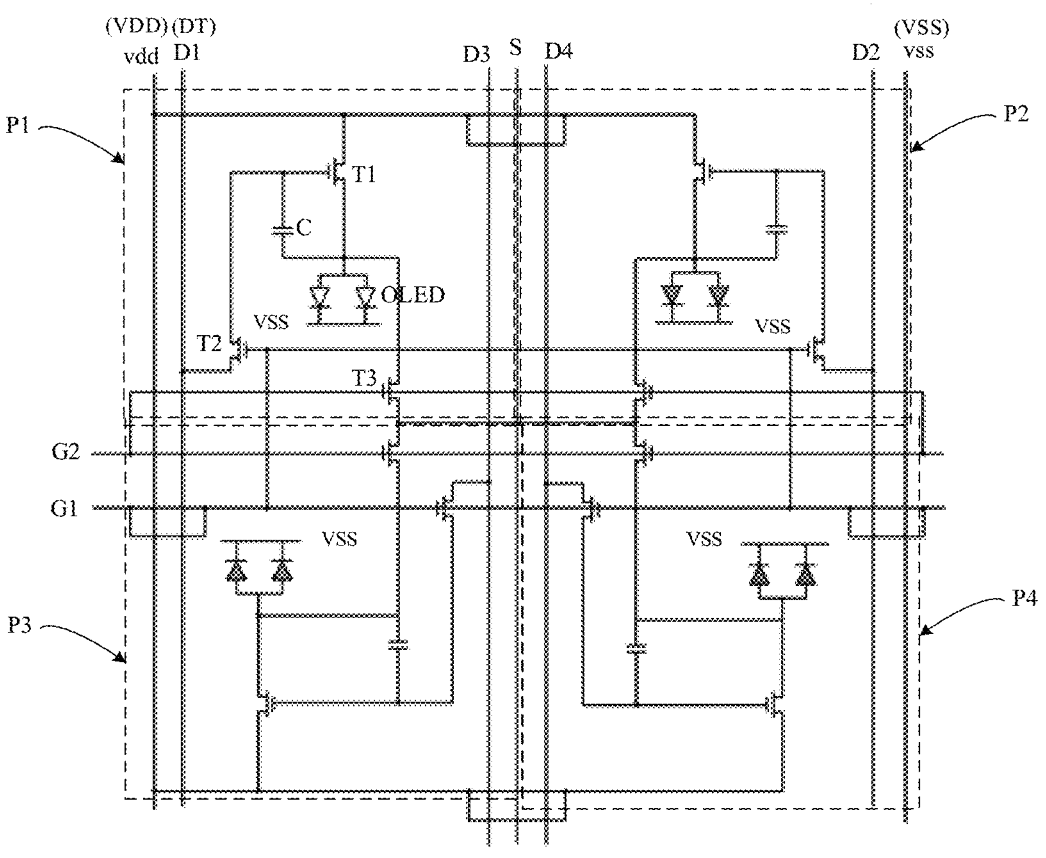
FIG. 2A is an equivalent circuit diagram of a pixel circuit of a display unit of a display substrate provided by an embodiment of the present disclosure.

FIG. 2A is a schematic diagram of an equivalent circuit of pixel circuits of four sub-pixels of one display unit P illustrated in FIG. 1A. Combining FIG. 1A and FIG. 2A, each selected from a group consisting of the first sub-pixel P1, the second sub-pixel P2, the third sub-pixel P3 and the fourth sub-pixel P4 includes a pixel circuit, and the pixel circuit includes a driving transistor T1 and a light-emitting device 20; the display region 11 is a light-emitting region which is used to display images; and the non-light-emitting region is a region that does not emit light and is not used to display images, and the environment of the non-display side can be seen through the non-light-emitting region at the display side of the display substrate. The driving transistor T1 is configured to control the magnitude of the driving current flowing through the light-emitting device 20 and includes a gate electrode, a first pole and a second pole. The light-emitting device 20 is configured to receive the driving current and be driven by the driving current to emit light. For example, the display substrate is an organic light emitting diode (OLED) display substrate, and the light-emitting device 20 is an OLED.

Figure 1B:
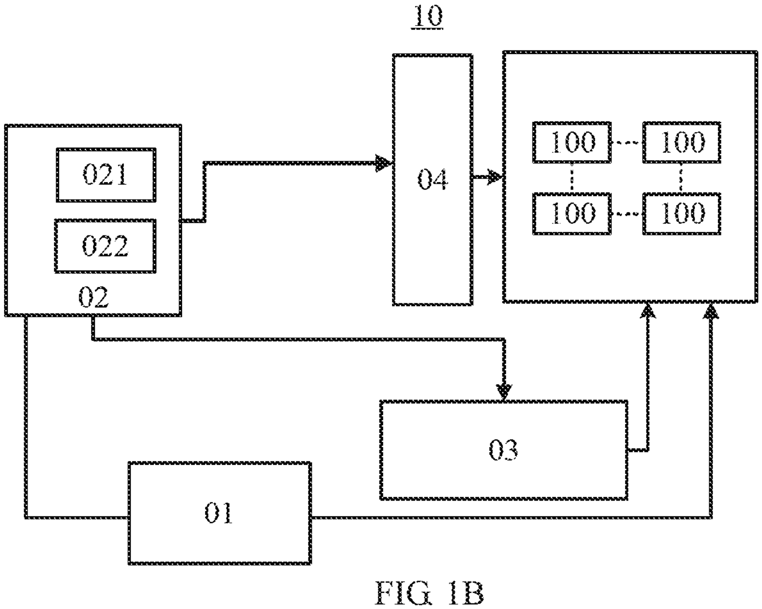
FIG. 1B is a block diagram of a display substrate provided by at least one embodiment of the present disclosure.

FIG. 1B is a block diagram of a display substrate provided by at least one embodiment of the present disclosure. As illustrated in FIG. 1B, for example, each selected from the group consisting of the first sub-pixel P1, the second sub-pixel P2, the third sub-pixel P3 and the fourth sub-pixel P4 includes a pixel circuit that drives the light-emitting device 20 to emit light. The display substrate may further include a plurality of scanning lines and a plurality of data lines for providing scanning signals (control signals) and data signals to the plurality of sub-pixels, thereby driving the plurality of sub-pixels. The display substrate may further include a power supply line, a detection line, etc. as required.

The pixel circuit includes a driving sub-circuit for driving the light-emitting device 20 to emit light and a detection sub-circuit for detecting the electrical characteristics of the sub-pixel to realize external compensation. The embodiments of the present disclosure do not limit the specific structure of the pixel circuit.

FIG. 1B illustrates a schematic diagram of a 3T1C pixel circuit used in the display substrate. According to needs, the pixel circuit may further include a compensation circuit, a reset circuit, etc., and the pixel circuit, for example, may also adopt a 4T1C, 5T1C, 5T2C, 6T1C, 7T1C or 8T1C circuit. The embodiments of the present disclosure are not limited in this aspect.

As illustrated in FIG. 2A and FIG. 1A, in an exemplary embodiment, each display unit P further includes one first scanning signal line G1, one second scanning signal line G2, one first power supply line vdd, one second power supply line vss, four data signal lines D (in FIG. 2A, the four data signal lines D are respectively the first data signal line D1 to the fourth data signal line D4, the first sub-pixel P1 is connected to the first data signal line D1, the second sub-pixel P2 is connected to the second data signal line D2, the third sub-pixel P3 is connected to the third data signal line D3, and the fourth sub-pixel P4 is connected to the fourth data signal line D4), one detection signal line S and four pixel circuits respectively corresponding to four sub-pixels P1\P2\P3\P4.

For example, the first scanning signal line G1 and the second scanning signal line G2 extend along the first direction D1 and are arranged along the second direction D2, the first direction D1 intersects with the second direction D2, for example, the first direction D1 is perpendicular to the second direction D2. The first power supply line vdd, the data signal lines D1\D2\D3\D4 and the detection signal line S extend along the second direction D2 and are arranged along the first direction D1.

For example, four data signal lines D and one detection signal line S are arranged between the first power supply line vdd and the second power supply line vss, two data signal lines D3\D4 among the four data signal lines D1\D2\D3\D4 are located between the detection signal line S and the first power supply line vdd, and the other two data signal lines D1\D2 among the four data signal lines D are located between the detection signal line S and the second power supply line vss. In this way, four data signal lines D1\D2\D3\D4 and one detection signal line S are arranged between the first power supply line vdd and the second power supply line vss to form four sub-pixels. Correspondingly, one first power supply line vdd, one second power supply line vss, and four data signal lines D1\D2\D3\D4 are arranged between two detection signal lines S to form four sub-pixels.

Figure 2B:
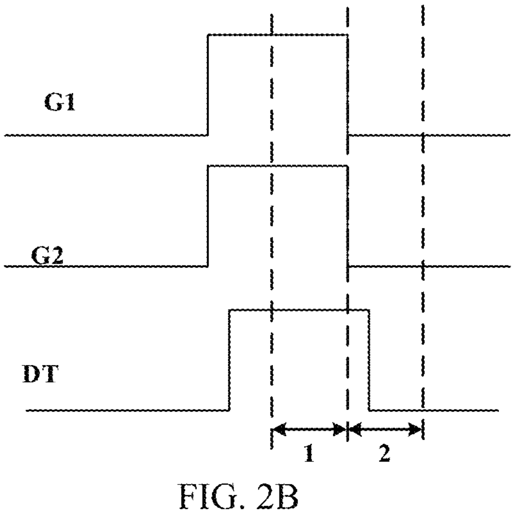
FIG. 2B-FIG. 2D are signal timing diagrams of a driving method of a pixel circuit provided by at least one embodiment of the present disclosure.
Figure 2C:
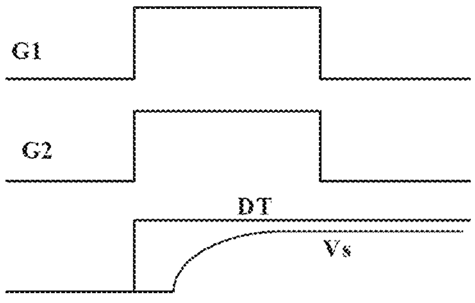
Figure 2D:
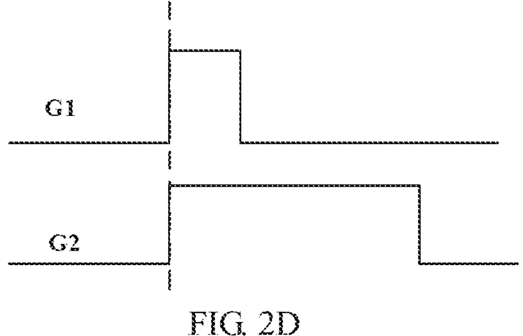

FIG. 2B-FIG. 2D are signal timing diagrams of a driving method of a pixel circuit provided by an embodiment of the present disclosure. Referring to FIG. 2A and FIG. 2B, for example, the pixel circuit of each selected from the group consisting of the first sub-pixel P1, the second sub-pixel P2, the third sub-pixel P3 and the fourth sub-pixel P4 includes a first transistor T1, a second transistor T2, a third transistor T3 and a storage capacitor Cst. The first scanning signal line G1 is connected to the gate electrode of the second transistor T2 in each sub-pixel, and the second scanning signal line G2 is connected to the gate electrode of the third transistor T3 in each sub-pixel. In each sub-pixel, the first electrode of the second transistor T2 is electrically connected to the first capacitor electrode of the storage capacitor Cst and the gate electrode of the first transistor T1, the data signal line is connected to the second electrode of the second transistor T2, the second electrode of the second transistor T2 is configured to receive the data signal GT, and the second transistor T2 is a data transistor, and is configured to write the data signal DT into the gate electrode of the first transistor T1 and the storage capacitor Cst in response to the first control signal G1; the first electrode of the first transistor T1 is electrically connected to the second capacitor electrode of the storage capacitor Cst, and is configured to be electrically connected to the first electrode of the light-emitting device 20, the first power supply line VDD is connected to the second electrode of the first transistor T1, the second electrode of the first transistor T1 is configured to receive the first power supply voltage V1 (for example, a high power supply voltage VDD), and the first transistor T1 is a driving transistor, and is configured to control a current for driving the light-emitting device under control of the voltage of the gate electrode of the first transistor T1; the first electrode of the third transistor T3 is electrically connected to the first electrode of the first transistor T1 and the second capacitor electrode of the storage capacitor Cst, the detection signal line S is connected to the second electrode of the third transistor T3, the second electrode of the third transistor T3 is configured to be connected to the first detection line S to be connected to an external detection circuit 11, the third transistor T3 is a detection transistor, and is configured to detect the electrical characteristics of the associated sub-pixel in response to the second control signal G2 to achieve external compensation; the electrical characteristics include, for example, the threshold voltage and/or carrier mobility of the first transistor T1, or the threshold voltage, or the driving current, etc. of the light-emitting device. The external detection circuit 11 is, for example, a conventional circuit including a digital-to-analog converter (DAC) and an analog-to-digital converter (ADC), which will not be described in detail in the embodiments of the present disclosure.

Each of the transistors used in the embodiments of the present disclosure may be a thin film transistor, a field effect transistor or other switching component having the same characteristics. In the embodiments of the present disclosure, the case that all the transistors are thin film transistors is taken as an example for introduction. The source electrode and drain electrode of the transistor used here may be structurally symmetrical, thus the source electrode and the drain electrode may be structurally indistinguishable. In the embodiments of the present disclosure, in order to distinguish the two electrodes of the transistor except the gate electrode, one electrode of the two electrodes of the transistor is directly described as the first electrode, and the other electrode the two electrodes of the transistor is described as the second electrode. In addition, the transistors can be divided into N-type and P-type transistors according to the characteristics of the transistors. In the case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In the case where the transistor is the N-type transistor, the turn-on voltage is a high level voltage (for example, 5V, 10V or other suitable voltage), and the turn-off voltage is a low level voltage (for example, 0V, −5V, −10V or other suitable voltage). It should be noted that, in the following description, the transistor in FIG. 1B is an N-type transistor as an example for illustration, but this is not a limitation to the present disclosure.

In the following, the working principle of the pixel circuit illustrated in FIG. 2A will be described with reference to the signal timing diagrams illustrated in FIG. 2B-FIG. 2D, FIG. 2B illustrates a signal timing diagram of the pixel circuit during a display process, and FIG. 2C and FIG. 2D illustrate signal timing diagrams of the pixel circuit during a detection process.

For example, as illustrated in FIG. 2B, the display process of each frame of image includes a data writing and resetting stage 1 and a light-emitting stage 2. FIG. 2B illustrates the timing waveforms of the various signals in each stage. A working process of the 3T1C pixel circuit includes: in the data writing and resetting stage 1, the first control signal G1 and the second control signal G2 are both turn-on signals, the second transistor T2 and the third transistor T3 are turned on, the data signal DT is transmitted to the gate electrode of the first transistor T1 through the second transistor T2, an analog-to-digital converter writes a reset signal to the first electrode of the light-emitting device (such as an anode of the OLED) through the first detection line 130 and the third transistor T3, and the first transistor T1 is turned on and generates a driving current to charge the first electrode of the light-emitting device to a working voltage; and in the light-emitting stage 2, the first control signal G1 and the second control signal G2 are both turn-off signals, due to the bootstrap effect of the storage capacitor Cst, the voltage across the storage capacitor Cst remains constant, and the first transistor T1 works in a saturated state with a constant current, and drives the light-emitting device to emit light.

For example, FIG. 2C illustrates a signal timing diagram when the pixel circuit detects the threshold voltage. A working process of the 3T1C pixel circuit includes: the first control signal G1 and the second control signal G2 are both turn-on signals, the second transistor T2 and the third transistor T3 are turned on, and the data signal DT is transmitted to the gate electrode of the first transistor T1 through the second transistor T2; the analog-to-digital converter writes a reset signal to the first electrode (node S) of the light-emitting device through the first detection line 130 and the third transistor T3, the first transistor T1 is turned on to charge the node S until the first transistor is turned off, and the digital-to-analog converter samples the voltage on the first detection line 130 to obtain the threshold voltage of the first transistor T1. This process may be performed, for example, when the display apparatus is switched off.

For example, FIG. 2D illustrates a signal timing diagram of the pixel circuit when detecting the threshold voltage. A working process of the 3T1C pixel circuit includes: in a first stage, the first control signal G1 and the second control signal G2 are both turn-on signals, the second transistor T2 and the third transistor T3 are turned on, and the data signal DT is transmits to the gate electrode of the first transistor T1 through the second transistor T2; and the analog-to-digital converter writes a reset signal to the first electrode (node S) of the light-emitting device through the first detection line 130 and the third transistor T3; in a second stage, the first control signal G1 is a turn-off signal, the second control signal G2 is a turn-on signal, the second transistor T2 is turned off, the third transistor T3 is turned on, and the first detection line 130 is floating; and due to the bootstrap effect of the storage capacitor Cst, the voltage across the storage capacitor Cst remains constant, the first transistor T1 works in a saturated state with a constant current and drives the light-emitting device to emit light, and then the digital-to-analog converter samples the voltage on the first detection line 130 and calculates the carrier mobility of the first transistor T1 in combination with the magnitude of the light-emitting current. For example, this process may be performed during blanking stages between display stages.

The electrical characteristics of the first transistor T1 can be obtained and a corresponding compensation algorithm can be implemented through the above detection.

For example, as illustrated in FIG. 1B, the display substrate 10 further includes a data driving circuit 03 and a scanning driving circuit 04. The data driving circuit 03 is configured to send out a data signal, such as the above-mentioned data signal DT, according to needs (such as an image signal input to the display apparatus); and the pixel circuit of each sub-pixel is further configured to receive the data signal and apply the data signal to the gate electrode of the first transistor. The scanning driving circuit 04 is configured to output various scanning signals, such as including the above-mentioned first control signal G1 and second control signal G2, and the scanning driving circuit 04 is, for example, an integrated circuit chip (IC) or a gate driving circuit (GOA) manufactured directly on the display substrate.

For example, the display substrate 10 further includes a control circuit 02. For example, the control circuit 02 is configured to control the data driving circuit 03 to apply data signals, and control the gate driving circuit to apply scanning signals. An example of the control circuit 02 is a timing control circuit (T-con). The control circuit 02 may be in various forms, for example, including a processor 021 and a memory 022, the memory 022 includes executable codes, and the processor 021 runs the executable codes to execute the above-mentioned detection method.

For example, the processor 021 is a central processing unit (CPU) or other forms of processing devices with data processing capabilities and/or instruction execution capabilities, such as a microprocessor, a programmable logic controller (PLC), and the like.

For example, the memory 022 includes one or more computer program products. The computer program products may include various kinds of computer readable storage media, e.g., volatile memory and/or nonvolatile memory. Volatile memory, for example, includes a random-access memory (RAM) and/or a cache memory, etc. Nonvolatile memory, for example, includes read-only memory (ROM), hard disk, flash memory, etc. One or more computer program instructions can be stored in the computer readable storage medium, and the processor 021 can execute the program instructions to realize the desired functions. Various applications and various data, e.g., the electrical characteristic parameters obtained in the above-mentioned detection method, can also be stored in the computer readable storage media.

Figure 3A:
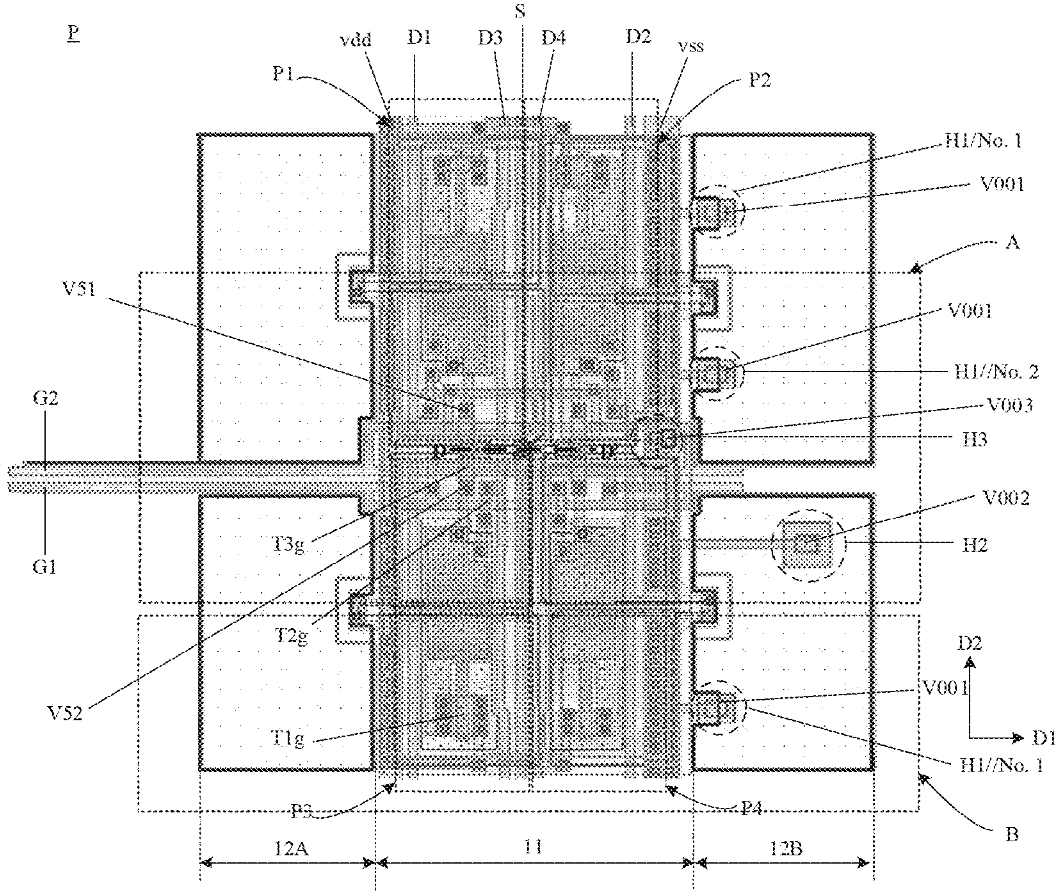
FIG. 3A is a schematic planar view of a display unit of a display substrate provided by at least one embodiment of the present disclosure.
Figure 3B:
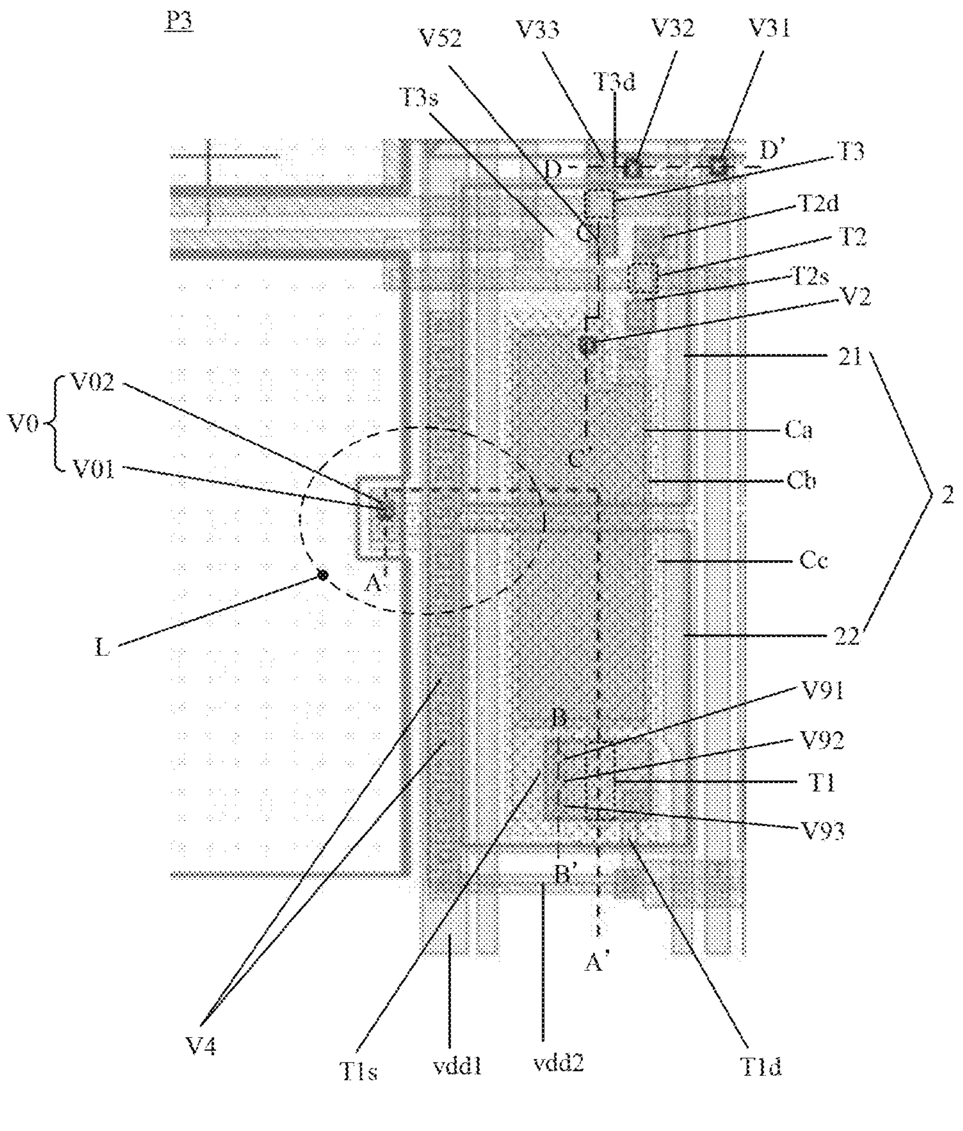
FIG. 3B is a schematic diagram of a third sub-pixel in FIG. 3A.
Figure 3C:
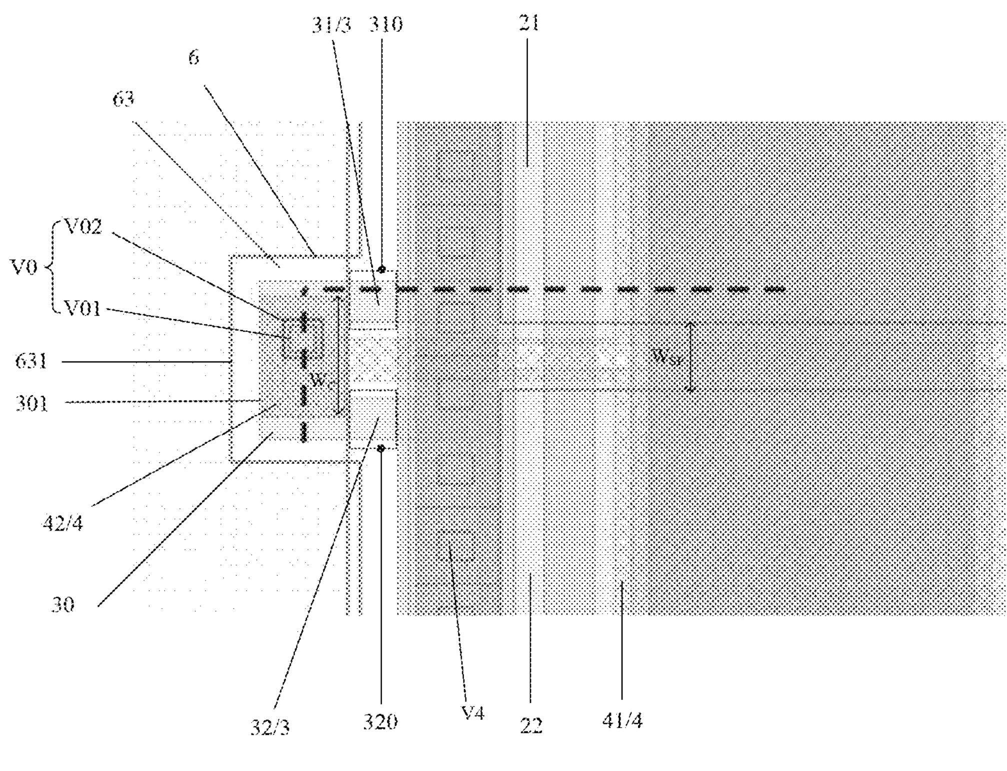
FIG. 3C is a partial enlarged view of FIG. 3B including a connection structure.
Figure 4A:
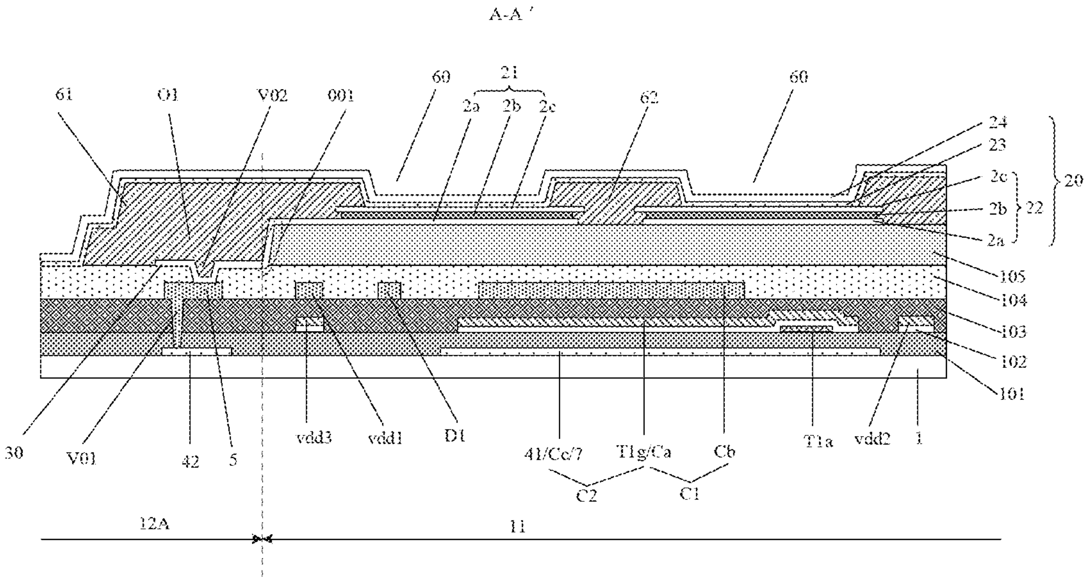
FIG. 4A is a schematic cross-sectional view taken along the line A-A' in FIG. 3B.

FIG. 3A is a schematic planar view of a display unit P of a display substrate 10 provided by at least one embodiment of the present disclosure; FIG. 3B is a schematic diagram of a third sub-pixel P3 in FIG. 3A; FIG. 3C is an enlarged view of part L including a connection structure in FIG. 3B; and FIG. 4A is a schematic cross-sectional view taken along line A-A' in FIG. 3B. Referring to FIG. 3A-FIG. 3C and FIG. 4A, the light-emitting device 20 includes a first electrode 2, and the first electrode 2 includes a first portion 21 and a second portion 22 that are spaced apart from each other. The display unit P further includes a connection structure 3 and a first transfer electrode 4. The connection structure 3 is connected to both the first portion 21 of the first electrode 2 and the second portion 22 of the first electrode 2, and includes a connection portion 30 located in the non-light-emitting region 12; and the first transfer electrode 4 is connected to the first pole T1*s* of the driving transistor T1 and includes a portion located in the non-light-emitting region 12, and the connection portion 30 is electrically connected, in the non-light-emitting region 12, to the portion of the first transfer electrode 4 that is located in the non-light-emitting region 12. In the display substrate 10 provided by the embodiment of the present disclosure, a plurality of portions of the first electrode 2, such as the first portion 21 and the second portion 22, are all connected to the first pole T1*s* of the driving transistor T1 through the connection portion 30 and the first transfer electrode 4, for example, an opening region of a sub-pixel (taking the third sub-pixel P3 as an example) includes a first sub-opening 601 and a second sub-opening 602 (as illustrated in FIG. 5K), and the first sub-opening 601 and the second sub-opening 602 are the regions respectively corresponding to the first portion 21 of the first electrode 2 and the second portion 22 of the first electrode 2, for example, the first portion 21 of the first electrode 2 covers the first sub-opening 601, and the second portion 22 of the first electrode 2 covers the second sub-opening 602. Moreover, the first portion 21 of the first electrode 2 and the second portion 22 of the first electrode 2 are electrically connected, in the non-light-emitting region 12, to the connection portion 30 which is located in the non-light-emitting region 12, and then the connection portion 30 is connected to the first pole T1*s* of the driving transistor T1 through the portion of the first transfer electrode 4 which is located in the display region 11; when poor display, such as a dark spot, occurs in one of the two sub-openings of the opening region of the sub-pixel, the first portion or the second portion of the first electrode 2 corresponding to the position where the poor display occurs can be cut off, thereby ensuring that the region where the dark spot occurs does not perform the display function, reducing dark spot problems of the sub-pixel, achieving repair of the sub-pixel, improving image quality, and ensuring excellent display effect of the display substrate product. Moreover, because the first portion 21 of the first electrode 2 and the second portion 22 of the first electrode 2 are electrically connected, in the non-light-emitting region 12, to the connection portion 30 which is located in the non-light-emitting region 12, and then the connection portion 30 is connected to the first pole T1*s* of the driving transistor T1 through the portion of the first transfer electrode 4 which is located in the display region 11, it is convenient to manufacture a via hole in the non-light-emitting region 12 for connecting the connection portion 30 to the first transfer electrode 4. Compared with the solution of connecting both the first portion 21 and the second portion 22 of the first electrode 2 to the first transfer electrode 4 in the display region 11, because no pixel circuit is provided in the non-light-emitting region 12, in the embodiment of the present disclosure, the alignment process of manufacturing the via hole for connecting the connection portion 30 to the first transfer electrode 4 at the position corresponding to the connection portion 30 in the non-light-emitting region 12 is relatively easy, and the yield of the display substrate can be significantly improved.

It should be noted that, in at least one embodiment of the present disclosure, a longitudinal portion vdd1 of the first power supply line vdd and the second power supply line vss are arranged at intervals in the first direction D1, and are respectively located at a first edge of the display region 11 in the first direction D1 and a second edge, opposite to the first edge, of the display region 11 in the first direction D1. A region between an edge, of the longitudinal portion vdd1 of the first power supply line vdd, away from the second power supply line vss and an edge, of the second power supply line vss, away from the longitudinal portion vdd1 of the first power supply line vdd is the display region 11.

For example, as illustrated in FIG. 4A, the light-emitting device is an organic light emitting diode, which includes a first electrode 2, a second electrode 24 and a light-emitting layer 23 between the first electrode 2 and the second electrode 24. For example, the first electrode is made of a material with a high work function to serve as an anode, such as an ITO/Ag/ITO stacked structure, or an ITO/Al/ITO stacked structure (sandwich structure), or an ITO/(Al+Ag)/ITO stacked structure (sandwich structure). Certainly, the first electrode is not limited to the above-mentioned sandwich structure, and the material of the first electrode is not limited to the types listed above. The second electrode 24 is made of a material with a low work function to serve as a cathode, such as a semi-transmissive metal or a metal alloy material, such as an Ag/Mg alloy material. For example, the light-emitting device is a top emission structure, the first electrode 2 is a reflective electrode and the second electrode 122 is a transmissive or semi-transmissive electrode.

For example, referring to FIG. 3B-FIG. 3C and FIG. 4A, the first transfer electrode 4 includes a first transfer portion 41, and the first transfer portion 41 is located in the display region 11, and is connected to the first pole of the driving transistor T1. The portion of the connection electrode 4 which is located in the non-light-emitting region 12 includes a second transfer portion 42, the second transfer portion 42 is connected to the first transfer portion 41, the connection portion 30 and the second transfer portion 42 are respectively provided in different layers, and the connection portion 30 is connected to the second transfer portion 42 in the non-light-emitting region 12 through the first via hole V0.

For example, as illustrated in FIG. 4A, the display unit P further includes a second transfer electrode 5, and the second transfer electrode 5 is located in the non-light-emitting region 12, and located between the connection portion 30 and the second transfer portion 42 in a direction perpendicular to the base substrate 1, and the orthographic projection of the second transfer electrode 5 on the base substrate 1 at least partially overlaps with both the orthographic projection of the connection portion 30 on the base substrate 1 and the orthographic projection of the second transfer portion 5 on the base substrate 1. The connection portion 30 is connected to the second transfer portion 42 through the second transfer electrode 5 to realize segmental connection, thereby reducing the hole depth of the connection portion 30 directly connected to the second transfer portion 42 through one via hole, and improving the production yield of the display substrate.

For example, as illustrated in FIG. 4A, the display substrate 10 further includes a first insulation layer 101, a second insulation layer 102 located on a side of the first insulation layer 101 away from the base substrate 1, a third insulation layer 103 located on a side of the second insulation layer 102 away from the base substrate 1, a fourth insulation layer 104 located on a side of the second transfer electrode 5 away from the third insulation layer 103 in the direction perpendicular to the base substrate 1, and an interlayer insulation layer 105 located on a side of the fourth insulation layer 104 away from the third insulation layer 103 in the direction perpendicular to the base substrate 1. The first via hole V0 includes a first sub-via hole V01 penetrating through the first insulation layer 101 and the third insulation layer 103, and the second transfer electrode 5 is connected to the second transfer portion 42 through the first sub-via hole V01. The first via hole V0 further includes a second sub-via hole V02 penetrating through the fourth insulation layer 104, and the connection portion 30 is connected to the second transfer electrode 5 through the second sub-via hole V02, thereby achieving the connection between the connection portion 30 and the second transfer portion 42 through the multi-level via hole.

For example, the first transfer portion 41 and the second transfer portion 42 constitute a continuous and integrated structure and are formed integrally. For example, the material of the first transfer electrode 4 is a metal material, such as copper, aluminum, chromium, copper alloy, aluminum alloy, chromium alloy, manganese alloy, etc., but is not limited to the types listed above.

For example, the display unit P further includes an interlayer insulation layer 105, the interlayer insulation layer 105 is located in the display region 11 and not located in the non-light-emitting region 12, and in the direction perpendicular to the base substrate 1, the interlayer insulation layer 105 is located between the first electrode 2 and the second transfer electrode 5. As illustrated in FIG. 4A and FIG. 5H, the first electrode 2 is electrically connected to the first pole T1*s* of the driving transistor T1 through an opening O1 penetrating the interlayer insulation layer 5 along the direction perpendicular to the base substrate 1. For example, the opening O1 communicates with the second sub-via hole V02, and the first electrode 2 enters the second sub-via hole V02 through the opening O1 penetrating through the interlayer insulation layer 5 to be connected to the second transfer electrode 5. For example, the orthographic projection of the first via hole on the base substrate 1 is located within the orthographic projection of the opening O1 on the base substrate 1, that is, orthographic projections of the second sub-via hole V02 and the first sub-via hole V01 on the base substrate 1 are located within the orthographic projection of the opening O1 on the base substrate 1. In this way, the first electrode 2 can be electrically connected to the first pole T1*s* of the driving transistor T1 by means of the larger opening O1 in the interlayer insulation layer 105 in the non-light-emitting region, which facilitates the connection of the connection portion 30 and the second transfer electrode 5 in the non-light-emitting region. Manufacturing the larger opening O1 in the non-light-emitting region has lower requirements on the manufacturing process and is easy to implement, and manufacturing the opening O1 has high accuracy and little impact on other surrounding structures, avoiding the problem of low manufacturing yield of via holes and large impact on surrounding structures caused by the case that hole punching in the insulation layer in the display region 11 is limited by space.

For example, as illustrated in FIG. 4A, the interlayer insulation layer 105 is located in the display region 11 and not located in the non-light-emitting region 12A, that is, the interlayer insulation layer 105 does not include a portion located in the non-light-emitting region 12A. For example, in the process of manufacturing the interlayer insulation layer 105, a portion, located in the non-light-emitting region 12A, of a material layer used to form the interlayer insulation layer 105 is completely removed by a patterning process, so that the opening O1 is formed in a region of the non-light-emitting region and in the same layer as the interlayer insulation layer 105, that is, the orthographic projection of the opening O1 on the base substrate 1 is located within the non-light-emitting region 12A, and the area of the orthographic projection of the opening O1 on the base substrate 1 is equal to the area of the non-light-emitting region 12A. In this way, by not providing the interlayer insulation layer 105 in the non-light-emitting region, compared with the solution of manufacturing a via hole in the non-light-emitting region 12A for the first electrode 2 to pass through, the manufacturing difficulty of the interlayer insulation layer 105 is further reduced, and the manufacturing yield of the display substrate is improved.

For example, the area of the orthographic projection of the opening O1 on the base substrate 1 is larger than the area of the orthographic projection of a sub-pixel adjacent to the opening O1 on the base substrate 1. For example, referring to FIG. 4A and FIG. 1A, in the arrangement direction of the display region 11 and the non-light-emitting region 12A, the maximum width W1 of the opening O1 is greater than the maximum width W2 of one sub-pixel, and here a sub-pixel P3 adjacent to the opening O1 is taken as an example.

Figure 4B:
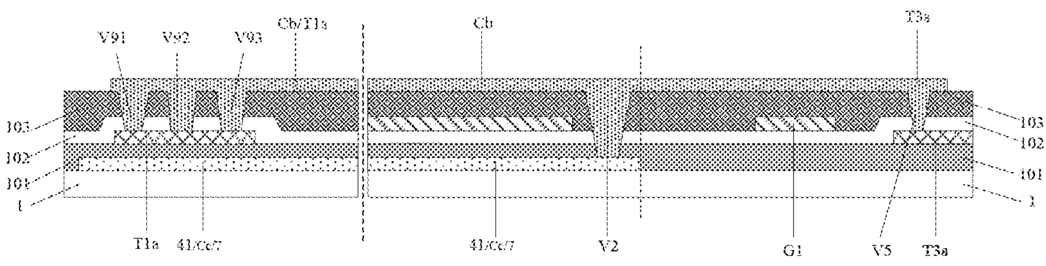
FIG. 4B is a schematic cross-sectional view taken along the line B-B' and line C-C' in FIG. 3B.
Figure 4C:
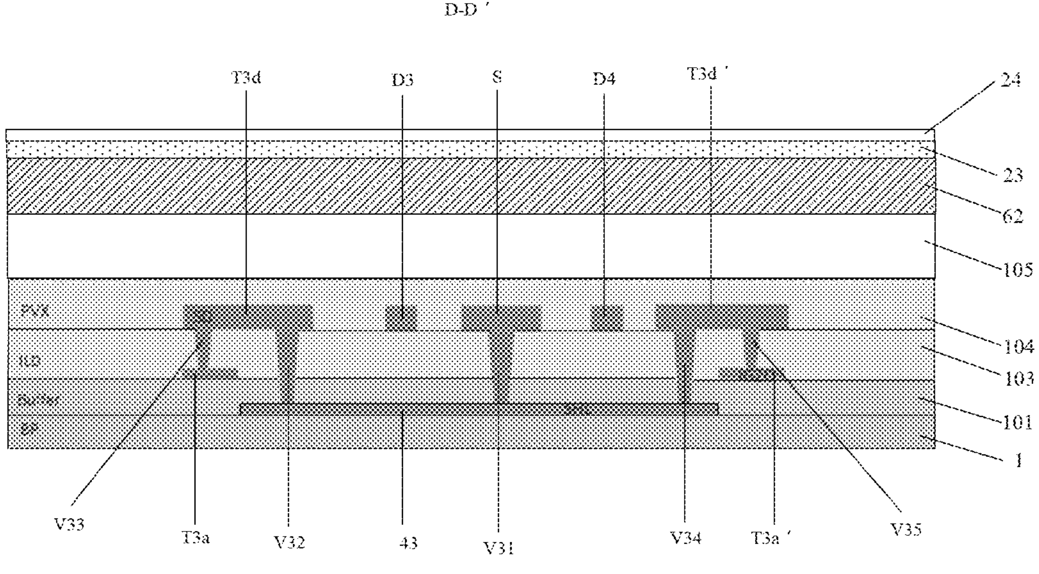
FIG. 4C is a schematic cross-sectional view taken along the line D-D' in FIG. 3A.
Figure 4D:
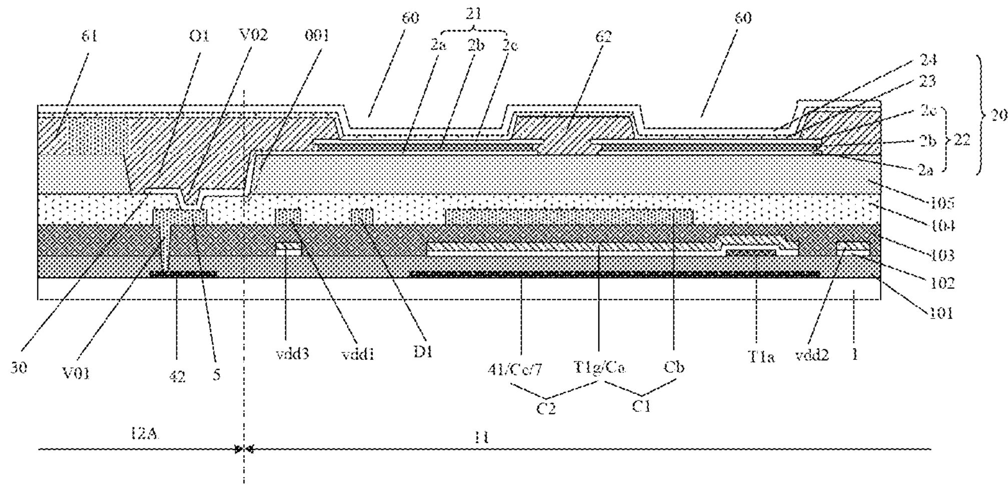
FIG. 4D is a schematic diagram obtained by making a cross-section of the display substrate provided by another embodiment of the present disclosure at a position of line A-A' in FIG. 3B.

In other embodiments, for example, as illustrated in FIG. 4D, the orthographic projection of the opening O1 on the substrate 1 is located within the non-light-emitting region 12A, and the area of the orthographic projection of the opening O1 on the substrate 1 is smaller than the area of the non-light-emitting region 12A. That is, during the process of manufacturing the interlayer insulation layer 105, a part of the portion, located in the non-light-emitting region 12A, of the material layer used to form the interlayer insulation layer 105 is removed by a patterning process, thereby forming the opening O1, the opening O1 is a larger via hole passing through the interlayer insulation layer 105, and the edge of the opening O1 is at least partially surrounded by the material of the interlayer insulation layer 105. Other features and corresponding technical effects of the embodiment illustrated in FIG. 4D are the same as those in FIG. 4A, please refer to the description of FIG. 4A.

For example, as illustrated in FIG. 4A, the interlayer insulation layer 105 has a fault which forms an altitude difference between the interlayer insulation layer 105 and the adjacent structure, at the junction of the display region 11 and the non-light-emitting region 12A, that is, there is a stepped structure 001 at the edge of the interlayer insulation layer 105 close to the non-light-emitting region 12, the first electrode 2 covers the stepped structure 001 and thus crosses over the stepped structure 001 and extend to the non-light emitting region 12, and all the interlayer insulation layer 105 is not provided on a side of the stepped structure 001 close to the non-light-emitting region 12, so that the connection portion 30 can be located in the space at a side, of the position of the altitude difference of the stepped structure 001, close to the non-light-emitting region 12A. Compared with the solution in which the interlayer insulation layer 105 is located in both the display region 11 and the non-light-emitting region 12A, the present embodiment can avoid manufacturing the via hole which penetrates through the interlayer insulation layer 105 and is used for connecting the connection portion 30 and the second transfer electrode 5 in the interlayer insulation layer 105, which simplifies the manufacturing process of the display substrate and is of great significance to improving the yield of the display substrate. Because the thickness of the interlayer insulation layer 105 in the direction perpendicular to the base substrate 1 is relatively large, for example, the thickness of the interlayer insulation layer 105 in the direction perpendicular to the base substrate 1 is greater than 6000 angstroms to satisfy its function of insulating and serving as a planarization layer, if the via hole which penetrates through the interlayer insulation layer 105 and is used for connecting the connection portion 30 and the second transfer electrode 5 is manufactured, and the size of this via hole is different from the size of a via hole for other purposes in the interlayer insulation layer 105 in a direction parallel to the base substrate, for example, it is required that the size of this via hole in the direction parallel to the substrate is relatively large, so that it is more difficult to satisfy these different sizes of the various via holes simultaneously when manufacturing the various via holes penetrating through the interlayer insulation layer 105 through one same patterning process, and it is more difficult to ensure the alignment rate of the mask, and the thickness of the interlayer insulation layer 105 is larger, so it is more difficult to meet the accuracy of these different sizes during an etching process. However, the above-mentioned solution of the embodiments of the present disclosure can avoid manufacturing the via hole which penetrates through the interlayer insulation layer 105 and is used for connecting the connection portion 30 and the second transfer electrode 5 in the interlayer insulation layer 105, thereby avoiding the above-mentioned problems.

For example, the material of the interlayer insulation layer 105 is an organic insulating material. For example, the organic insulating material includes resin material, acrylic material, etc., such as polyimide (PI), acrylate, epoxy resin, polymethylmethacrylate (PMMA), etc., but not limited to the types listed above. For example, the interlayer insulation layer 105 is a planarization layer.

For example, the first insulation layer 101, the second insulation layer 102, the third insulation layer 103, and the fourth insulation layer 104 are inorganic insulation layers, for example, are made of oxides of silicon such as silicon oxide, silicon nitride, or silicon oxynitride, or nitrides of silicon, or oxynitrides of silicon, or insulating materials including metal oxynitride such as aluminum oxide, titanium nitride, etc.

For example, as illustrated in FIG. 3A, the display substrate 10 further includes a first signal line G1/G2 and second signal lines D1-D4 that are provided on the base substrate 1. The first signal line G1/G2 transmits a scanning signal; for example, the first signal line includes a first sub-scanning signal line G1 and a second sub-scanning signal line G2; the first sub-scanning signal line G1 transmits a first scanning signal, and the second sub-scanning signal line G2 transmits a second scanning signal; for example, the first scanning signal and the second scanning signal may be progressive scanning signals, for example, the first scanning signal and the second scanning signal are the same scanning signal, and this case can be referred to the above-mentioned FIG. 2B; or, in other embodiments, the first scanning signal and the second scanning signal are different signals. For example, the second signal lines D1-D4 respectively transmit the data signal DT; the first signal line extends along the first direction D1 as a whole, and the second signal lines D1-D4 extend along the second direction D2 intersecting with the first direction D1; and the sub-pixel further includes a data writing transistor T2, and the data writing transistor T2 is configured to transmit the data signal to the driving transistor T1 under the control of the first scanning signal.

It should be noted that "extending along the first direction D1 as a whole" includes extending substantially along the first direction D1, as long as at least extending along the first direction D1 as a whole. For example, in some examples, the first signal line which extends along the first direction D1 as a whole may include a certain bent portion, or, in some examples, an edge of a strip extending along the first direction D1 may not be a smooth line as a whole, for example, the edge of the line may include burrs or sawtooth, in short, as long as the overall extending trend is along the first direction D1. Likewise, the same is true for the description "extending along the second direction D2 as a whole", and the same is true for the meaning of the extension in a certain direction as a whole mentioned in the present disclosure.

For example, referring to FIG. 3B-FIG. 3C, the connection structure 3 includes at least two extension portions, and the at least two extension portions includes a first extension portion 31 and a second extension portion 32. The first extension portion 31 comprises a first end and a second end opposite to the first end of the first extension portion 31, and extends from the display region 11 to the non-light-emitting region 12, the first end of the first extension portion 31 is connected to the first portion 21 of the first electrode 2, and the second end of the first extension portion 31 is located in the non-light-emitting region 12; the second extension portion 32 comprises a first end and a second end opposite to the first end of the second extension portion 32, and extends from the display region 11 to the non-light-emitting region 12, the first end of the second extension portion 32 is connected to the second portion 22 of the first electrode 2, and the second end of the second extension portion 32 is located in the non-light-emitting region 12; and the connection portion 30 is connected to the second end of the first extension portion 31 and the second end of the second extension portion 32. In this way, the connection portion 30 is respectively connected to the first portion 21 of the first electrode 2 and the second portion 22 of the first electrode 2 through at least two channels, that is, the first extension portion 31 and the second extension portion 32. When poor display such as a dark spot occurs in one selected from a group consisting of a region, corresponding to the first portion 21 of the first electrode 2, of the opening region of the third sub-pixel P3 and a region, corresponding to the second portion 22 of the first electrode 2, of the opening region of the third sub-pixel P3, one of the first extension portion 31 and the second extension portion 32 corresponding to the region where poor display such as a dark spot occurs can be cut off, thereby ensuring that the region where poor display such as a dark spot occurs does not perform the display function. The first extension portion 31 and the second extension portion 32 are in a shape of a strip extending along the first direction D1, which is convenient for being cut off, thereby facilitating the repairing of sub-pixels and improving the display quality.

For example, the second end of the first extension portion 31 has a first cuttable portion 310, and the second end of the second extension portion 32 has a second cuttable portion 320. There is no conductive layer overlapped with the first cuttable portion 310 in the direction perpendicular to the base substrate 1 on a side of the first cuttable portion 310 close to the base substrate 1 and at a position right opposite to the first cuttable portion 310, and there is no conductive layer overlapped with the second cuttable portion 320 in the direction perpendicular to the base substrate 1 on a side of the second cuttable portion 320 close to the base substrate 1 and at a position directly opposite to the second cuttable portion 320. In this way, when poor display such as a dark spot occurs in a sub-pixel, other conductive layers will not be damaged during the cutting process of cutting the first cuttable portion 310 or the second cuttable portion 320 off, thereby facilitating the cutting process, achieving the repairing of the sub-pixel, and improving the display quality.

For example, as illustrated in FIG. 3C, the maximum width $W_{SP}$ of a space between the first portion 21 of the first electrode 2 and the second portion 22 of the first electrode 2 in the second direction D2 is smaller than the maximum width $W_C$ of the connection portion 30 in the second direction D2 to ensure that the connection portion 30 has a sufficient width in the second direction D2 to connect the first portion 21 of the first electrode 2 and the second portion 22 of the first electrode 2, and to ensure that the distance between the first portion of the first electrode 2 and the second portion 22 of the first electrode 2 should not be too large to occupy too much space, so as to achieve a high PPI display panel at the same time.

For example, the first portion 21 of the first electrode 2, the second portion 22 of the first electrode 2, the first extension portion 31, the second extension portion 32 and the connection portion 30 constitute a continuous and integrated structure and are formed integrally, so as to simplify the structure of the display substrate, and the above-mentioned continuous and integrated structure can be formed by performing one same patterning process on one same material layer, which simplifies the manufacturing process of the display substrate.

For example, as illustrated in FIG. 3A-FIG. 3B, each sub-pixel further includes a first power supply line vdd, the first power supply line vdd is connected to a first voltage terminal VDD and is configured to provide a first power supply voltage to the sub-pixel, the first power supply line vdd is provided in the same layer as the first pole of the driving transistor T1, and includes a longitudinal portion vdd1, and the longitudinal portion vdd1 extends along the second direction D2 as a whole, and is electrically connected to a sub-pixel adjacent to the longitudinal portion vdd1. For example, the first power supply line vdd further includes a lateral portion vdd2, and the lateral portion vdd2 is electrically connected to the longitudinal portion vdd1 and extends along the first direction D1 as a whole to be connected to each sub-pixel of the display unit, thereby providing the first power supply voltage to each sub-pixel of the display unit. For example, the lateral portion vdd2 in FIG. 3B is electrically connected to the third sub-pixel P3 and the fourth sub-pixel P4, and FIG. 3A further shows another lateral portion vdd2 connected to the longitudinal portion vdd1 and electrically connected to the first sub-pixel P1 and the second sub-pixel P2, so that the first power supply voltage from the longitudinal portion vdd1 is provided to each sub-pixel of the display unit. For example, the first extension portion 31 and the second extension portion 32 extend to the non-light-emitting region 12 by crossing over the first power supply line vdd and the second signal line, so as to be connected to the connection portion located in the non-light-emitting region 12.

For example, referring to FIG. 3A, the non-light-emitting region 12 and the display region 11 are arranged in the second direction D2, the first portion 21 of the first electrode 2 and the second portion 22 of the first electrode 2 are arranged in the second direction D2, and the extension portion 31 and the second extension portion 32 both extend along the first direction D1 as a whole. Such arrangement mode can coordinate the positions of the first portion 21 of the first electrode 2 and the second portion 22 of the first electrode 2 and the position of the non-light-emitting region corresponding to the sub-pixel where the first electrode 2 is located, so that it is convenient to lead out the first extension portion 31 and the second extension portion 32 from the first portion 21 of the first electrode 2 and the second portion 22 of the first electrode 2 to the non-light-emitting region 12 respectively, and it is convenient to achieve that the connection portion 30 in the non-light-emitting region 12 is connected to both the first portion 21 of the first electrode 2 and the second portion 22 of the first electrode 2.

For example, as shown in FIG. 3A, the non-light-emitting region 12 includes a first non-light-emitting region 12A and a second non-light-emitting region 12B, the first non-light-emitting region 12A is located on a first side of the display region 11 in the first direction D1, and the second non-light-emitting region 12B is located on a second side, opposite to the first side, of the display region 11 in the first direction D1; the first sub-pixel P1 and the third sub-pixel P3 are adjacent to the first non-light-emitting region 12A, and the second sub-pixel P2 and the fourth sub-pixel P4 are adjacent to the first non-light-emitting region 12A; each of the plurality of sub-pixels is provided with the connection structure 3, and the connection structure 3 is connected to both the first portion 21 of the first electrode 2 and the second portion 22 of the first electrode 2 of a sub-pixel adjacent to the connection structure 3; the connection portion 30 corresponding to the connection structure 3 of the first sub-pixel P1 and the connection portion 30 corresponding to the connection structure 3 of the third sub-pixel P3 are located in the first non-light-emitting region 12A; and the connection portion 30 corresponding to the connection structure 3 of the second sub-pixel P2 and the connection portion 30 corresponding to the connection structure 3 of the fourth sub-pixel P4 are located in the second non-light-emitting region 12B, so that the first electrode of each sub-pixel of the display unit P includes a first portion and a second portion, and the first portion of the first electrode and the second portion of the first electrode of each sub-pixel can be connected to the first pole T1*s* of the driving transistor T1 located in the display region 11 through the connection portion and the first transfer electrode (or, the first transfer electrode and the second transfer electrode) that are in the non-light-emitting region corresponding to the each sub-pixel.

For example, as illustrated in FIG. 3A, the first signal line G1/G2 that provides scanning signals to the first sub-pixel P1, the second sub-pixel P2, the third sub-pixel P3, and the fourth sub-pixel P4 is located at a boundary region between the first pixel row and the second pixel row, so as to provide scanning signals to the first pixel row and the second pixel row on both sides of the boundary region.

For example, the planar patterns of the first sub-pixel P1 and the second sub-pixel P2 are symmetrical with respect to a symmetry axis extending along the second direction D2, the planar patterns of the third sub-pixel P3 and the fourth sub-pixel P4 are symmetrical with respect to the symmetry axis, and the planar patterns of the first non-light-emitting region 12A and the second non-light-emitting region 12B are symmetrical with respect to the symmetry axis, so as to reasonably utilize the space and improve the uniformity of the display substrate, thereby improving the uniformity of display in the display region and reducing the manufacturing difficulty of the display substrate.

For example, referring to FIG. 4A, the display unit P further includes a pixel definition layer 6, and the pixel definition layer 6 includes a first portion 61 and a second portion 62. The first portion 61 is located between first electrodes 2 of adjacent sub-pixels to define an opening region 60 of the sub-pixel, and the light-emitting layer 23 of the light-emitting device 20 is at least located in the opening region 60. The second portion 62 is located between the first portion 21 of the first electrode 2 and the second portion 22 of the first electrode 2 to space the first portion 21 of the first electrode 2 apart from the second portion 22 of the first electrode 2.

For example, as illustrated in FIG. 4A, the orthographic projection of the connection portion 30 on the base substrate 1 is located within the orthographic projection of the first portion 61 of the pixel definition layer 6 on the base substrate 1, so as to avoid that the connection portion 30 and the first portion 61 of the pixel definition layer 6 occupy independent space, save space, and utilize the first portion 61 of the pixel definition layer 6 to protect the connection portion 30.

For example, the light-emitting device of the display substrate 10 provided in some embodiments of the present disclosure may adopt a top emission structure.

For example, as illustrated in FIG. 4A, taking the third sub-pixel P3 as an example, each sub-pixel further includes a first capacitor C1; the first capacitor C1 includes a first electrode plate Ca and a second electrode plate Cb; the first electrode plate Ca is electrically connected to the gate electrode T1*g* of the driving transistor T1 and is provided in the same layer as the gate electrode of the driving transistor T1, for example, the first electrode plate Ca and the gate electrode T1*g* of the driving transistor T1 constituted a continuous and integrated structure and are formed integrally; and the orthographic projection of the second electrode plate Cb on the substrate 1 at least partially overlaps with the orthographic projection of the first electrode plate Ca on the base substrate 1.

For example, as illustrated in FIG. 4A, taking the third sub-pixel P3 as an example, the sub-pixel further includes a second capacitor C2, and the second capacitor C2 includes the first electrode plate Ca and a third plate Cc; the third plate Cc includes an overlapping portion and a non-overlapping portion, the orthographic projection of the overlapping portion on the base substrate 1 overlaps with the orthographic projection of the first electrode plate Ca on the base substrate 1, and the orthographic projection of the non-overlapping portion on the base substrate 1 does not overlap with the orthographic projection of the first electrode plate Ca on the base substrate 1 and at least partially overlaps with the orthographic projection of the second electrode plate Cb on the base substrate 1. FIG. 4B is a schematic cross-sectional view taken along the line B-B' and the line C-C' in FIG. 3B, as illustrated in FIG. 4B, the non-overlapping portion is connected to the second electrode plate Cb through the second via hole V2, and the third electrode plate Cc is also serves as the first transfer portion 41, that is, the first transfer portion 41 is electrically connected to the second electrode plate Cb through the second via hole V2, so as to simplify the structure and manufacturing process of the display substrate 10.

For example, as illustrated in FIG. 4B, the second electrode plate Cb is provided in the same layer as the first pole T1*s* of the driving transistor T1, for example, the second electrode plate Cb and the first pole T1*s* of the driving transistor T1 constituted a continuous and integrated structure and are formed integrally to achieve the electrical connection between the second electrode plate Cb and the first pole T1*s* of the driving transistor T1, thereby achieving the electrical connection between the first transfer portion 41 and the first pole T1*s* of the driving transistor T1. Using the third electrode plate Cc as the first transfer portion 41, and forming the second electrode plate Cb and the first pole T1*s* of the driving transistor T1 into a continuous and integrated structure greatly simplifies the structure and manufacturing process of the display substrate 10.

For example, as illustrated in FIG. 4B, the first pole T1*s* of the driving transistor T1 is connected to an active layer T1*a* of the driving transistor T1 through a plurality of via holes to reduce the contact resistance therebetween; for example, the plurality of via holes are arranged at intervals along the second direction D2; for example, the first pole T1*s* of the driving transistor T1 is connected to the active layer T1*a* of the driving transistor T1 through three via holes V91, V92 and V93, and the via holes V91, V92 and V93 all penetrates through both the second insulation layer 102 and the third insulation layer 103. Of course, the amount of the plurality of via holes is not limited to three, and can be designed according to needs.

Figure 5A:
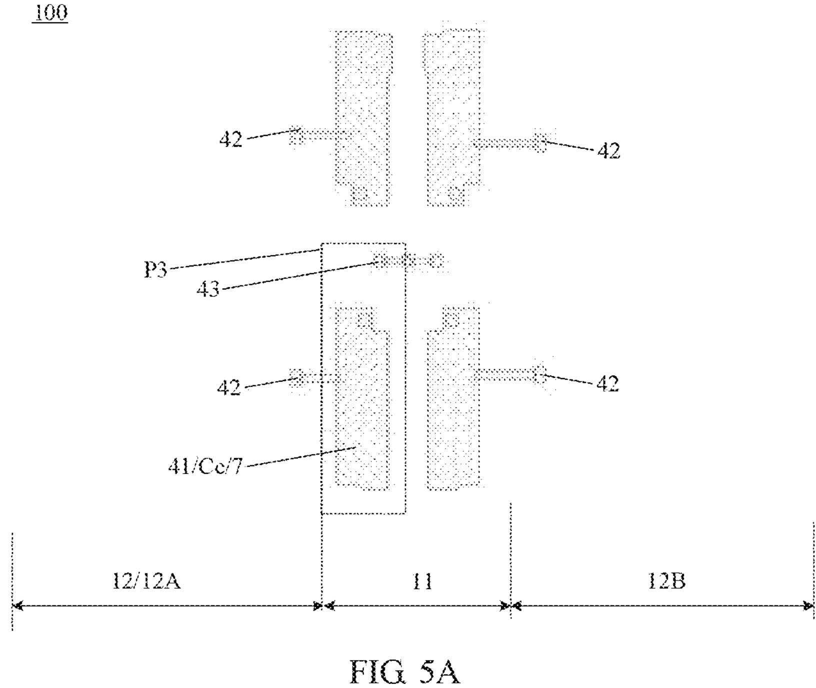
FIG. 5A is a schematic planar view of a first conductive layer of the display unit illustrated in FIG. 3A.
Figure 5B:
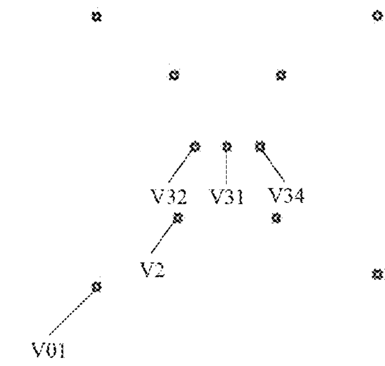
FIG. 5B is a schematic planar view of a first insulation layer of the display unit illustrated in FIG. 3A.
Figure 5C:
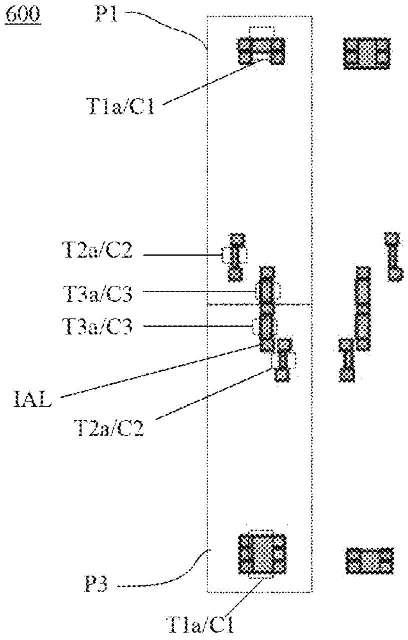
FIG. 5C is a schematic planar view of a semiconductor layer of the display unit illustrated in FIG. 3A.
Figure 5D:
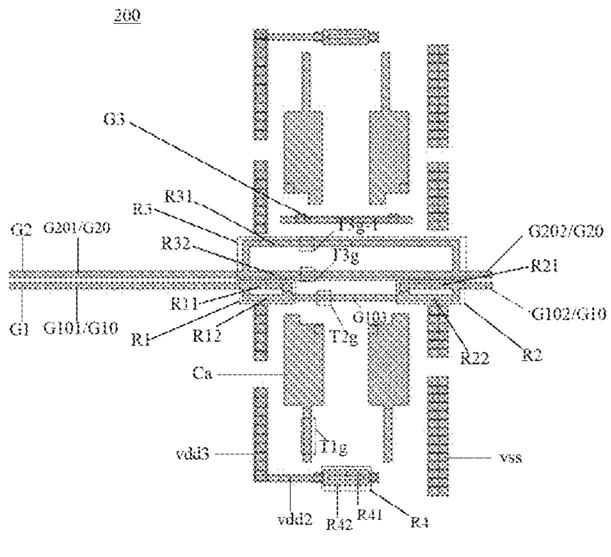
FIG. 5D is a schematic planar view of a second conductive layer of the display unit illustrated in FIG. 3A.
Figure 5E:
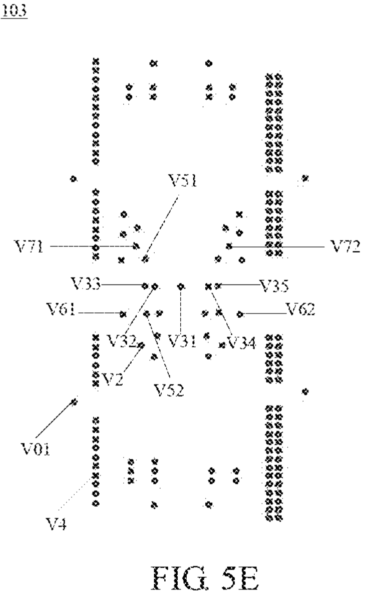
FIG. 5E is a schematic planar view of a third insulation layer of the display unit illustrated in FIG. 3A.
Figure 5F:
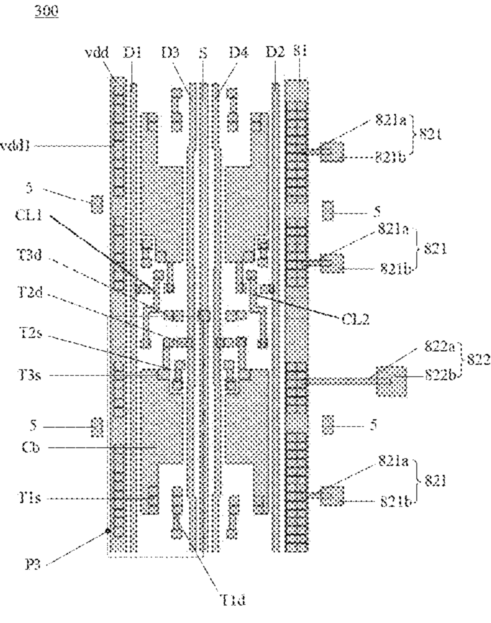
FIG. 5F is a schematic planar view of a third conductive layer of the display unit illustrated in FIG. 3A.
Figure 5G:
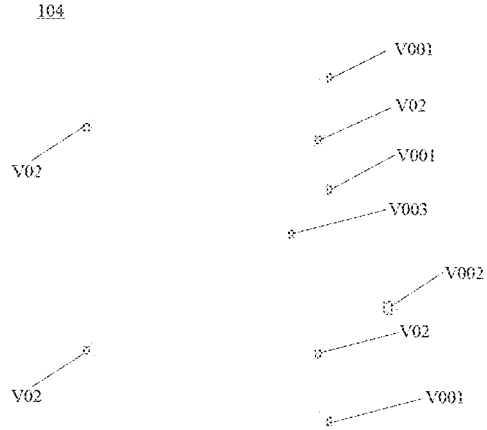
FIG. 5G is a schematic planar view of a fourth insulation layer of the display unit illustrated in FIG. 3A.
Figures 5H, 5I:
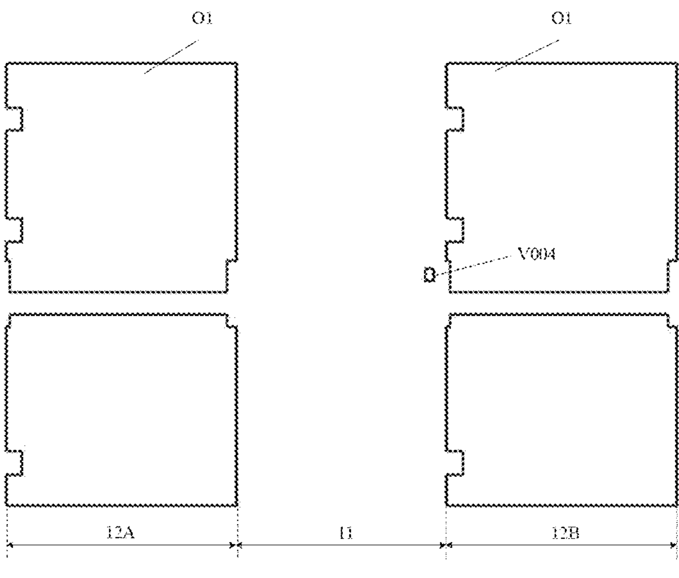
FIG. 5H is a schematic planar view of a fifth insulation layer of the display unit illustrated in FIG. 3A.
FIG. 5I is a schematic planar view of a fourth conductive layer of the display unit illustrated in FIG. 3A.
Figure 5J:
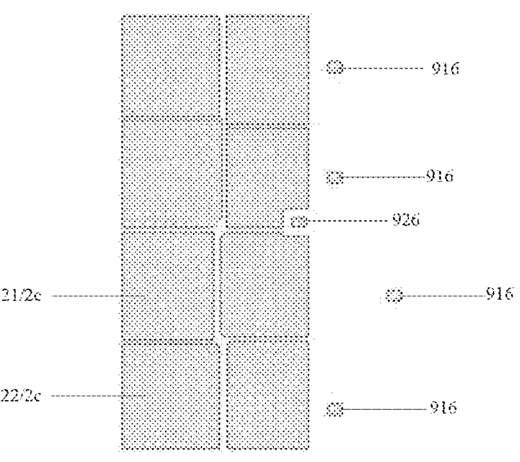
FIG. 5J is a schematic planar view of a fifth conductive layer of the display unit illustrated in FIG. 3A.
Figure 5K:
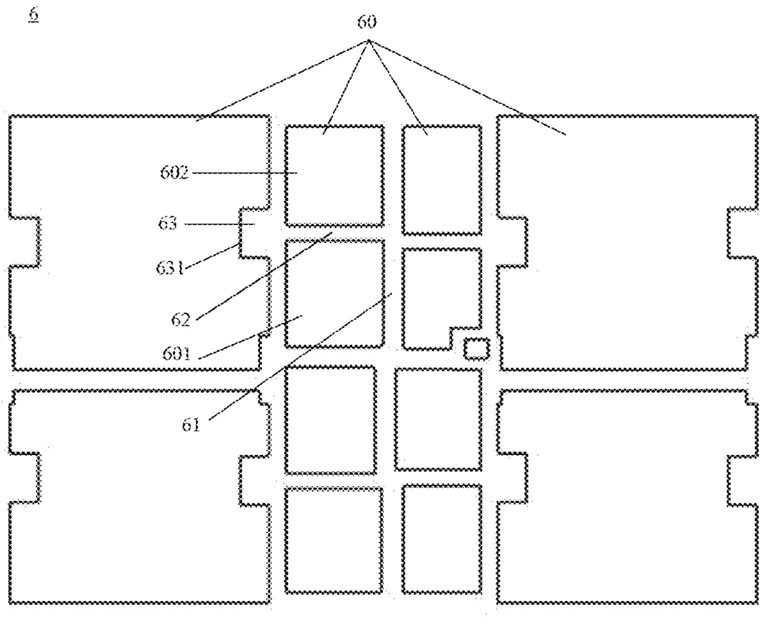
FIG. 5K is a schematic planar view of a pixel definition layer of the display unit illustrated in FIG. 3A.

FIG. 5A is a schematic planar view of the first conductive layer of the display unit illustrated in FIG. 3A; FIG. 5B is a schematic planar view of a first insulation layer of the display unit illustrated in FIG. 3A; FIG. 5C is a schematic planar view of the semiconductor layer of the display unit illustrated in FIG. 3A; FIG. 5D is a schematic planar view of the second conductive layer of the display unit illustrated in FIG. 3A; FIG. 5E is a schematic planar view of the third insulation layer of the display unit illustrated in FIG. 3A; FIG. 5F is a schematic planar view of the third conductive layer of the display unit illustrated in FIG. 3A; FIG. 5G is a schematic planar view of a fourth insulation layer of the display unit illustrated in FIG. 3A; FIG. 5H is a schematic planar view of a fifth insulation layer of the display unit illustrated in FIG. 3A; FIG. 5I is a schematic planar view of the fourth conductive layer of the display unit illustrated in FIG. 3A; and FIG. 5J is a schematic planar view of the fifth conductive layer of the display unit illustrated in FIG. 3A. As illustrated in FIG. 5A-FIG. 5I and in conjunction with FIG. 4A, the display substrate 10 includes a first conductive layer 100, a first insulation layer 101, a semiconductor layer 600, a second insulation layer 102, a second conductive layer 200, a third insulation layer 103, a third conductive layer 300, a fourth insulation layer 104, a fifth insulation layer 105, a fourth conductive layer 400 and a fifth conductive layer 500 that are sequentially stacked on the base substrate 1 along the direction from a position close to the base substrate 1 to a position away from the base substrate 1, and the fifth insulation layer 105 is also the above-mentioned interlayer insulation layer 105.

For example, the material of the semiconductor layer 600 includes but not limited to a silicon-based material (a-Si, p-Si, etc.), a metal oxide semiconductor (IGZO, ZnO, AZO, IZTO, etc.), and an organic material (sexithiophene, polythiophene, etc.).

As illustrated in FIG. 4A and FIG. 5A-FIG. 5J, the first conductive layer 100 includes the first transfer portion 41, the second transfer portion 42 and the third electrode plate Cc; the semiconductor layer 600 includes the active layer T1*a* of the driving transistor T1, the active layer T2*a* of the data transistor T2 and the active layer T3*a* of the detection transistor T3; the second conductive layer 200 includes the first sub-scanning signal line G1 and the second sub-scanning signal line G2, the gate electrode T1*g* of the driving transistor T1, the gate electrode T2*g* of the data transistor T2, the gate electrode T3*g* of the detection transistor T3, the first electrode plate Ca, the lateral portion vdd2 of the first power supply line vdd and the auxiliary power supply line vdd3; the auxiliary power supply line vdd3 extends along the second direction D2 corresponding to the longitudinal portion vdd1 of the first power supply line vdd, and is electrically connected to the longitudinal portion vdd1 of the first power supply line vdd through a plurality of via holes V4 penetrating through the third insulation layer 103, to be connected in parallel with the longitudinal portion vdd1 of the first power supply line vdd, so as to achieve the effect of reducing the resistance of the first power supply line vdd; moreover, as illustrated in FIG. 5D, the auxiliary power supply line vdd3 is electrically connected to the lateral portion vdd2, so that the lateral portion vdd2 is electrically connected to the longitudinal portion vdd1. For example, the auxiliary power supply line vdd3 and the lateral portion vdd2 are provided in the same layer, and both are located in the second conductive layer 200. For example, the auxiliary power supply line vdd3 and the lateral portion vdd2 constitute a continuous structure and are formed integrally. The third conductive layer 300 includes the first pole T1*s* and the second pole T1*d* of the driving transistor T1, the first pole T2*s* and the second pole T2*d* of the data transistor T2, the first pole T3*s* and the second pole T3*d* of the detection transistor T3, the data line D1\D2\D3\D4, the detection signal line S, and the longitudinal portion vdd1 of the first power supply line vdd. It can be seen from FIG. 4A and FIG. 5H that the above-mentioned interlayer insulation layer 105 is only provided in the display region 11, and there is no interlayer insulation layer 105 in the non-light-emitting region 12.

Referring to FIG. 4A and FIG. 5I, for example, both the first portion 21 of the first electrode 2 and the second portion 22 of the first electrode 2 are electrically connected to the first pole T1*s* of the driving transistor T1, and respectively include a first sub-electrode layer 2*a*, a second sub-electrode layer 2*b* and a third sub-electrode layer 2*c* that are sequentially stacked in the direction perpendicular to the base substrate 1 from a position close to the base substrate 1 to a position away from the base substrate 1. The fourth conductive layer 400 includes the connection portion 30, the first extension portion 31, the second extension portion 32, the first sub-electrode layer 2*a* of the first portion 21 and the first sub-electrode layer 2*a* of the second portion 22. The fifth conductive layer 500 includes the third sub-electrode layer 2*c* of the first portion 21 and the third sub-electrode layer 2*c* of the second portion 22. For example, the display substrate 10 further includes a sixth conductive layer, the sixth conductive layer is located between the fourth conductive layer 400 and the fifth conductive layer 500 in the direction perpendicular to the base substrate 1, and the sixth conductive layer includes the second sub-electrode layer 2*b* of the first portion 21 and the second sub-electrode layer 2*b* of the second portion 22.

FIG. 4C is a schematic cross-sectional view taken along the line D-D' in FIG. 3A. Referring to FIG. 5A and FIG. 4C, the first conductive layer 100 further includes an intermediate connection portion 43, for example, the intermediate connection portion 43 is located at the boundary region between the first pixel row and the second pixel row. The second pole T3*d* of the detection transistor T3 is connected to the active layer T3*a* of the detection transistor T3 through the intermediate via hole V33 penetrating through the third insulation layer 103, and is connected to the intermediate connection portion 43 through the second connection via hole V32 penetrating through the third insulation layer 103 and the first insulation layer 101; and the detection signal line S is connected to the intermediate connection portion 43 through the first connection via hole V31 penetrating through the third insulation layer 103 and the first insulation layer 101, so as to achieve the connection between the detection signal line S and the second pole T3*d* of the detection transistor T3. In addition, the second pole T3*d*' of the detection transistor of the fourth sub-pixel P4 is connected to the active layer T3*a*' of the detection transistor of the fourth sub-pixel P4 through the via hole V35 penetrating through the third insulation layer 103, and is connected to the intermediate connection portion 43 through the via hole V34 penetrating through the third insulation layer 103 and the first insulation layer 101, so that the second pole T3*d* of the detection transistor of the third sub-pixel P3 and the second pole T3*d*' of the detection transistor of the fourth sub-pixel P4 are connected to the same detection signal line S through the same intermediate connection portion 43, which simplifies the structure and manufacturing process of the display substrate 10.

For example, as illustrated in FIG. 4C and FIG. 5C, the second pole T3*d* of the detection transistor T3 of the first sub-pixel P1 (that is, the upper sub-pixel hereinafter) and the second pole T3*d* of the detection transistor T3 of the third sub-pixel P3 (that is, the lower sub-pixel hereinafter) constitute a continuous and integrated electrode, the active layer T3*a* of the detection transistor T3 of the first sub-pixel P1 and the active layer T3*a* of the detection transistor T3 of the third sub-pixel P3 constitute a continuous and integrated active layer IAL, and the continuous and integrated electrode is electrically connected to the continuous and integrated active layer IAL through the intermediate via hole V33.

For example, as illustrated in FIG. 4A, the third electrode plate Cc is located on the side of the first electrode plate Ca close to the base substrate 1.

For example, referring to FIG. 4A and FIG. 5A, the display substrate 10 further includes a light-shielding layer 7, and the light-shielding layer 7 is located on the side of the semiconductor layer 200 close to the base substrate 1. The orthographic projection of the active pattern (that is, the active layer T1*a* or the channel region) of the driving transistor T1 on the base substrate 1 is located within the orthographic projection of the light-shielding layer 7 on the base substrate 1, so that the light-shielding layer 7 is used to shield the top light from the side of the active pattern of the driving transistor T1 away from the base substrate 1, to prevent the top light from irradiating on the channel region of the driving transistor T1, thereby preventing the light from degrading the performance of the driving transistor T1. For example, the light-emitting device 20 is a top emission type, and the light emitted by the light-emitting layer 23 is emitted from the side of the light-emitting device 20 away from the base substrate 1. Of course, the light-emitting device 20 may also be a bottom emission type, and the light emitted by the light-emitting layer 23 is emitted through the base substrate 1. For example, the light-shielding layer 7 also serves as the first transfer portion 41, that is, the light-shielding layer 7 and the first transfer portion 41 are the same structure, so as to simplify the structure and manufacturing process of the display substrate 10.

At least one embodiment of the present disclosure further provides a method for operating a display substrate, which is applicable to any one of the display substrates 10 provided by the embodiments of the present disclosure. Referring to FIG. 3C, the operating method includes: cutting off a portion of the connection structure 3 of the display substrate 10 located in the non-light-emitting region to disconnect the connection structure 3 from one of the first portion 21 of the first electrode 2 and the second portion 22 of the first electrode 2. Here, "disconnection" means that the connection structure 3 is no longer electrically connected to the one of the first portion 21 and the second portion 22, for example, the one of the first portion 21 of the first electrode 2 and the second portion 22 of the first electrode 2 is disconnected from the connection portion 30 of the connection structure 3 which is located in the non-light-emitting region 12. In this way, here taking the third sub-pixel P3 as an example, when poor display such as a dark spot occurs in one selected from a group consisting of a region, corresponding to the first portion 21 of the first electrode 2, of the opening region of the sub-pixel and a region, corresponding to the second portion 22 of the first electrode 2, of the opening region of the sub-pixel, for example, when poor display such as a dark spot occurs in the region corresponding to the first portion 21 of the first electrode 2, the first portion 21 of the first electrode 2 can be disconnected from the connection structure 3, so that the region with poor display such as a dark spot will not perform the display function to achieve the repairing of the sub-pixel and improve the display quality.

For example, no conductive layer on the side of the connection structure 3 close to the base substrate 1 overlaps with, the portion of the connection structure 3 that is cut off, in the direction perpendicular to the base substrate 1. For example, no conductive layer on the side of the first cuttable portion 310 close to the base substrate 1 overlaps with the first cuttable portion 310 in the direction perpendicular to the base substrate 1, and no conductive layer on the side of the second cuttable portion 320 close to the base substrate 1 overlaps with the second cuttable portion 320 in the direction perpendicular to the base substrate 1. In this case, the method for operating the display substrate includes cutting off one of the first cuttable portion 310 and the second cuttable portion 320 to disconnect the one of the first portion 21 of the first electrode 2 and the second portion 22 of the first electrode 2 from the connection portion 30. In this way, other conductive layers will not be damaged during the cutting process of cutting the first cuttable portion 310 or the second cuttable portion 320 off, thereby facilitating the cutting process, thereby achieving the repairing of the sub-pixel and improving the display quality. For example, the first cuttable portion 310 or the second cuttable portion 320 is cut off by a method of laser irradiation to form a notch (not illustrated in figures), for example, the notch separates the first cuttable portion 310 or the second cuttable portion 320 into two portions spaced apart from each other in the first direction D1, one portion is connected to the first portion of the first electrode or the second portion of the first electrode, and the other portion is connected to the connection portion 30.

At least one embodiment of the present disclosure further provides a display substrate, the display substrate includes a base substrate, a display unit, a scanning signal lines and a longitudinal signal line. The display unit is provided on the base substrate and includes a display region and a non-light-emitting region; the display region includes a sub-pixel, the sub-pixel includes a driving transistor and a light-emitting device, the driving transistor is configured to control magnitude of a driving current flowing through the light-emitting device, and the light-emitting device is configured to receive the driving current and be driven by the driving current to emit light; the scanning signal line is provided on the base substrate, extends along a first direction as a whole, passes through the non-light-emitting region and the display region, and transmits a scanning signal; the longitudinal signal line is provided on the base substrate and located in the display region, and extends along a second direction intersecting with the first direction as a whole; and the scanning signal line includes at least one outer ring portion, and each of the at least one outer ring portion includes a first conductive line and a second conductive line. The first conductive line extends along the first direction as a whole, and extends from the non-light-emitting region to the display region; the second conductive line extends along the first direction as a whole, extends from the non-light-emitting region to the display region, and is spaced apart from the first conductive line in the second direction; both the first conductive line and the second conductive line overlap with the longitudinal signal line in a direction perpendicular to the base substrate; and the scanning signal line includes a trunk portion extending along the first direction as a whole, and both the first conductive line and the second conductive line are electrically connected to the trunk portion. In the display substrate, the first conductive line and the second conductive line transmit the same scanning signal, and the first conductive line and the second conductive line of the at least one outer ring portion extend from the non-light-emitting region to the display region to overlap with the longitudinal signal line. In this way, the at least one outer ring portion can effectively reduce the load (or resistance) of the scanning signal line, while avoiding too much overlap with the longitudinal signal line. In addition, the first conductive line and the second conductive line of at least one outer ring portion extend from the non-light-emitting region to the display region to overlap with the longitudinal signal line, located at the edge of the display region close to the non-light-emitting region, in the direction perpendicular to the base substrate. Thus, when there is a problem such as a short circuit at the overlap between the longitudinal signal line and one selected from a group consisting of the first conductive line and the second conductive line of the same one outer ring portion, the short-circuited one selected from the group consisting of the first conductive line and the second conductive line can be cut off to make the short-circuited one stop working, avoid affecting the display effect of the display unit where the short-circuited one is located, and achieve the pixel repairing of the display unit.

Figure 6A:
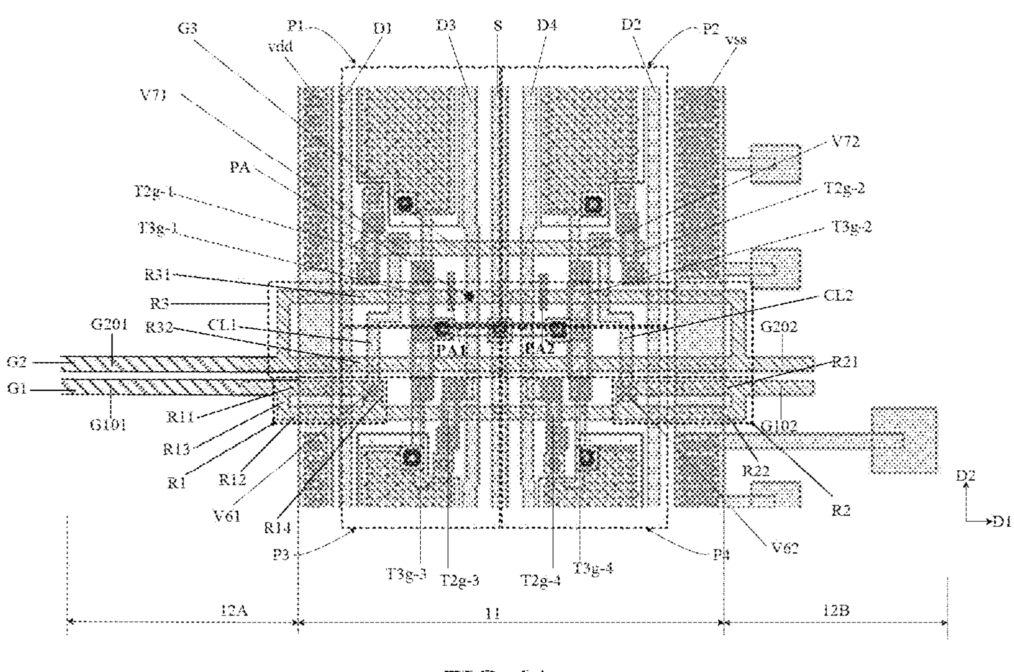
FIG. 6A is a schematic enlarged view of part A including at least one outer ring portion in FIG. 3A.

Exemplarily, for example, FIG. 6A is a schematic enlarged view of part A including the at least one outer ring portion in FIG. 3A. Referring to FIG. 3A, FIG. 6A and FIG. 5D, the display substrate 10 includes a longitudinal signal line, the longitudinal signal line is provided on the base substrate 1 and located in the display region 11, and extends along the second direction D2 intersecting with the first direction D1 as a whole. For example, the longitudinal signal line includes the above-mentioned first power supply line vdd, the second power supply line vss, the data lines D1-D4, the detection line S, a connection line (described below) and the like. In the embodiments illustrated in FIG. 3A and FIG. 6A, the first sub-scanning signal line G1 extending along the first direction D1 as a whole transmits the first scanning signal and includes a first outer ring portion R1. The above-mentioned at least one outer ring portion includes the first outer ring portion R1, the first outer ring portion R1 includes a first conductive line R11 and a second conductive line R12, and the first conductive line R11 of the first outer ring portion R1 extends along the first direction D1 as a whole, and extends from the non-light-emitting region 12A to the display region 11. The second conductive line R12 of the first outer ring portion R1 extends along the first direction D1 as a whole, extends from the non-light-emitting region 12A to the display region 11, and is spaced apart from the first conductive line R11 of the first outer ring portion R1 in the second direction D2. The first sub-scanning signal line G1 includes a first trunk portion G10 extending along the first direction D1 as a whole, and the first conductive line R11 of the first outer ring portion R1 and the second conductive line R12 of the first outer ring portion R1 are both connected to the first trunk portion G10, so that all of the first conductive line R11 of the first outer ring portion R1, the second conductive line R12 of the first outer ring portion R1, and the first trunk portion G10 transmit the first scanning signal.

As mentioned above, the display substrate 10 includes the first power supply line vdd, and the first power supply line vdd is connected to the first voltage terminal and is configured to provide the first power supply voltage to the sub-pixels, and includes the longitudinal portion vdd1 extending along the second direction D2 as a whole. As illustrated in FIG. 6A, the longitudinal signal line includes the longitudinal portion vdd1 of the first power supply line vdd, and both the first conductive line R11 of the first outer ring portion R1 and the second conductive line R12 of the first outer ring portion R1 overlap with the longitudinal portion vdd1 of the first power supply line vdd in the direction perpendicular to the base substrate 1. In this way, the first conductive line R11 of the first outer ring portion R1 and the second conductive line R12 of the first outer ring portion R1 both extend from the non-light-emitting region 12A to the display region 11, so that the first conductive line R11 and the second conductive line R12 can overlap with, in the direction perpendicular to the base substrate 1, the longitudinal signal line, such as the first power supply line vdd, located at an edge of the display region 11 close to the non-light-emitting region 12A. Thus, the first outer ring portion R1 can effectively reduce the load (or resistance) of the first sub-scanning signal line G1, and avoid too much overlapping with the longitudinal portion vdd1, and there are only two overlapping portion between the first sub-scanning signal line G1 and the longitudinal portion vdd1. When there is a problem such as a short circuit at the overlapping portion between the longitudinal portion vdd1 and one selected from a group consisting of the first conductive line R11 of the first outer ring portion R1 and the second conductive line R12 of the first outer ring portion R1, the one selected from the group consisting of the first conductive line R11 of the first outer ring portion R1 and the second conductive line R12 of the first outer ring portion R1 which is short-circuited can be cut off, for example, the one selected from the group consisting of the first conductive line R11 of the first outer ring portion R1 and the second conductive line R12 of the first outer ring portion R1 which is short-circuited can be cut off at the position of the first side or the second side, opposite to each other in the first direction D1, of the longitudinal portion vdd1, so that the conductive line which is cut off stops working, so as to avoid affecting the display effect of the display unit P where the one which is short-circuited is located, and to achieve the pixel repairing of the display unit P; and the one selected from the group consisting of the first conductive line R11 of the first outer ring portion R1 and the second conductive line R12 of the first outer ring portion R1 which is not cut off continues to provide the first scanning signal for the plurality of sub-pixels P1-P4 of the display unit P, to keep the plurality of sub-pixels P1-P4 of the display unit P working normally, and reduce the impact of the above-mentioned short circuit problem on the display effect.

For example, the longitudinal signal line further includes a data signal line DT, and the data signal line transmits a data signal DT; the first sub-scanning signal line G1 is configured to provide a first scanning signal to the data writing transistor T2, for example, the first sub-scanning signal line G1 provides the first scanning signal to the plurality of sub-pixels P1-P4. For example, in the embodiment illustrated in FIG. 6A, the first conductive line R11 of the first outer ring portion R1 and the second conductive line R12 of the first outer ring portion R1 overlap with the first data signal line D1 in the direction perpendicular to the base substrate 1. Of course, in other embodiments, the first conductive line R11 of the first outer ring portion R1 and the second conductive line R12 of the first outer ring portion R1 may overlap with the second data signal line D2 in the direction perpendicular to the base substrate 1, or overlap with the third data signal line D3 in the direction perpendicular to the base substrate 1, or overlap with the fourth data signal line D4 in the direction perpendicular to the base substrate 1. For example, in other embodiments, the first conductive line R11 of the first outer ring portion R1 and the second conductive line R12 of the first outer ring portion R1 may also overlap with a plurality of data signal lines of the display unit P, which can be designed as required.

For example, the non-light-emitting region of the display unit P includes a first non-light-emitting region 12A and a second non-light-emitting region 12B, the first non-light-emitting region 12A is located on the first side of the display region 11 in the first direction D1, and the second non-light-emitting region 12B is located on the second side, opposite to the first side, of the display region 11 in the first direction D1; and the first sub-scanning signal line G1 passes through the first non-light-emitting region 12A, the display region 11 and the second non-light-emitting region 12B sequentially. The first trunk portion G10 includes a first portion G101 located in the first non-light-emitting region 12A and a second portion G102 located in the second non-light-emitting region 12B; and the first sub-scanning signal line G1 further includes a first branch portion and a second branch portion. The first branch portion is connected to the first portion G101 of the first trunk portion G10 and the second portion G102 of the first trunk portion G10, and includes the first conductive line R11 of the first outer ring portion R1; the first conductive line R11 of the first outer ring portion R1 is located on the first side of the first trunk portion G10 in the second direction D2, and the first conductive line R11 of the first outer ring portion R1 is electrically connected to the first trunk portion G10; the second branch portion is connected to the first portion G101 of the first trunk portion G10 and the second portion G102 of the first trunk portion G10, and includes the second conductive line R12 of the first outer ring portion R1; and the second conductive line R12 of the first outer ring portion R1 is located on the second side, opposite to the first side, of the first trunk portion G10 in the second direction D2, and the second conductive line R12 of the first outer ring portion R1 is connected to the first trunk portion G10 to correspond to the first pixel row and the second pixel row that are arranged along the second direction D2 to make reasonable use of space.

For example, as illustrated in FIG. 6A and FIG. 5D, the first sub-scanning signal line G1 further includes a second outer ring portion R2, and the above-mentioned at least one outer ring portion includes the second outer ring portion R2. The first conductive line R21 of the second outer ring portion R2 and the second conductive line R22 of the second outer ring portion R1 are both connected to the first trunk portion G10. The longitudinal signal line includes a second power supply line vss, and the second power supply line vss is connected to a second voltage terminal, is configured to provide a second power supply voltage different from the first power supply voltage to the sub-pixel, and extends along the second direction D2; and the first conductive line R21 of the second outer ring portion R2 and the second conductive line R22 of the second outer ring portion R2 overlap with the second power supply line vss in the direction perpendicular to the base substrate 1. In this way, the second outer ring portion R2 can further reduce the load (or resistance) of the first sub-scanning signal line G1, while avoiding too much overlapping with the second power supply line vss, and there are only two overlapping portions between the second outer ring portion R2 and the second power supply line vss. When there is a problem such as a short circuit at the overlapping portion between the second power supply line vss and one selected from the group consisting of the first conductive line R21 of the second outer ring portion R2 and the second conductive line R22 of the second outer ring portion R2, the one selected from the group consisting of the first conductive line R21 of the second outer ring portion R2 and the second conductive line R22 of the second outer ring portion R2 which is short-circuited can be cut off, for example, the one selected from the group consisting of the first conductive line R21 of the second outer ring portion R2 and the second conductive line R22 of the second outer ring portion R2 which is short-circuited can be cut off at the position of the first side or the second side, opposite to each other in the first direction D1, of the second power supply line vss, so that the conductive line which is cut off stops working, so as to avoid affecting the display effect of the display unit P where the conductive line which is cut off is located, and to achieve the pixel repairing of the display unit P; and the one selected from the group consisting of the first conductive line R21 of the second outer ring portion R2 and the second conductive line R22 of the second outer ring portion R2 which is not cut off continues to provide the first scanning signal for the plurality of sub-pixels P1-P4 of the display unit P, to keep the plurality of sub-pixels P1-P4 of the display unit P working normally, and reduce the impact of the above-mentioned short circuit problem on the display effect.

For example, the first power supply voltage is, for example, a high power supply voltage VDD, and the second power supply voltage is, for example, a low power supply voltage VSS.

For example, as illustrated in FIG. 6A and FIG. 5D, the second outer ring portion R2 and the first outer ring portion R1 are spaced apart from each other in the first direction D1. In the embodiments of the present disclosure, because the signal lines between the second outer ring portion R2 and the first outer ring portion R1 are relatively dense, this technical scheme can avoid the problem of forming a lot of short circuits and reducing the manufacturing yield caused by the overlapping of the second outer ring portion R2 and the first outer ring portion R1 with too many signal lines extending along the second direction D2. Of course, according to different layout structures, the lengths of the second outer ring portion R2 and the first outer ring portion R1 in the first direction D1 may be designed as needed to determine which signal lines extending along the second direction D2 overlap with the second outer ring portion R2 and the first outer ring portion R1 in the direction perpendicular to the base substrate 1, and the embodiments of the present disclosure are not limited in this aspect.

For example, as illustrated in FIG. 6A and FIG. 5D, the first conductive line R11 of the first outer ring portion R1 and the second conductive line R12 of the first outer ring portion R1 extend from the first non-light-emitting region 12A to the display region 11, and the first conductive line R21 of the second outer ring portion R2 and the second conductive line R22 of the second outer ring portion R2 extend from the second non-light-emitting region 12B to the display region 11. The first sub-scanning signal line G1 further includes an intermediate connection portion G103. The first outer ring portion R1 and the second outer ring portion R2 are both closed rings, and the first portion G101 of the first trunk portion G10, the first outer ring portion R1, the intermediate connection portion G103, the second outer ring portion R2, and the second portion G102 of the first trunk portion G10 are sequentially connected to achieve that the first portion G101 of the first trunk portion G10, the first outer ring portion R1, the intermediate connection portion G103, the second outer ring portion R2 and the second portion G102 of the first trunk portion G10 transmit the first scanning signal along the first direction D1.

For example, as illustrated in FIG. 6A and FIG. 5D, the first outer ring portion R1 and the second outer ring portion R2 are symmetrical with respect to a symmetry axis extending along the second direction D2, so that the display unit P and the pixel array are more uniform, and the display effect of the whole display region is relatively uniform.

For example, the first portion of the first trunk portion G10, the first outer ring portion R1, the intermediate connection portion G103, the second outer ring portion R2 and the second portion of the first trunk portion G10 constitute a continuous structure and are formed integrally (that is, an integral structure), so as to simplify the structure and manufacturing process of the display substrate 10.

For example, as illustrated in FIG. 6A and FIG. 5D, the first conductive line R11 of the first outer ring portion R1 has a first end and a second end that are opposite to each other in the first direction D1, and the second conductive line R12 of the first outer ring portion R1 has a first end and a second end that are opposite to each other in the first direction D1; the first outer ring portion R2 further includes a third connection line R13 and a fourth connection line R14; the third connection line R13 is located in the first non-light-emitting region 12A, extends along the second direction D2, and connects the first end of the first conductive line R11 and the first end of the second conductive line R12; and the fourth connective line R14 is located in the display region 11, extends along the second direction D2, and connects the second end of the first conductive line R11 and the second end of the second conductive line R12, so that the first outer ring portion R1 forms a closed ring. Similarly, the same is true for the second outer ring portion R2.

For example, the longitudinal portion vdd1 of the first power supply line vdd is located at the first edge of the display region 11 in the first direction D1, and the second power supply line vss is located at the second edge, opposite to the first edge, of the display region 11 in the first direction D1. Thus, the first conductive line R11 and the second conductive line R12 of the first outer ring portion R1 extend from the first non-light-emitting region 12A to the display region 11 so as to overlap with the longitudinal portion vdd1 of the first power supply line vdd, and the first conductive line R21 and the second conductive line R22 of the second outer ring portion R2 extend from the second non-light-emitting region 12B to the display region 11 so as to overlap with the second power supply line vss.

For example, as illustrated in FIG. 6A and FIG. 5D, as mentioned above, the scanning signal line further includes the second sub-scanning signal line G2, and the second sub-scanning signal line G2 extends along the first direction D1 as a whole, is spaced apart from the first sub-scanning signal line in the second direction D2, and transmits the second scanning signal different from the first scanning signal; the second sub-scanning signal line G2 includes a third outer ring portion R3, and the above-mentioned at least one outer ring portion includes the third outer ring portion R3; the second sub-scanning signal line G2 includes a second trunk portion G20 extending along the first direction D1 as a whole, and the first conductive line R31 of the third outer ring portion R3 and the second conductive line R32 of the third outer ring portion R3 are both connected to the second trunk portion G20; and the first conductive line R31 of the third outer ring portion R3 and the second conductive line R32 of the third outer ring portion R3 both overlap with the longitudinal portion vdd1 of the first power supply line vdd and the second power supply line vss in the direction perpendicular to the base substrate 1. Thus, the third outer ring portion R3 can effectively reduce the load (or resistance) of the second sub-scanning signal line G2, while avoiding too much overlapping between the third outer ring portion R3 and the longitudinal portion vdd1 or the second power supply line vss, and the third outer ring portion R3 overlaps with the longitudinal portion vdd1 and the second power supply line vss respectively in only two positions. When a problem such as a short circuit occurs at the overlapping position between, the longitudinal portion vdd1 or the second power supply line vss, and one selected from the group consisting of the first conductive line R31 of the third outer ring portion R3 and the second conductive line R32 of the third outer ring portion R3, the one selected from the group consisting of the first conductive line R31 of the third outer ring portion R3 and the second conductive line R32 of the third outer ring portion R3 which is short-circuited can be cut off, for example, the one selected from the group consisting of the first conductive line R31 of the third outer ring portion R3 and the second conductive line R32 of the third outer ring portion R3 which is short-circuited can be cut off at the position of the first side or the second side, opposite to each other in the first direction D1, of the longitudinal portion vdd1 or the second power supply line vss, so that the cut conductive line stops working, so as to avoid affecting the display effect of the display unit P where the conductive line which is cut off is located, and to achieve the pixel repairing of the display unit P; and the one selected from the group consisting of the first conductive line R31 of the third outer ring portion R3 and the second conductive line R32 of the third outer ring portion R3 which is not cut off continues to provide the first scanning signal for the plurality of sub-pixels P1-P4 of the display unit P, so as to keep the plurality of sub-pixels P1-P4 of the display unit P working normally, and reduce the impact of the above-mentioned short circuit problem on the display effect.

Exemplarily, when a short circuit occurs at a position PA where the third data signal line D3 overlaps with the first conductive line R31 of the third outer ring portion R3 in FIG. 6A, the first conductive line R31 of the third outer ring portion R3 can be cut off at a position PA1 on the first side of the third data signal line D3 in the first direction D1, or the first conductive line R31 of the third outer ring portion R3 can be cut off at a position PA2 on the second side of the third data signal line D3 in the first direction D1, so that the first conductive line R31 of the third outer ring portion R3 no longer transmits current, thereby eliminating the short circuit occurs at the position PA, and the uncut second conductive line R32 of the third outer ring portion R3 provides the second scanning signal for sub-pixels of the display unit P. The repairing method for each longitudinal signal line is similar to this and will not be described one by one.

For example, as illustrated in FIG. 6A and FIG. 5D, the first conductive line R31 of the third outer ring portion R3 and the second conductive line R32 of the third outer ring portion R3 respectively extend from the first non-light-emitting region 12A to the display region 11 and then extend to the second non-light-emitting region 12B. That is, the first conductive line R31 of the third outer ring portion R3 and the second conductive line R32 of the third outer ring portion R3 pass through the first non-light-emitting region 12A, the display region 11 and the second non-light-emitting region 12B sequentially and penetrate through the whole display region 11, so that the first conductive line R31 of the third outer ring portion R3 and the second conductive line R32 of the third outer ring portion R3 can overlap with all the longitudinal signal lines, extending along the second direction D2 as a whole in the display region 1, in the direction perpendicular to the base substrate 1, and for all longitudinal signal lines, the above-mentioned pixel repairing when a short circuit occurs can be solved.

For example, the second trunk portion G20 includes a first portion located in the first non-emitting region 12A and a second portion located in the second non-emitting region 12B; and the second sub-scanning signal line G2 includes a third branch portion and a fourth branch portion. The third branch portion is connected to the first portion of the second trunk portion G20 and the second portion of the second trunk portion G20, and includes the first conductive line R31 of the third outer ring portion R3; the first conductive line R31 of the third outer ring portion R3 is located on the first side of the second trunk portion G20 in the second direction D2, and the first conductive line R31 of the third outer ring portion R3 is electrically connected to the second trunk portion G20; the fourth branch portion is connected to the first portion of the second trunk portion G20 and the second portion of the second trunk portion G20, and includes the second conductive line R32 of the third outer ring portion R3; and the second conductive line R32 of the third outer ring portion R3 is located on the second side, opposite to the first side, of the second trunk portion G20 in the second direction D2, and the second conductive line R32 of the third outer ring portion R3 is electrically connected to the second trunk portion G20 to correspond to the first pixel row and the second pixel row arranged along the second direction D2 to make reasonable use of space, so that the second sub-scanning signal line G2 can be used to provide the second scanning signal to the first pixel row and the second pixel row.

For example, as illustrated in FIG. 6A, the first conductive line R31 of the third outer ring portion R3 and the second conductive line R32 of the third outer ring portion R3 both overlap with the data signal line in the direction perpendicular to the base substrate 1, overlap with the longitudinal portion vdd1 of the first power supply line vdd in the direction perpendicular to the base substrate 1, and overlap with the second power supply line vss in the direction perpendicular to the base substrate 1. For example, the data signal lines include a first data line D1 providing a data signal DT to the first sub-pixel P1, a second data line D2 providing a data signal DT to the second sub-pixel P2, a third data line D3 providing a data signal DT to the third sub-pixel P3 and a fourth data line D4 providing a data signal DT to the fourth sub-pixel P4; and the first data line D1, the second data line D2, the third data line D3 and the fourth data line D4 are arranged at intervals in the first direction D1. For example, the first conductive line R31 of the third outer ring portion R3 and the second conductive line R32 of the third outer ring portion R3 both overlap with the data signal lines D1-D4 of the plurality of sub-pixels P1-P4 of the display unit P. In this way, for each selected from a group consisting of the data signal lines D1-D4, the longitudinal portion vdd1 of the first power supply line vdd, and the second power supply line vss, the pixel repairing when a short circuit mentioned above occurs at the overlapping position of the third outer ring portion R3 and the respective signal line can be realized.

For example, the longitudinal signal line further includes a detection signal line S, and the detection signal line S transmits a detection signal. The sub-pixel further includes a detection transistor T3, the second sub-scanning signal line G2 is configured to provide a second scanning signal to the detection transistor T3, and the detection transistor T3 is configured to utilize the detection signal to detect the electrical characteristics of the sub-pixel under the control of the second scanning signal to achieve external compensation. For example, as illustrated in FIG. 6A, the first conductive line R31 of the third outer ring portion R3 and the second conductive line R32 of the third outer ring portion R3 both overlap with the detection signal line S in the direction perpendicular to the base substrate 1. As a result, for the detection signal line S, the above-mentioned pixel repairing when a short circuit mentioned above occurs at the overlapping position of the detection signal line S and the third outer ring portion R3 can also be realized.

For example, the first sub-scanning signal line G1 is configured to provide the first scanning signal to a data transistor T2 of the third sub-pixel P3 and a data transistor T2 of the fourth sub-pixel P4; the first conductive line R31 of the third outer ring portion R3 provides the second scanning signal to a detection transistor T3 of the first sub-pixel P1 and a detection transistor T3 of the second sub-pixel P2, and the second conductive line R32 of the third outer ring portion R3 provides the second scanning signal to a detection transistor T3 of the third sub-pixel P3 and a detection transistor T3 of the fourth sub-pixel P4. Both the first conductive line R31 of the third outer ring portion R3 and the second conductive line of the third outer ring portion R3 overlap with the first data line D1, the second data line D2, the third data line D3 and the fourth data line D4 in the direction perpendicular to the base substrate 1.

For example, as illustrated in FIG. 6A, the portions of the first conductive line R31 of the third outer ring portion R3 overlapping with the channel regions of the detection transistors T3 of the third sub-pixel P3 and the fourth sub-pixel P4 respectively constitute the gate electrode T3*g*-3 of the detection transistor T3 of the third sub-pixel P3 and the gate electrode T3*g*-4 of the detection transistor T3 of the fourth sub-pixel P4, and the portions of the second conductive line R32 of the third outer ring portion R3 overlapping with the channel regions of the detection transistor T3 of the first sub-pixel P1 and the second sub-pixel P2 respectively constitute the gate electrode T3*g*-1 of the detection transistor T3 of the first sub-pixel P1 and the gate electrode T3*g*-2 of the detection transistor T3 of the second sub-pixel P2.

Referring to FIG. 5D, the first sub-scanning signal line G1 and the second sub-scanning signal line G2 are located in the same layer, for example, are located in the second conductive layer 200. Therefore, the outer ring portions, such as the first outer ring portion R1, the second outer ring portion R2 and the third outer ring portion R3 are all located in the same conductive layer, for example, are all located in the second conductive layer 200.

Referring to FIG. 6A and FIG. 5D, the area of the ring shape of the third outer ring portion R3 is larger than the area of the ring shape of the first outer ring portion R1 and larger than the area of the ring shape of the second outer ring portion R2. For example, the length of the third outer ring portion R3 in the first direction D1 is greater than the length of the second outer ring portion R2 in the first direction D1 and greater than the length of the first outer ring portion R1 in the first direction D1, and the width of the third outer ring portion R3 in the second direction D2 is larger than the width of the second outer ring portion R2 in the second direction D2 and larger than the width of the first outer ring portion R1 in the second direction D2. The third outer ring portion R3 extends into the display region 11 from the non-light-emitting region 12A of a display unit located on the first side of the display region 11 along the first direction D1, and penetrates through the display region 11 along the first direction D1 and then extends into the second non-light-emitting 12B located on the second side of display region 11, while the first outer ring portion R1 and the second outer ring portion R2 do not cross the whole display region 11 along the first direction.

For example, as illustrated in FIG. 6A, the portion of the intermediate connection portion G103 of the first sub-scanning signal line G1 overlapping with the channel region of the data transistor T2 of the third sub-pixel P3 constitutes the gate electrode T2*g*-3 of the data transistor T2 of the third sub-pixel P3, and the portion of the intermediate connection portion G103 of the first sub-scanning signal line G1 overlapping with the channel region of the data transistor T2 of the fourth sub-pixel P4 constitutes the gate electrode T2*g*-4 of the data transistor T2 of the fourth sub-pixel P4.

For example, as illustrated in FIG. 6A, FIG. 5D and FIG. 5F, the display unit P further includes an auxiliary scanning line G3, a first connection line CL1 and a second connection line CL2, and the auxiliary scanning line G3 extends along the first direction D1; the first connection line CL1 is connected to the auxiliary scanning line G3 and the first sub-scanning signal line G1; the second connection line CL2 is spaced apart from the first connection line CL1 in the second direction D2, and is connected to the auxiliary scanning line G3 and the first sub-scanning signal line G1; the auxiliary scanning line G3 is configured to provide the first scanning signal to the data transistor T2 of the first sub-pixel P1 and the data transistor T2 of the second sub-pixel P2; and the first conductive line R31 of the third outer ring portion R3 and the second conductive line R32 of the third outer ring portion R3 both overlap with the first connection line CL1 and the second connection line CL2 in the direction perpendicular to the base substrate 1. In this way, for both the first connection line CL1 and the second connection line CL2, the above-mentioned pixel repairing when a short circuit occurs at the overlapping position of both the first connection line CL1 and the second connection line CL2 and the third outer ring portion R3 can be realized.

For example, as illustrated in FIG. 5D, the first sub-scanning signal line G1 and the auxiliary scanning line G3 are provided in the same layer, and are provided in the same layer as the first pole of the driving transistor, and are both located in the second conductive layer 200. The first connection line CL1 and the second connection line CL2 are located in the third conductive layer 300 and are provided in a different layer from the first sub-scanning signal line G1.

For example, as illustrated in FIG. 5F, the auxiliary scanning line G3 has a first end and a second end that are opposite to each other in the first direction D1; and the first connection line CL1 is connected to the first end of the auxiliary scanning line G3 and the first outer ring portion R1, and the second connection line CL2 is connected to the second end of the auxiliary scanning line G3 and the second outer ring portion R2.

For example, referring to FIG. 5E-FIG. 5F and FIG. 6A, the first end of the auxiliary scanning line G3 is connected to the first end of the first connection line CL1 through a via hole V71 penetrating through the third insulation layer 103, and the second end of the first connection line CL1 is connected to the first sub-scanning signal line G1 through a via hole V61 penetrating through the third insulation layer 103; the second end of the auxiliary scanning line G3 is connected to the first end of the second connection line CL2 through a via hole V72 penetrating through the third insulation layer 103, and the second end of the second connection line CL2 is connected to the first sub-scanning signal line G1 through a via hole V62 penetrating through the third insulation layer 103. For example, the second end of the first connection line CL1 is connected to the second outer ring portion R2 through the via hole V61, and the second end of the second connection line CL2 is connected to the second outer ring portion R2 through the via hole V62.

For example, the amount of outer ring portions included in the second sub-scanning signal line G2 is smaller than the amount of outer ring portions included in the first sub-scanning signal line G1. For example, the amount of outer ring portions included in the second sub-scanning signal line G2 is 1, that is, the amount of the third outer ring portion R3 is 1; the amount of outer ring portions included in the first sub-scanning signal line G1 is 2, that is, one first outer ring portion R1 and one second outer ring portion R2 respectively. The first sub-scanning signal line G1 includes more outer ring portions, which is convenient for providing the outer ring portions at multiple positions, and flexibly meets the requirements of multiple positions that need to be provided the outer ring portions, for example, two outer ring portions respectively provided at two positions in one display unit are respectively connected to the first end and the second end of the auxiliary scanning line G3. In addition, the second sub-scanning signal line G2 includes fewer outer ring portions, which can meet the requirements of allowing the second sub-scanning signal line G2 to overlap with various longitudinal signal lines, and can avoid the arrangement of a plurality of outer rings, simplifying the structure of the display substrate, and reducing the manufacturing difficulty of the display substrate, which is very important to improving the manufacturing yield of the display substrate, especially for such a display substrate with a complex structure and a high resolution.

Figure 6B:
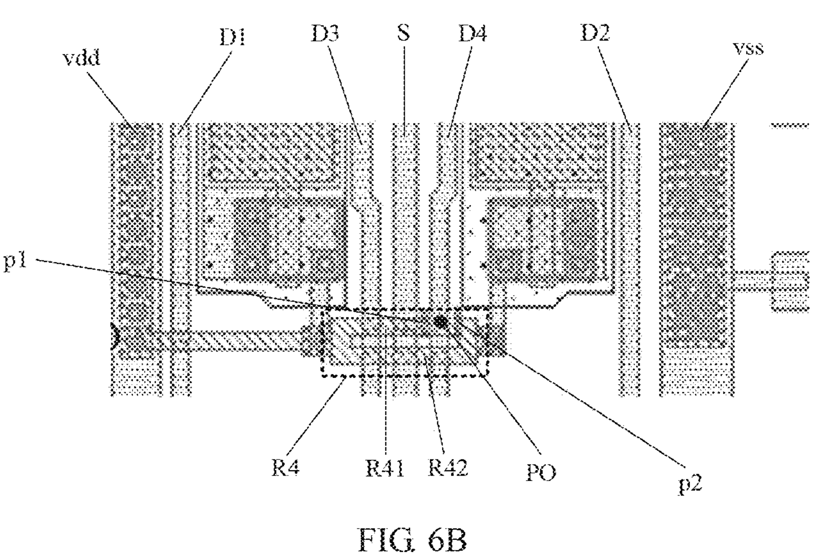
FIG. 6B is a schematic enlarged view of part B including at least one inner ring portion in FIG. 3A.

For example, FIG. 6B is a schematic enlarged view of the part B including at least one inner ring portion in FIG. 3A. Referring to FIG. 5D and FIG. 6B, the lateral portion vdd2 of the first power supply line vdd includes an inner ring portion R4, and the inner ring portion R4 includes a third conductive line R41 and a fourth conductive line R42. The third conductive line R41 extends along the first direction D1 as a whole and is located in the display region 11; the fourth conductive line R42 extends along the first direction D1 as a whole, is located in the display region 11, and is spaced apart from the third conductive line R41 in the second direction D2. The third conductive line R41 and the fourth conductive line R42 both overlap with at least part of the longitudinal signal line in the direction perpendicular to the base substrate 1, and provide the same first power supply voltage to the plurality of sub-pixels of the display unit P.

For example, the lateral portion vdd2 of the first power supply line vdd is provided in the same layer as the first sub-scanning signal line G1 and the second sub-scanning signal line G2, is provided in a different layer from the longitudinal portion vdd1 of the first power supply line vdd, and is electrically connected to the longitudinal portion vdd1 through a via hole (specifically as above).

For example, as illustrated in FIG. 6B, the third conductive line R41 and the fourth conductive line R42 both overlap with at least part of the data signal lines of the display unit P in the direction perpendicular to the base substrate 1, for example, the third conductive line R41 and the fourth conductive line R42 both overlap with the third data signal line D3 and the fourth data signal line D4 in the direction perpendicular to the base substrate 1. Thus, when a short circuit occurs at the positions of the third data signal line D3 or the fourth data signal line D4 overlapping with the third conductive line R41 or the fourth conductive line R42, the pixel repairing can be achieved. Exemplarily, when a short circuit occurs at a position PO of the fourth data signal line D4 overlapping with the third conductive line R41 in FIG. 6B, the third conductive line R41 can be cut off at a position p1 on the first side of the fourth data signal line D4 in the first direction D1, or the third conductive line R41 can be cut off at a position p2 on the second side of the fourth data signal line D4 in the first direction D1, so that the third conductive line R41 no longer transmits current, thereby eliminating the short circuit at the position P0, and the fourth conductive line R42 which is not cut off provides the second power supply voltage for sub-pixels of the display unit P. The repairing method for each longitudinal signal line is similar to that described above and are not described one by one.

Of course, in other embodiments, the third conductive line R41 and the fourth conductive line R42 may overlap with each data signal line of the data signal lines D1-D4 of the display unit P in the direction perpendicular to the base substrate 1. Therefore, when a short circuit occurs at the positions of the data signal lines D1-D4 overlapping with the third conductive line R41 and the fourth conductive line R42, pixel repairing can be achieved.

For example, as illustrated in FIG. 6B, both the third conductive line R41 and the fourth conductive line R42 overlap with the detection signal line S in the direction perpendicular to the base substrate 1. Thus, for both the third data signal line D3 and the fourth data signal line D4, the above-mentioned pixel repairing, when a short circuit occurs at the overlapping positions between, the third data signal line D3 or the fourth data signal line D4, and the detection signal line S, can also be realized.

For example, the detection signal line S is sandwiched between the third data line D3 and the fourth data line D4 and is adjacent to both the third data line D3 and the fourth data line D4, and both the third conductive line R41 and the fourth conductive line R42 overlap with the third data line D3, the fourth data line D4 and the detection signal line S in the direction perpendicular to the base substrate 1. In this way, by utilizing one ring structure which is the inner ring portion R4 to overlap with a plurality of longitudinal signal lines at a position where the longitudinal signal lines are arranged densely, so that the above-mentioned pixel repairing when a short circuit occurs can also be realized for all of the third data signal line D3, the fourth data signal line D4 and the detection signal line S.

FIG. 5K is a schematic planar view of a pixel definition layer of the display unit illustrated in FIG. 3A. For example, the pixel definition layer 6 exposes at least part of the outer ring portion. Referring to FIG. 3A, FIG. 5K and FIG. 6A, for example, the pixel definition layer 6 exposes a part of the first outer ring portion R1 and a part of the second outer ring portion R2.

For example, referring to FIG. 3A, FIG. 3C, FIG. 5K and FIG. 6A, the pixel definition layer 6 includes a portion located in the non-light-emitting region 12A, the orthographic projection of the portion of the pixel definition layer 6 located in the non-light-emitting region 12A includes a groove 63 that is recessed away from the display region, and the orthographic projection of the connection portion 30 on the base substrate 1 is at least partially within the orthographic projection of the groove 63 on the base substrate 1; the groove 63 has an edge 631 facing the connection portion 30 in the first direction D1, and a space is between an edge of the connection portion 30 away from the display region 11 in the first direction D1 and the edge 631 of the groove 63. That is, the edge 631 of the groove 63 is located on a side of the edge 301 of the connection portion 30 away from the display region 11.

At least one embodiment of the present disclosure further provides a method for operating a display substrate, which is applicable to any one of the display substrates 10 provided by the embodiments of the present disclosure. The method for operating the display substrate 1 includes: cutting off a portion, located in the display region 11, of one selected from a group consisting of the first conductive line and the second conductive line of the same one outer ring portion. For example, the same one outer ring portion may be any one selected from a group consisting of, the above-mentioned first outer ring portion R1, the second outer ring portion R2, and the third outer ring portion R3.

For example, no conductive layer overlaps with one selected from the group consisting of the first conductive line and the second conductive line of the same outer ring portion in the direction perpendicular to the base substrate 1, on the side of a portion of one selected from the group consisting of the first conductive line and the second conductive line of the same one outer ring portion which is cut off close to the base substrate 1. For example, as mentioned above, when a short circuit occurs at the position PA where the third data signal line D3 overlaps with the first conductive line R31 of the third outer ring portion R3 in FIG. 6A, the first conductive line R31 of the third outer ring R3 can be cut off at the position PA1 or the position PA2 in FIG. 6A. In this way, when the above-mentioned poor display such as a short circuit occurs in the sub-pixel, other conductive layers will not be damaged during the cutting process of cutting off one selected from the group consisting of the first conductive line and the second conductive line of the same one outer ring portion, thereby facilitating the cutting process, achieving the repairing of the sub-pixel, and improving the display quality. For other outer ring portions or inner ring portions, the processing method for implementing the repairing of the sub-pixel is similar to this and are not described one by one.

For example, one selected from the group consisting of the first conductive line and the second conductive line of the same one outer ring portion is cut off by laser irradiation to form a notch (not illustrated in figures).

At least one embodiment of the present disclosure further provides a display substrate, and the display substrate includes a base substrate and a display unit. The display unit is provided on the base substrate, and includes a display region and a non-light-emitting region; the display region includes a sub-pixel, and the sub-pixel includes a driving transistor and a light-emitting device; the driving transistor is configured to control magnitude of a driving current flowing through the light-emitting device, and includes a gate electrode, a first pole, and a second pole; the light-emitting device is configured to receive the driving current and be driven by the driving current to emit light, and includes a first electrode; the first electrode includes a first portion and a second portion that are spaced apart from each other, and the first portion and the second portion are connected to the first pole of the driving transistor, and respectively include a first sub-electrode layer and a second sub-electrode layer that are sequentially stacked in the direction perpendicular to the base substrate along a direction from close to the base substrate to away from the base substrate; the first sub-electrode layer of the first portion has a first edge close to the second portion, the second sub-electrode layer of the first portion has a second edge close to the second portion, and the first edge is located on a side of the second edge away from the second portion; the first sub-electrode layer of the second portion has a third edge close to the first portion, the second sub-electrode layer of the second portion has a fourth edge close to the first portion, and the third edge is located on a side of the fourth edge away from the first portion.

Figure 7:
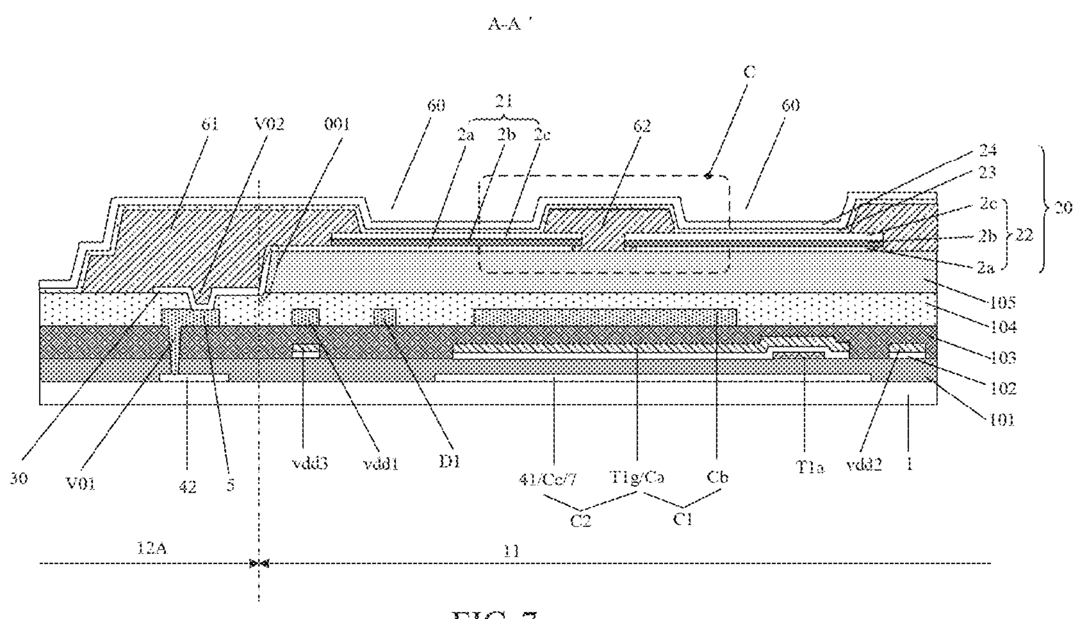
FIG. 7 is another schematic cross-sectional view taken along the line A-A' in FIG. 3B.
Figure 8A:
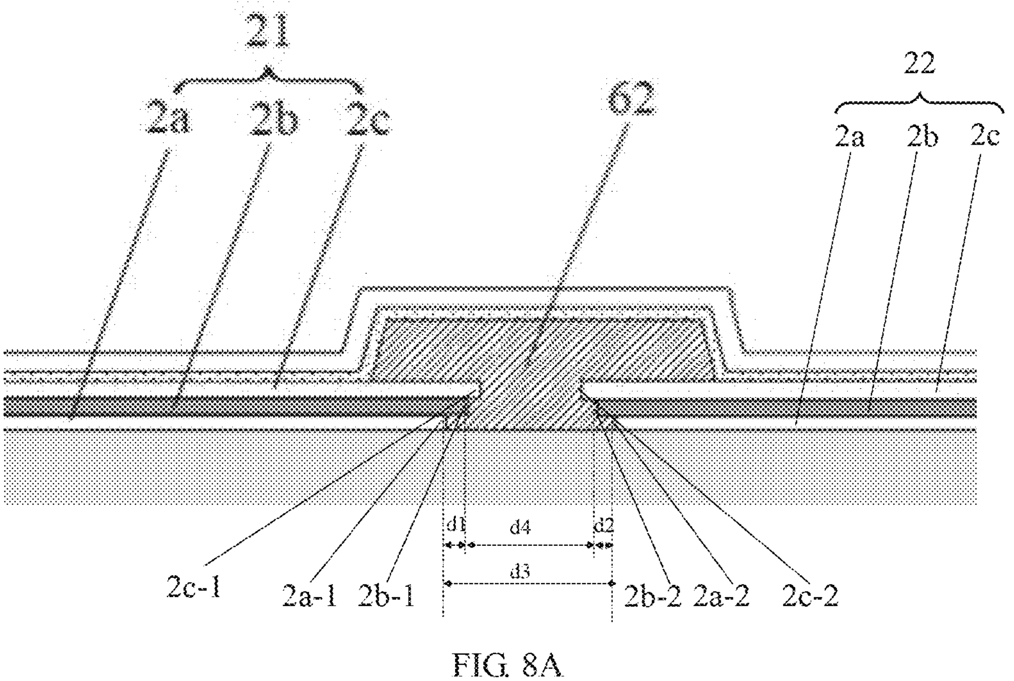
FIG. 8A is a schematic enlarged view of part C in FIG. 7.
Figure 8B:
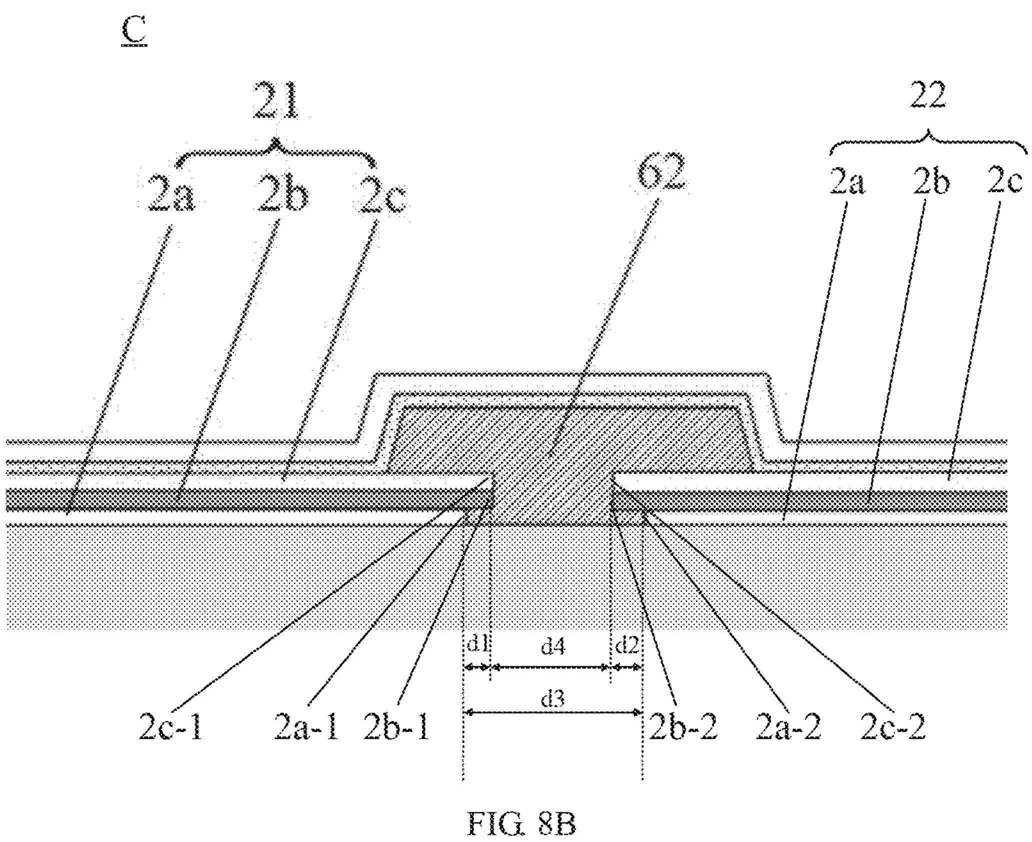
FIG. 8B is a schematic enlarged view of another display substrate provided by an embodiment of the present disclosure at a position of part C in FIG. 7.
Figure 9:
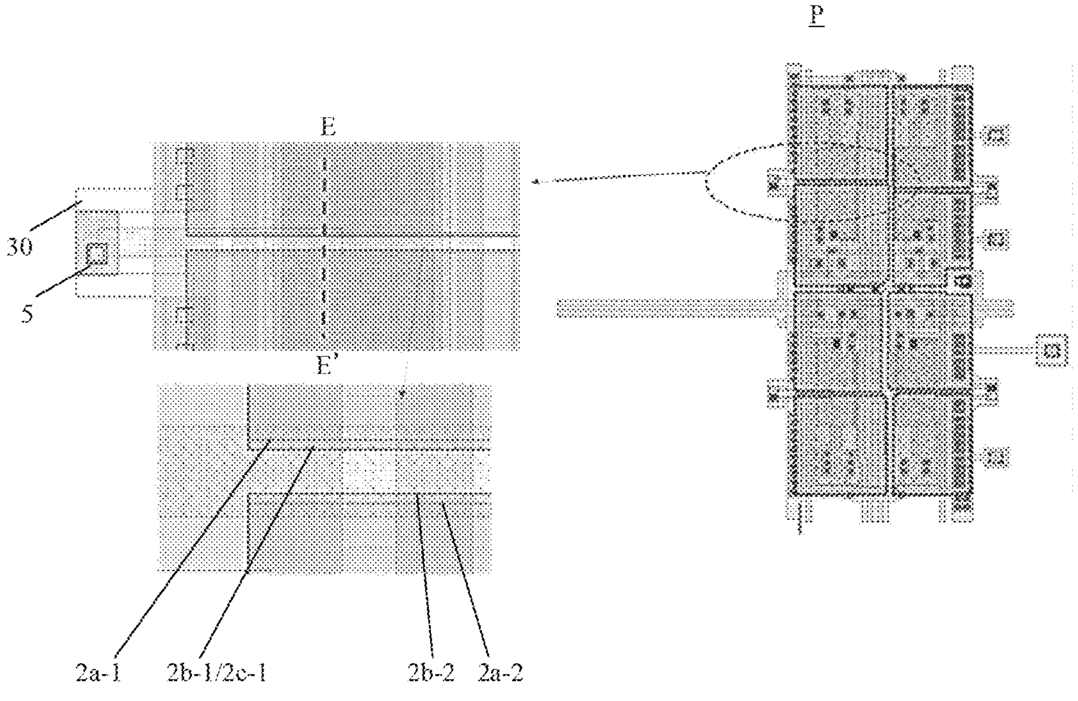
FIG. 9 is a schematic planar view of part C illustrated in FIG. 8A.

Exemplarily, FIG. 7 is another schematic cross-sectional view taken along the line A-A' in FIG. 3B, FIG. 8A is a schematic enlarged view of the part C in FIG. 7, and FIG. 9 is a schematic planar view of the part C illustrated in FIG. 8A. As illustrated in FIG. 7-FIG. 9, in the display substrate 10, the first electrode 2 includes a first portion 21 and a second portion 22 that are spaced from each other, the first portion 21 of the first electrode 2 and the second portion 22 of the first electrode 2 are connected to the first pole T1*s* of the driving transistor T1 (please refer to the description of FIG. 4A for the specific connection mode), and the first portion 21 of the first electrode 2 and the second portion 22 of the first electrode 2 respectively include a first sub-electrode layer 2*a* and a second sub-electrode layer 2*b* that are sequentially stacked in the direction perpendicular to the base substrate 1 and along the direction from a position close to the base substrate 1 to a position away from the base substrate 1. The first sub-electrode layer 2*a* of the first portion 21 of the first electrode 2 has a first edge 2*a*-1 close to the second portion 22 of the first electrode 2, the second sub-electrode layer 2*b* of the first portion 21 of the first electrode 2 has a second edge 2*b*-1 close to the second portion 22 of the first electrode 2, and the first edge 2*a*-1 is located on a side of the second edge 2*b*-1 away from the second portion 22 of the first electrode 2; the first sub-electrode layer 2*a* of the second portion 22 of the first electrode 2 has a third edge 2*a*-2 close to the first portion 21 of the first electrode 2, the second sub-electrode layer 2*b* of the second portion 22 of the first electrode 2 has a fourth edge 2*b*-2 close to the first portion 21 of the first electrode 2, and the third edge 2*a*-2 is located on a side of the fourth edge 2*b*-2 away from the first portion 21 of the first electrode 2. That is, in the display substrate, the edges of the first sub-electrode layer 2*a* of the first portion 21 of the first electrode 2 (such as an anode) and the first sub-electrode layer 2*a* of the second portion 22 of the first electrode 2 that are close to each other are respectively indented relative to the edges of the second sub-electrode layer of the first portion 21 and the second sub-electrode layer of the second portion 22 that are close to each other. In this way, after the first sub-electrode layer 2*a* of the first portion 21 and the first sub-electrode layer 2*a* of the second portion 22 are formed, when the second sub-electrode layer 2*b* of the first portion 21 and the second sub-electrode layer 2*b* of the second portion 22 are formed by a patterning process, the second sub-electrode layer 2*b* of the first portion 21 can be prevented from being in contact with the second sub-electrode layer 2*b* of the second portion 22 due to a too mall distance, the second sub-electrode layer 2*b* of the first portion 21 can be prevented from being in contact with the first sub-electrode layer 2*a* of the second portion 22, and the second sub-electrode layer 2*b* of the second portion 22 can be prevented from being in contact with the first sub-electrode layer 2*a* of the first portion 21, and the patterning difficulty is reduced, and the manufacturing yield of the display substrate is improved. If the design of the edges of the first portion 21 and the second portion 22 of the display substrate illustrated in FIG. 8A provided by the embodiment of the present disclosure is not adopted, the distance between the second sub-electrode layer 2*b* of the first portion 21 and the second sub-electrode layer 2*b* of the second portion 22 need to be enlarged, which will reduce the size of the opening region 60 of the pixel definition layer 6. Therefore, the design of the edges of the first portion 21 and the second portion 22 of the display substrate illustrated in FIG. 8A provided by the embodiment of the present disclosure can further increase the aperture ratio of the sub-pixel.

For example, in some embodiments, the orthographic projection of the first sub-electrode layer 2*a* of the first portion 21 of the first electrode 2 on the substrate 1 is located within the orthographic projection of the second sub-electrode layer 2*b* of the first portion 21 of the first electrode 2 on the substrate 1, and the area of the orthographic projection of the first sub-electrode layer 2*a* of the first portion 21 of the first electrode 2 on the base substrate 1 is smaller than the area of the orthographic projection of the second sub-electrode layer 2*b* of the first portion 21 of the first electrode 2 on the base substrate 1; and the orthographic projection of the first sub-electrode layer 2*a* of the second portion 22 of the first electrode 2 on the base substrate 1 is located within the orthographic projection of the second sub-electrode layer 2*b* of the second portion 22 of the first electrode 2 on the base substrate 1, and the area of the orthographic projection of the first sub-electrode layer 2*a* of the second portion 22 of the first electrode 2 on the base substrate is smaller than the area of the orthographic projection of the second sub-electrode layer 2*b* of the second portion 22 of the first electrode 2 on the base substrate 1, so as to further reduce the risk of contact between the sub-electrode layers spaced apart from each other in the above-mentioned ideal state.

For example, as illustrated in FIG. 7-FIG. 9, the first portion 21 of the first electrode 2 and the second portion 22 of the first electrode 2 further respectively include a third sub-electrode layer 2*c*, the third sub-electrode layer 2*c* of the first portion 21 of the first electrode 2 is stacked on the second sub-electrode layer 2*b* of the first portion 21 of the first electrode 2 in the direction perpendicular to the base substrate 1 and is located on a side of the second sub-electrode layer 2*b* of the first portion 21 of the first electrode 2 away the base substrate 1, and the third sub-electrode layer 2*c* of the second portion 22 of the first electrode 2 is stacked on the second sub-electrode layer 2*b* of the second portion 22 of the first electrode 2 in the direction perpendicular to the base substrate 1 and is located on a side of the second sub-electrode layer 2*b* of the second portion 22 of the first electrode 2 away the base substrate 1; the third sub-electrode layer 2*c* of the first portion 21 of the first electrode 2 has a fifth edge 2*c*-1 close to the second portion 22 of the first electrode 2, and the first edge 2*a*-1 is located on a side of the fifth edge 2*c*-1 away from the second portion 22 of the first electrode 2; and the third sub-electrode layer 2*c* of the second portion 22 of the first electrode 2 has a sixth edge 2*c*-2 close to the first portion 21 of the first electrode 2, and the third edge 2*a*-2 is located on a side of the sixth edge 2*c*-2 away from the first portion 21 of the first electrode 2. That is, the edge of the first sub-electrode layer 2*a* of the first portion 21 close to the second portion 22 is further indented relative to the edge of the third sub-electrode layer 2*c* of the first portion 21 close to the second portion 22, and the edge of the first sub-electrode layer 2*a* of the second portion 22 close to the first portion 21 is further indented relative to the edge of the third sub-electrode layer 2*c* of the second portion 22 close to the first portion 21, so as to prevent the third sub-electrode layer 2*c* of the first portion 21 from being in contact with the first sub-electrode layer 2*a* of the second portion 22, and prevent the third sub-electrode layer 2*c* of the second portion 22 from being in contact with the first sub-electrode layer 2*a* of the first portion 21. In addition, if the design of the display substrate as illustrated in FIG. 8A provided by the embodiment of the present disclosure, in which the first edge 2*a*-1 of is farther away from the second portion 22 than the fifth edge 2*c*-1, and the third edge 2*a*-2 is farther away from the first portion 21 than the sixth edge 2*c*-2, is not adopted, the distance between the third sub-electrode layer 2*c* of the first portion 21 and the third sub-electrode layer 2*c* of the second portion 22 needs to be enlarged, thus reducing the size of the opening region 60 of the pixel definition layer 6. Therefore, the design of the edges of the first portion 21 and the second portion 22 of the display substrate illustrated in FIG. 8A provided by the embodiment of the present disclosure further increases the aperture ratio of the sub-pixel.

For example, the orthographic projection of the first sub-electrode layer 2*a* of the first portion 21 of the first electrode 2 on the substrate 1 is located within the orthographic projection of the third sub-electrode layer 2*c* of the first portion 21 of the first electrode 2 on the substrate 1, and the area of the orthographic projection of the first sub-electrode layer 2*a* of the first portion 21 of the first electrode 2 on the base substrate 1 is smaller than the area of the orthographic projection of the third sub-electrode layer 2*c* of the first portion 21 of the first electrode 2 on the base substrate 1; and the orthographic projection of the first sub-electrode layer 2*a* of the second portion 22 of the first electrode 2 on the base substrate 1 is located within the orthographic projection of third second sub-electrode layer 2*c* of the second portion 22 of the first electrode 2 on the base substrate 1, and the area of the orthographic projection of the first sub-electrode layer 2*a* of the second portion 22 of the first electrode 2 on the base substrate is smaller than the area of the orthographic projection of the third sub-electrode layer 2*c* of the second portion 22 of the first electrode 2 on the base substrate 1, so as to further reduce the risk of contact between the sub-electrode layers spaced apart from each other in the above-mentioned ideal state.

For example, as illustrated in FIG. 8A, the second edge 2*b*-1 is indented relative to the fifth edge 2*c*-1, that is, the second edge 2*b*-1 is located on a side of the fifth edge 2*c*-1 away from the second portion 22; and the fourth edge 2*b*-2 is indented relative to the sixth edge 2*c*-2, that is, the fourth edge 2*b*-2 is located on a side of the sixth edge 2*c*-2 away from the first portion 21, so as to further reduce the risk of the second sub-electrode layer 2*b* of the first portion 21 being in contact with the second sub-electrode layer 2*b* of the second portion 22, further reduce the risk of the second sub-electrode layer 2*b* of the first portion 21 being in contact with first sub-electrode layer 2*a* of the second portion 22, further reduce the risk of the second sub-electrode layer 2*b* of the second portion 22 being in contact with first sub-electrode layer 2*a* of the first portion 21, and further reduce the risk of the third sub-electrode layer 2*c* of the second portion 22 being in contact with first sub-electrode layer 2*a* of the first portion 21. Other features and technical effects of FIG. 8B are the same as those of the embodiment illustrated in FIG. 8A.

For example, in the embodiment illustrated in FIG. 8B, the second sub-electrode layer 2*b* of the first portion 21, the third sub-electrode layer 2*c* of the first portion 21, the second sub-electrode layer 2*b* of the second portion 22 and the third sub-electrode layer 2*c* of the second portion are formed by the same patterning process using the same mask, for example, formed by an etching process such as a wet etching process to simplify the manufacturing process of the display substrate 10; and the material of the second sub-electrode layer 2*b* is different from the material of the third sub-electrode layer 2*c*, so that the second sub-electrode layer 2*b* and the third sub-electrode layer 2*c* have different etching rates, thereby obtaining the structure illustrated in FIG. 8B.

The patterning process in the present disclosure includes, for example, a photolithography process, and of course other patterning processes may also be used.

For example, the material of the first sub-electrode layer 2*a* of the first portion 21 and the material of the first sub-electrode layer 2*a* of the second portion 22 are respectively a transparent conductive material, the material of the second sub-electrode layer 2*b* of the first portion 21 and the material of the second sub-electrode layer 2*b* of the second portion 22 are respectively a metal material, and the material of the third sub-electrode layer 2*c* of the first portion 21 and the material of the third sub-electrode layer 2*c* of the second portion 22 are respectively a transparent conductive material. For example, the material of the second sub-electrode layer 2*b* may include gold (Au), silver (Ag), copper (Cu), aluminum (Al), molybdenum (Mo), magnesium (Mg), tungsten (W) and an alloy material combined with the above-mentioned metals. For example, the material of the first sub-electrode layer 2*a* and the material of the third sub-electrode layer 2*c* are respectively a conductive metal oxide material such as indium tin oxide (ITO), indium zinc oxide (IZO), zinc oxide (ZnO), zinc aluminum oxide (AZO), etc. Of course, the materials of the first sub-electrode layer 2*a*, the second sub-electrode layer 2*b* and the third sub-electrode layer 2*c* are not limited to the types listed above, and the embodiments of the present disclosure are not limited in this aspect.

For example, in the embodiment illustrated in FIG. 8A, the orthographic projection of the second sub-electrode layer 2*b* of the first portion 21 of the first electrode 2 on the base substrate 1 is located with the orthographic projection of the third sub-electrode layer 2*c* of the first portion 21 of the first electrode 2 on the base substrate 1, and the orthographic projection of the second sub-electrode layer 2*b* of the second portion 22 of the first electrode 2 on the base substrate 1 is located within the orthographic projection of the third sub-electrode layer 2*c* of the second portion 22 of the first electrode 2 on the base substrate 1. That is, each edge of the second sub-electrode layer 2*b* of the first portion 21 is indented into the corresponding edge of the third sub-electrode layer 2*c* of the first portion 21, and each edge of the second sub-electrode layer 2*b* of the second portion 22 is indented into the corresponding edge of the third sub-electrode layer 2*c* of the second portion 22.

For example, as illustrated in FIG. 8A, the first portion 21 of the first electrode 2 and the second portion 22 of the first electrode 2 are arranged in the longitudinal direction, the first edge 2*a*-1 is spaced apart from the second edge 2*b*-1 by a first distance d1 in the longitudinal direction, the third edge 2*a*-2 is spaced apart from the fourth edge 2*b*-2 by a second distance d2 in the longitudinal direction, and the first distance d1 is substantially equal to the second distance d2.

For example, the first portion 21 of the first electrode 2 and the second portion 22 of the first electrode 2 are arranged in the longitudinal direction, the first edge 2*a*-1 is spaced apart from the second edge 2*b*-1 by the first distance d1 in the longitudinal direction, and the third edge 2*a*-2 is spaced apart from the fourth edge 2*b*-2 by the second distance d2 in the longitudinal direction. The range of the first distance d1 is 1 μm-1.5 μm, and the range of the second distance d2 is 1 μm-1.5 μm, so as to effectively prevent the second sub-electrode layer 2*b* of the first portion 21 from being in contact with the second sub-electrode layer 2*b* of the second portion 22, prevent the second sub-electrode layer 2*b* of the first portion 21 from being in contact with the first sub-electrode layer 2*a* of the second portion 22, and prevent the second sub-electrode layer 2*b* of the second portion 22 from being in contact with the first sub-electrode layer 2*a* of the first portion 21.

For example, a third distance d3 between the first edge 2*a*-1 and the third edge 2*a*-2 is greater than a fourth distance d4 between the second edge 2*b*-1 and the fourth edge 2*b*-2. For example, the third distance d3 between the first edge 2*a*-1 and the third edge 2*a*-2 is not smaller than 6 μm, or the fourth distance d4 between the second edge 2*b*-1 and the fourth edge 2*b*-2 is not smaller than 4 μm, so as to effectively prevent the second sub-electrode layer 2*b* of the first portion 21 from being in contact with the second sub-electrode layer 2*b* of the second portion 22, prevent the second sub-electrode layer 2*b* of the first portion 21 from being in contact with the first sub-electrode layer 2*a* of the second portion 22, and prevent the second sub-electrode layer 2*b* of the second portion 22 from being in contact with the first sub-electrode layer 2*a* of the first portion 21, due to a too small distance.

Alternatively, in some other embodiments, as illustrated in FIG. 8B, the fifth edge 2*c*-1 is substantially flush with the second edge 2*b*-1, and the sixth edge 2*c*-2 is substantially flush with the fourth edge 2*b*-2, so that while reducing the risk of contact between the sub-electrode layers spaced apart from each other in the ideal state and reducing the manufacturing difficulty, the manufacturing difficulty of the display substrate 10 is also reduced. For example, the second sub-electrode layer 2*b* of the first portion 21, the third sub-electrode layer 2*c* of the first portion 21, the second sub-electrode layer 2*b* of the second portion 22 and the third sub-electrode layer 2*c* of the second portion 22 are formed by the same patterning process using the same mask to simplify the manufacturing process of the display substrate 10. For example, in the process of manufacturing the display substrate 10, after the first conductive layer 100, the first insulation layer 101, the semiconductor layer 600, the second insulation layer 102, the second conductive layer 200, the third insulation layer 103, the third conductive layer 300, the fourth insulation layer 104, and the fifth insulation layer 105 are stacked on the substrate 1, a first conductive material layer covering the fifth insulation layer 105 is formed, and a first mask is used to perform a first patterning process on the first conductive material layer to form the first sub-electrode layer 2*a* of the first portion 21 and the second sub-electrode layer 2*b* of the first portion 21; then, a second conductive material layer is formed to cover the first sub-electrode layer 2*a* of the first portion 21 and the second sub-electrode layer 2*b* of the first portion 21, a third conductive material layer is formed to be located on a side of the second conductive material layer away from the base substrate 1, and the third conductive material layer and the second conductive material layer are stacked in the direction perpendicular to the base substrate 1; then, a second mask is used to perform a second patterning process on the second conductive material layer and the third conductive material layer to form the second sub-electrode layer 2*b* of the first portion 21, the third sub-electrode layer 2*c* of the first portion 21, the second sub-electrode layer 2*b* of the second portion 22 and the third sub-electrode layer 2*c* of the second portion 22; in this way, the fifth edge 2*c*-1 is substantially flush with the second edge 2*b*-1, and the sixth edge 2*c*-2 is substantially flush with the fourth edge 2*b*-2, which simplifies the manufacturing process of the display substrate 10 and reduces the manufacturing difficulty of the display substrate 10.

It should be noted that the above-mentioned "substantially flush" is not limited to being absolutely flush. Because the materials for forming the first conductive material layer and the second conductive material layer of the second sub-electrode layer 2*b* and the third sub-electrode layer 2*c* are different, for example, there is a certain deviation distance between the fifth edge 2*c*-1 and the second edge 2*b*-1, and the case that the deviation distance falls within 5% of the size of the third sub-electrode layer 2*c* of the first portion 21 in this direction or falls within the 5% of the size of the second sub-electrode layer 2*b* of the first portion 21 in this direction can be understood that the fifth edge 2*c*-1 is substantially flush with the second edge 2b-1. Similarly, the same is true for the sixth edge 2c-2 being substantially flush with the fourth edge 2b-2.

For example, the orthographic projection of the second sub-electrode layer 2b of the first portion 21 of the first electrode 2 on the base substrate 1 substantially overlaps with the orthographic projection of the third sub-electrode layer 2c of the first portion 21 of the first electrode 2 on the base substrate 1, and the orthographic projection of the second sub-electrode layer 2b of the second portion 22 of the first electrode 2 on the base substrate 1 substantially overlaps with the orthographic projection of the third sub-electrode layer 2c of the second portion 22 of the first electrode 2 on the base substrate 1. Similar to the "substantially flush" mentioned above, the "substantially overlap" herein also refers to that if there is a deviation between two projections that substantially overlap with each other in a certain direction, the case that the deviation falls within 5% of the size of the second sub-electrode layer 2b of the first portion 21 in this direction can be understood that the orthographic projection of the second sub-electrode layer 2b of the first portion 21 of the first electrode 2 on the base substrate 1 substantially overlaps with the orthographic projection of the third sub-electrode layer 2c of the first portion 21 of the first electrode 2 on the base substrate 1. Similarly, the same is true for the case that the orthographic projection of the second sub-electrode layer 2b of the second portion 22 of the first electrode 2 on the base substrate 1 substantially overlaps with the orthographic projection of the third sub-electrode layer 2b of the second portion 22 of the first electrode 2 on the base substrate 1.

For example, in the display substrate provided by at least one embodiment of the present disclosure, orthographic projections of the channel regions of all transistors of the sub-pixel on the base substrate 1 are located within the orthographic projection of the first electrode 2 on the base substrate 1, and the channel regions of all the transistors of the sub-pixel are located on the side of the first electrode 2 close to the base substrate 1. For example, in each sub-pixel, orthographic projections of the channel region of the driving transistor T1, the channel region of the data transistor T2, and the channel region of the detection transistor T3 on the base substrate 1 are all located within the orthographic projection of the first electrode 2 on the base substrate 1, and the channel regions of the driving transistor T1, the data transistor T2 and the detecting transistor T3 are located on the side of the first electrode 2 close to the base substrate 1. In this way, the channel regions of all transistors of the sub-pixel are shielded from light by the first electrode 2, and the top light from the side of the channel region of the transistor away from the base substrate 1 is shielded by the first electrode 2.

The light-emitting device 20 further includes a light-emitting layer 23, the light-emitting layer 23 is located on the side of the first electrode 2 away from the substrate 1, the first electrode 2 is a reflective electrode, and the light emitted by the light-emitting layer 23 is emitted from the side of the first electrode 2 away from the base substrate 1.

For example, as illustrated in FIG. 3A-FIG. 3B, in the display substrate 10 provided by at least one embodiment, in each sub-pixel (such as P1-P4), the orthographic projection of the channel region of the driving transistor T1 on the base substrate 1 is located within the orthographic projection of the second portion 22 of the first electrode 2 on the base substrate 1; the orthographic projection of the channel region of the data writing transistor T2 on the base substrate 1 and the orthographic projection of the channel region of the detection transistor T3 on the base substrate 1 are both located within the orthographic projection of the first portion 21 of the first electrode 2 on the base substrate 1, so that in the case where the four sub-pixels P1-P4 of one display unit P are substantially symmetrical in the first direction D1 or the second direction D2 (most devices are symmetrical, and the whole is symmetrical, it is not necessary that each layer and each device are symmetrical), the first portion and the second portion of the first electrode of each sub-pixel are reasonably matched with the position of the channel region of each transistor of the corresponding sub-pixel, and reasonable space utilization and space arrangement are achieved to minimize the area of the display region, which is of great significance for the transparent display apparatus adopting the display substrate, and can take into account the area of the non-light-emitting region, while meeting the requirement of using the display region to display images, it can also better take into account the function of seeing through the environment image through the non-light-emitting region.

Figure 10:
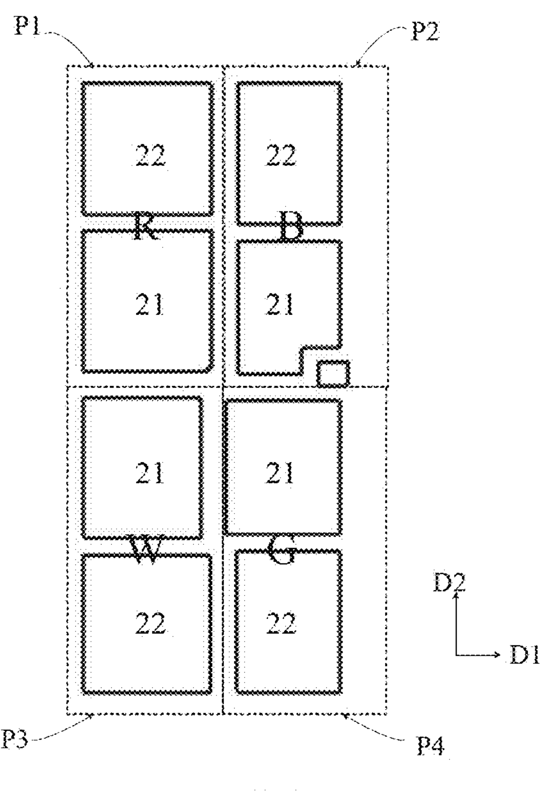
FIG. 10 is a schematic diagram of an arrangement of a plurality of sub-pixels of a display unit provided by an embodiment of the present disclosure.

FIG. 10 is a schematic diagram of an arrangement of a plurality of sub-pixels of a display unit P provided by an embodiment of the present disclosure. For example, as illustrated in FIG. 10, the length of a sub-pixel in the second direction D2 is greater than the width of the sub-pixel in the first direction D1, the first portion 21 of the first electrode 2 and the second portion 22 of the first electrode 2 are arranged in the second direction D2, and the area of the orthographic projection of the first sub-pixel P1 on the base substrate 1 and the area of the orthographic projection of the third sub-pixel P3 on the base substrate 1 are both larger than the area of the orthographic projection of the second sub-pixel P2 on the base substrate 1 and the area of the orthographic projection of the fourth sub-pixel P4 on the base substrate 1. In this way, the first sub-pixel P1 and the third sub-pixel P3 with a larger size are arranged along the length direction and are located in the same column of sub-pixels, so that the sub-pixels in the display region 11 can be reasonably arranged to prevent the display region 11 from occupying too much area, which will not affect the space of the non-light-emitting region 12. For example, the area of the orthographic projection of the first sub-pixel P1 on the base substrate 1 is greater than the area of the orthographic projection of the third sub-pixel P3 on the base substrate 1, the area of the orthographic projection of the second sub-pixel P2 on the base substrate 1 and the area of the orthographic projection of the fourth sub-pixel P4 on the base substrate 1, so that the larger sub-pixels are located in the same row, and it is easy to regularly arrange four sub-pixels in one display unit P using the limited area of the display region 11.

For example, the first sub-pixel P1 emits red (R) light, the second sub-pixel P2 emits blue (B) light, the third sub-pixel P3 emits white (W) light, and the fourth sub-pixel P4 emits green (G) light, so as to balance the life difference of light-emitting layers that emit different colors of light by ensuring sub-pixels of different area sizes correspond to the corresponding light-emitting colors.

At least one embodiment of the present disclosure further provides a display substrate, and the display substrate includes a base substrate and a display unit provided on the base substrate. The display unit includes a display region and a non-light-emitting region, the display region includes a sub-pixel, the sub-pixel includes a driving transistor and a light-emitting device, the driving transistor is configured to control magnitude of a driving current flowing through the light-emitting device, and the light-emitting device is configured to receive the driving current and be driven by the driving current to emit light; the light-emitting device includes a common electrode, and the common electrode is connected to a common voltage terminal. The display unit includes an auxiliary electrode line, a first auxiliary electrode, and an auxiliary insulation layer. The auxiliary electrode line includes a longitudinal portion located in the display region and a lateral portion at least partially located in the non-light-emitting region, and the lateral portion is connected to the longitudinal portion; the first auxiliary electrode is located in the non-light-emitting region and electrically connected to the common electrode; the auxiliary insulation layer includes a first auxiliary via hole which is located in the non-light-emitting region and exposes at least part of the lateral portion, and the first auxiliary electrode is connected to the lateral portion through the first auxiliary via hole; the lateral portion, the first auxiliary electrode, and the first auxiliary via hole constitute one auxiliary unit, and the display unit includes a plurality of the auxiliary units; the lateral portion of the auxiliary electrode line extends along a first direction, the longitudinal portion of the auxiliary electrode line extends along a second direction intersecting with the first direction, and the plurality of the auxiliary units are arranged at intervals in the second direction. In the display substrate, the resistance of the original common electrode is reduced by providing the first auxiliary electrode electrically connected with the common electrode in parallel in the non-light-emitting region.

Figure 11A:
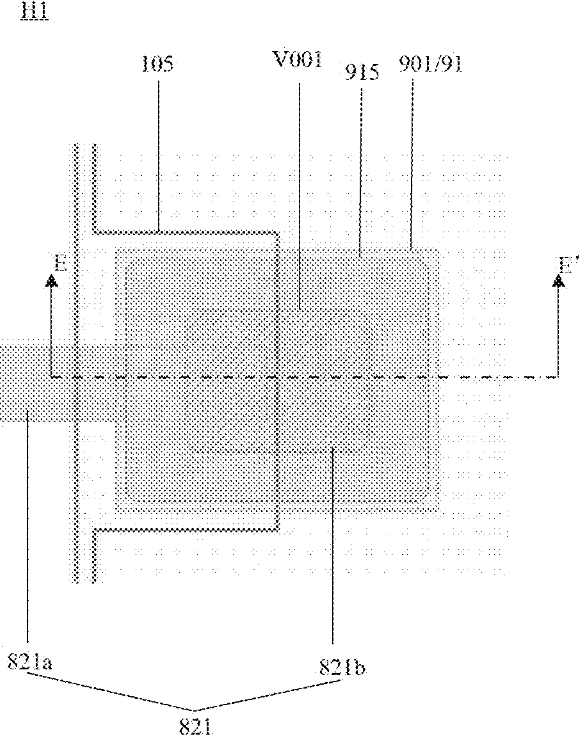
FIG. 11A is a schematic partial planar view of a first auxiliary unit H1 of the display unit illustrated in FIG. 3A.
Figure 11B:
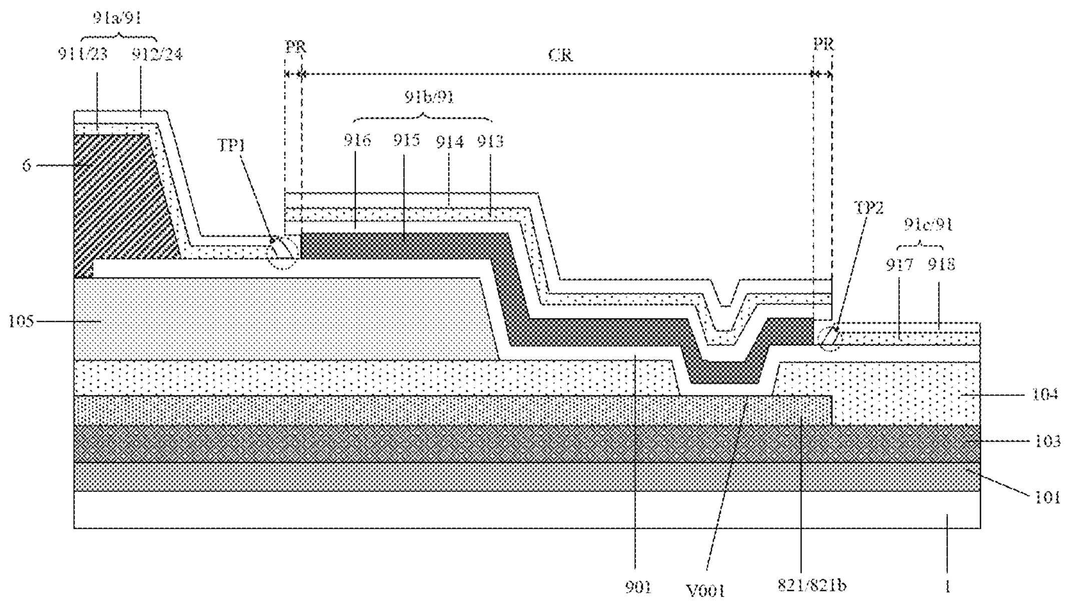
FIG. 11B is a schematic cross-sectional view taken along the line E-E' in FIG. 11A.

Exemplarily, FIG. 11A is a schematic partial planar view of a first auxiliary unit H1 of the display unit illustrated in FIG. 3A, and FIG. 11B is a schematic cross-sectional view taken along line E-E' in FIG. 11A. Referring to FIG. 3A and FIG. 11A-FIG. 11B, in the display substrate provided by at least one embodiment of the present disclosure, the light-emitting device 20 includes a common electrode, and the common electrode is connected to a common voltage terminal. The common electrode is, for example, a second electrode 24 (hereinafter referred to as the common electrode 24), for example, a common cathode. The display unit P includes an auxiliary electrode line 8, a first auxiliary electrode 91 and an auxiliary insulation layer 104. For example, the auxiliary electrode line 8 is located in the third conductive layer 300, therefore, FIG. 11A-11B and FIG. 5F can be combined. The auxiliary electrode line 8 includes a longitudinal portion 81 located in the display region 11 and a lateral portion 821 at least partially located in the non-light-emitting region 12, and the lateral portion 821 is connected to the longitudinal portion 81. For example, the lateral portion 821 and the longitudinal portion 81 constitute a continuous and integrated structure and are formed integrally. For example, the lateral portion 821 of the auxiliary electrode line 8 extends along the first direction D1, and the longitudinal portion 81 of the auxiliary electrode line 8 extends along the second direction D2 intersecting with the first direction D1. The first auxiliary electrode 91 is located in the non-light-emitting region 12 and is electrically connected to the common electrode 24; and the auxiliary insulation layer 104 includes a first auxiliary via hole V001 which is located in the non-light-emitting region 12 and exposes at least part of the lateral portion 821, and the first auxiliary electrode 91 is connected to the lateral portion 821 through the first auxiliary via hole V001. That is, the lateral portion 821 is connected to the common electrode 24 through the first auxiliary electrode 91 by utilizing the first auxiliary via hole V001. In this way, by providing the first auxiliary via hole V001 and the first auxiliary electrode 91 in the non-light-emitting region 12, and leading the lateral portion 821 from the display region 11 to the non-light-emitting region 12, the first auxiliary electrode 91 is electrically connected to the lateral portion 821 of the auxiliary electrode line 8 through the first auxiliary via hole V001 in the non-light-emitting region 12; and the first auxiliary electrode 91 is also electrically connected to the common electrode 24, so that the lateral portion 821 of the auxiliary electrode line 8 is electrically connected to the common electrode 24 in the non-light-emitting region 12, thereby adding the first auxiliary electrode 91 and the auxiliary electrode line 8 that are electrically connected to the common electrode 24 in parallel, so that the space of the display region 11 is not occupied while the resistance of the original common electrode is reduced, and the non-light-emitting region 12 with a sufficient space is fully utilized to arrange the first auxiliary electrode 91, the first auxiliary via hole V001 and the lateral portion 821 of the auxiliary electrode line 8.

For example, the auxiliary electrode line 8 here is the above-mentioned second power supply line vss. For the description of the display region 11 and the non-light-emitting region 12, please refer to the previous description.

For example, the auxiliary insulation layer 104 and the fourth insulation layer 104 are provided in the same layer and made of the same material, and are formed by performing the same one patterning process on the same film, and the same one patterning process is, for example, a photolithography process including an exposure process, a development process and other processes.

For example, the interlayer insulation layer 105 and the fifth insulation layer are provided in the same layer and made of the same material, and are formed by performing the same patterning process on the same film, and the same patterning process is, for example, a photolithography process including exposure, development and other processes.

For example, as illustrated in FIG. 11B, the first auxiliary electrode 91 includes a first sub-conductive layer 901, a first stacked portion 91*a* and a second stacked portion 91*b*. The first sub-conductive layer 901 is connected to the lateral portion 821 through the first auxiliary via hole V001; the first stacked portion 91*a* is electrically connected to the first sub-conductive layer 901 and stacked in the direction perpendicular to the base substrate 1, is located on a side of the first sub-conductive layer 901 away from the base substrate 1, and includes a first stacked layer 911 and a second stacked layer 912 that are stacked with each other in the direction perpendicular to the base substrate, and the second stacked layer 912 is located on a side of the first stacked layer 911 away from the base substrate 1 and is connected to the common electrode 24. The first stacked portion 91*a* is located at an end of the first auxiliary electrode 91 closest to the display region 11, and is directly connected to the structure in the display region 11; for example, the second stacked layer 912 is directly connected to the common electrode 24 without any other electrodes or structures between the two. The second stacked portion 91*b* is stacked on the first sub-conductive layer 901 in the direction perpendicular to the base substrate 1, is located on the side of the first sub-conductive layer 901 away from the base substrate 1, and is located on a side of the first stacked portion 91*a* away from the base substrate 1; the second stacked portion 91*b* is electrically connected to the first stacked portion 91*a* through the first sub-conductive layer 901, for example, the second stacked portion 91*b* is in direct contact with the first sub-conductive layer 901, and the second stacked portion 91*b* is in direct contact with the first stacked portion 91*a*; for example, the surface of the second stacked portion 91*b* and the surface of the first sub-conductive layer 901 are in direct contact with each other and are stacked in the direction perpendicular to the base substrate 1, and the surface of the second stacked portion 91*b* and the surface of the first stacked portion 91*a* are in direct contact with each other and are stacked in the direction perpendicular to the base substrate 1. Moreover, the second stacked portion 91*b* includes a third stacked layer 913 and a fourth stacked layer 914 that are stacked with each other in the direction perpendicular to the base substrate 1; the third stacked layer 913 and the first stacked layer 911 are made of the same material, provided in the same layer, and spaced apart from each other in the direction parallel to the base substrate 1, and the fourth stacked layer 914 and the second stacked layer 912 are made of the same material, provided in the same layer, and spaced apart from each other in the direction parallel to the base substrate.

For example, the third stacked layer 913 and the first stacked layer 911 are formed through the same one process. The same one process may be the same patterning process, and the patterning process includes, for example, using an evaporation mask to perform evaporation to form the third stacked layer 913 and the first stacked layer 911; or, the patterning process includes, for example, using a mask to perform exposure, development, etching, and other processes. Alternatively, for example, the same one process may not include a patterning process, but only include a deposition or evaporation process so that the third stacked layer 913 is naturally disconnected from the first stacked layer 911 (described below), thereby simplifying the manufacturing process of the display substrate.

Similarly, for example, the fourth stacked layer 914 and the second stacked layer 912 are formed through the same one process. The same one process may be the same one patterning process, and the patterning process includes, for example, using an evaporation mask to perform evaporation to form the fourth stacked layer 914 and the second stacked layer 912; or the patterning process includes, for example, using a mask to perform an exposure process, a development process, an etching process, and other processes. Alternatively, for example, the same one process may not include a patterning process, but only include a deposition or evaporation process so that the fourth stacked layer 914 is naturally disconnected from the second stacked layer 912 (described below), thereby simplifying the manufacturing process of the display substrate.

For example, as illustrated in FIG. 11B, the second stacked layer 912 is connected to the common electrode 24 and is in direct contact with the first sub-conductive layer 901; for example, the second stacked layer 912 is in contact with the first sub-conductive layer 901 in a first region TP1. For example, the first stacked layer 911 is in contact with the first sub-conductive layer 901; and the second stacked layer 912 includes an upper portion which covers an upper surface of the first stacked layer 911 away from the base substrate 1 and a side portion covers a side surface of the first stacked layer 911 intersecting with the upper surface of the first stacked layer 911, and the side portion is in contact with the first sub-conductive layer 901. That is, the first region TP1 is located at an edge of the second stacked layer 912 close to the second stacked portion 91*b*, the side portion of the second stacked layer 912 is also an edge portion (a portion of the second stacked layer 912 located in the first region TP1) of the second stacked layer 912 close to the second stacked portion 91*b*, and the edge portion of the second stacked layer 912 is in direct contact with the first sub-conductive layer 901.

For example, as illustrated in FIG. 11B, the second stacked layer 912 covers the upper surface of the first stacked layer 911 away from the base substrate 1 and covers the side surface the first stacked layer 911 which intersects with the upper surface of the first stacked layer 911, and the edge portion of the second stacked layer 912 close to the second stacked portion 91*b* at least covers the side surface of the first stacked layer 911, that is, covers an edge of the first stacked layer 911 close to the second stacked portion 91*b*, so that the edge portion of the second stacked layer 912 close to the second stacked portion 91*b* is capable of being in direct contact with the first sub-conductive layer 901.

For example, as illustrated in FIG. 11B, the second stacked portion 91*b* further includes a fifth stacked layer 915 and a sixth stacked layer 916. The fifth stacked layer 915 is located between the first sub-conductive layer 901 and the third stacked layer 913; the sixth stacked layer 916 is located between the fifth stacked layer 915 and the third stacked layer 913; the fifth stacked layer 915 and the sixth stacked layer 916 are stacked on the first sub-conductive layer 901, the third stacked layer 913, and the fourth stacked layer 914 in the direction perpendicular to the base substrate 1 and are electrically connected to each other, and the fifth stacked layer 915 and the sixth stacked layer 916 are both spaced apart from the first stacked layer 911 and the second stacked layer 912 in the direction parallel to the base substrate 1, that is, the third stacked layer 913, the fourth stacked layer 914, the fifth stacked layer 915, and the sixth stacked layer 916 are all spaced apart from the first stacked layer 911 and the second stacked layer 912 in the direction parallel to the base substrate 1. For example, the orthographic projection of the sixth stacked layer 916 on the base substrate 1 includes a middle region CR and an edge region PR surrounding the middle region CR, and the orthographic projection of the fifth stacked layer 915 on the base substrate 1 overlaps with the middle region CR, and does not overlap with the edge region PR. The orthographic projection of the first region TP1 on the base substrate 1 is at least partially within the orthographic projection of the edge region PR on the base substrate 1. In this way, a plurality of conductive layers are stacked to constitute the second stacked portion 91*b*, which is beneficial to better reduce the resistance of the original common electrode. For example, referring to FIG. 4A, the light-emitting device 20 includes the above-mentioned first electrode 2 and the light-emitting layer 23 that are located in the display region 11, the light-emitting layer 23 is sandwiched between the first electrode 2 and the common electrode 24, and the first electrode 2 includes a first sub-electrode layer 2*a*, a second sub-electrode layer 2*b* and a third sub-electrode layer 2*c* sequentially stacked in the direction perpendicular to the base substrate 1 and along a direction close to the base substrate 1 to away from the base substrate 1. For example, the first sub-conductive layer 901 of the first auxiliary electrode 91 and the first sub-electrode layer 2*a* are made of the same material and provided in the same layer; the first stacked layer 911 and the light-emitting layer 23 are made of the same material, are provided in the same layer, and constitute a continuous and integrated structure; the second stacked layer 912 and the common electrode 24 are made of the same material, are provided in the same layer, and constitutes a continuous and integrated structure; the third stacked layer 913 and the light-emitting layer 23 are made of the same material and provided in the same layer; the fourth stacked layer 914, the second stacked layer 912 and the common electrode 24 are made of the same material and provided in the same layer; the fifth stacked layer 915 and the second sub-electrode layer 2*b* are made of the same material and provided in the same layer; and the sixth stacked layer 916 and the third sub-electrode layer 2*c* are made of the same material and provided in the same layer. In this way, the first sub-conductive layer 901 and the first sub-electrode layer 2*a* of the first auxiliary electrode 91 can be formed through the same one process, the first stacked layer 911, the light-emitting layer 23, and the third stacked layer 913 can be formed through the same one process, the fourth stacked layer 914, the second stacked layer 912, and the common electrode 24 can be formed through the same one process, the fifth stacked layer 915 and the second sub-electrode layer 2*b* can be formed through the same one process, and the sixth stacked layer 916 and the third sub-electrode layer 2*c* can be formed through the same one process. The "same one process" here can be referred to the above-mentioned explanation. In this way, each layer structure of the first auxiliary electrode 91 can be formed using the processes corresponding to the above-mentioned various functional layers in the display region 11, without additional film manufacturing processes or patterning processes for providing the first auxiliary electrode 91.

For example, in the process of manufacturing the display substrate as illustrated in FIG. 11B, the fifth stacked layer 915 and the sixth stacked layer 916 are formed through the same patterning process using the same mask, for example, formed using an etching process such as a wet etching process to simplify the manufacturing process of the display substrate; moreover, because the materials of the fifth stacked layer 915 and the sixth stacked layer 916 are different, the material of the fifth stacked layer 915 and the material of the sixth stacked layer 916 are respectively the same as the material of the second sub-electrode layer 2*b* and the material of the third sub-electrode layer 2*c*, and reference can be made to the previous description of the material of the second sub-electrode layer 2*b* and the material of the third sub-electrode layer 2*c*, so that the fifth stacked layer 915 and the sixth stacked layer 916 have different etching rates, and the fifth stacked layer 915 shrinks inward relative to the sixth stacked layer 916 as illustrated in FIG. 11B, that is, the orthographic projection of the fifth stacked layer 915 on the base substrate 1 overlaps with the middle region CR and does not overlap with the edge region PR. After forming the fifth stacked layer 915 and the sixth stacked layer 916, the steps of forming the first stacked layer 911, the light-emitting layer 23, the third stacked layer 913, the fourth stacked layer 914 and the second stacked layer 912 are sequentially performed.

In the process of forming the first stacked layer 911, the light-emitting layer 23, and the third stacked layer 913 on a side of the sixth stacked layer 916 away from the base substrate 1, for example, the first stacked layer 911, the light-emitting layer 23 and the third stacked layer 913 are formed by an evaporation process, and the first stacked layer 911 and the light-emitting layer 23 may be formed into an integrated structure. Due to the existence of the fifth stacked layer 915 and the sixth stacked layer 916, the fifth stacked layer 915 and the sixth stacked layer 916 have a certain thickness so that there is a segment difference between the upper surface of the sixth stacked layer 916 away from the base substrate 1 and the upper surface of the first sub-conductive layer 901 away from the base substrate 1, and the third stacked layer 913 and the first stacked layer 911 can be disconnected from each other due to the segment difference. Moreover, there is a segment difference between the upper surface of the third stacked layer 913 away from the base substrate 1 and the upper surface of the first stacked layer 911 away from the base substrate 1.

Next, in the process of forming the fourth stacked layer 914, the second stacked layer 912, and the common electrode 24, for example, the fourth stacked layer 914, the second stacked layer 912 and the common electrode 24 are formed by a deposition process, and the second stacked layer 912 and the common electrode 24 may be formed into an integrated structure. Due to the segment difference between the upper surface of the third stacked layer 913 away from the base substrate 1 and the upper surface of the first stacked layer 911 away from the base substrate 1, the fourth stacked layer 914 and the second stacked layer 912 can be disconnected from each other; moreover, because the fifth stacked layer 915 shrinks inward relative to the sixth stacked layer 916, that is, the orthographic projection of the fifth stacked layer 915 on the base substrate 1 overlaps with the middle region CR, and does not overlap with the edge region PR, therefore, the second stacked layer 912 is in contact with the first sub-conductive layer 901 in the first region TP1, and the orthographic projection of the first region TP1 on the base substrate 1 is at least partially located within the orthographic projection of the edge region PR on the base substrate 1.

In this way, the common electrode 24 can be connected to the first sub-conductive layer 901, so that the first auxiliary electrode 91 can be electrically connected in parallel with the common electrode 24 to reduce the resistance of the original common electrode 24.

For example, the sum of the thickness of the fifth stacked layer 915 in the direction perpendicular to the base substrate 1 and the thickness of the sixth stacked layer 916 in the direction perpendicular to the base substrate 1 is greater than or equal to 6000 angstroms, so that the fifth stacked layer 915 has enough thickness to form a sufficient segment difference between the upper surface of the sixth stacked layer 916 away from the base substrate 1 and the upper surface of the first sub-conductive layer 901 away from the base substrate 1 to further ensure the reliability of that the third stacked layer 913 and the first stacked layer 911 can be disconnected from each other due to the segment difference, and the reliability of that the fourth stacked layer 914 and the second stacked layer 912 can be disconnected from each other.

For example, as illustrated in FIG. 11B, the first auxiliary electrode 91 further includes a third stacked portion 91*c*. The third stacked portion 91*c* is stacked on the first sub-conductive layer 901 in the direction perpendicular to the base substrate 1, is located on the side of the first sub-conductive layer 901 away from the base substrate 1, is electrically connected to the first stacked portion 91*a* and the second stacked portion 91*b* through the first sub-conductive layer 901, and includes a seventh stacked layer 917 and an eighth stacked layer 918 stacked with each other in the direction perpendicular to the base substrate 1, the seventh stacked layer 917 and the third stacked layer 913 are provided in the same layer and are spaced apart from each other in the direction parallel to the base substrate 1, and the eighth stacked layer 918 and the fourth stacked layer 914 are provided in the same layer and are spaced from each other in the direction parallel to the base substrate 1.

For example, the eighth stacked layer 918 is in direct contact with the first sub-conductive layer 901. For example, the eighth stacked layer 918 is in direct contact with the first sub-conductive layer 901 in a second region TP2, and the orthographic projection of the second region TP2 on the base substrate 1 is at least partially within the orthographic projection of the edge region PR on the base substrate 1. Similar to the case of the first region TP1, the eighth stacked layer 918 covers the upper surface of the seventh stacked layer 917 away from the base substrate 1 and the side surface of the seventh stacked layer 917 intersecting with the upper surface of the seventh stacked layer 917, and the edge portion of the eighth stacked layer 918 close to the second stacked portion 91*b* at least covers the side surface of the seventh stacked layer 917, that is, covers an edge of the seventh stacked layer 917 close to the second stacked portion 91*b*, so that the edge portion of the eighth stacked layer 918 close to the second stacked portion 91*b* is capable of being in direct contact with the first sub-conductive layer 901.

For example, the seventh stacked layer 917, the third stacked layer 913 and the light-emitting layer 23 are made of the same material and provided in the same layer, and the eighth stacked layer 918, the fourth stacked layer 914 and the second stacked layer 912 are made of the same material and provided in the same layer. In this way, the seventh stacked layer 917, the third stacked layer 913 and the light-emitting layer 23 can be formed through the same one process, and the eighth stacked layer 918 and the fourth stacked layer 914 can be formed through the same one process. The "same one process" here refers to the above-mentioned explanation. Similar to the case of forming the structure in the first region TP1, in the process of forming the seventh stacked layer 917, the third stacked layer 913, and the light-emitting layer 23 using the same one process, the segment difference formed by the fifth stacked layer 915 and the sixth stacked layer 916 can make the seventh stacked layer 917 to be disconnected to the third stacked layer 913, and in the process of forming the eighth stacked layer 918, the fourth stacked layer 914 and the second stacked layer 912 using the same one process, the eighth stacked layer 918 is disconnected to the fourth stacked layer 914.

Figure 11C:
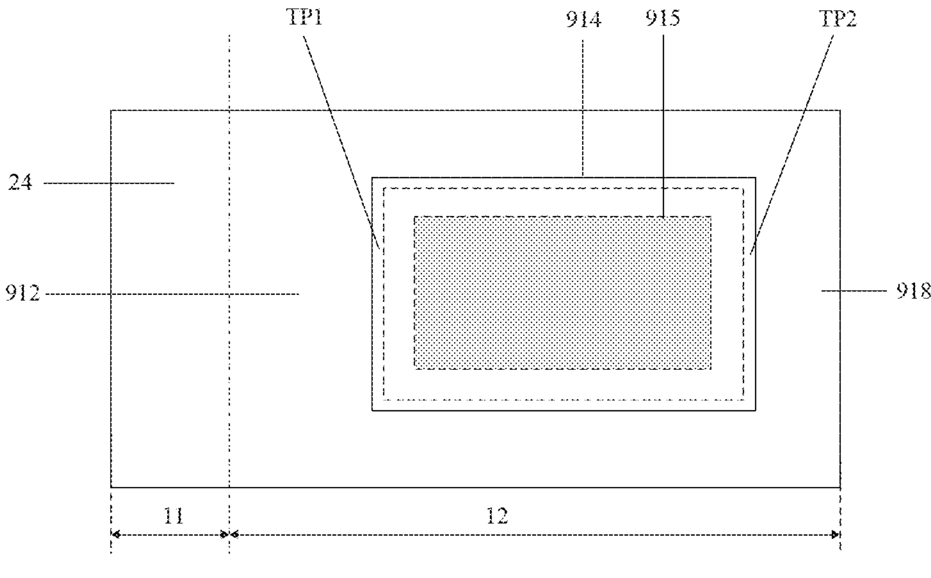
FIG. 11C is a schematic planar view expressing a positional relationship of a second stacked layer, a fourth stacked layer, a fifth stacked layer and an eighth stacked layer in FIG. 11B.

FIG. 11C is a schematic planar view expressing a positional relationship of the second stacked layer, the fourth stacked layer, the fifth stacked layer and the eighth stacked layer in FIG. 11B. Referring to FIG. 11B and FIG. 11C, for example, the second stacked layer 912 and the eighth stacked layer 918 constitute a continuous and integrated structure, and the continuous and integrated structure includes an edge portion surrounding the second stacked portion 91*b*, and the edge portion is in direct contact with the first sub-conductive layer 901, that is, the first sub-conductive layer 901 is in direct contact with the continuous and integrated structure formed by the second stacked layer 912 and the eighth stacked layer 918 in a peripheral region surrounding the whole second stacked portion 91*b*, so that the first sub-conductive layer 901 is connected to the continuous and integrated structure by the second stacked layer 912 and the eighth stacked layer 918 at a plurality of positions, thereby ensuring the reliability of that the first sub-conductive layer 901 is electrically connected to the common electrode 24. The first region TP1 and the second region TP2 are respectively two portions of the peripheral region located on two opposite sides of the second stacked portion 91*b*, and two positions of the first region TP1 and the second region TP2 are taken as an example in FIG. 11B to introduce how the first sub-conductive layer 901 is electrically connected to the common electrode 24.

For example, as illustrated in FIG. 11A and FIG. 11B, the interlayer insulation layer 105 of the display substrate is located on the side of the auxiliary insulation layer 104 away from the base substrate 1, an edge of the interlayer insulation layer 105 is located in the non-light-emitting region 12, and a portion of the first sub-conductive layer 901 covers the interlayer insulation layer 105; the first region TP1 is located within the orthographic projection of the interlayer insulation layer 105 on the base substrate 1, that is, the edge portion of the second stacked layer 912 is in contact with the first sub-conductive layer 901 on the interlayer insulation layer 105 to reduce the segment difference between the second stacked layer 912 (which forms a continuous and integrated structure with the common electrode 24) and the first sub-conductive layer 901 on the pixel definition layer 6 in the direction perpendicular to the base substrate 1 by using the thickness of the interlayer insulation layer 105, and to prevent the second stacked layer 912 from being broken, thereby ensuring the reliability of the connection between the second stacked layer 912 and the first sub-conductive layer 901 in the first region TP1.

For example, as illustrated in FIG. 11B, the second region TP2 is located on a side of the orthographic projection of the interlayer insulation layer 105 on the base substrate 1 away from the display region 11. Due to the transition of layers such as the fifth stacked layer 915, the segment difference between the first sub-conductive layer 901 and the eighth stacked layer 918 is reduced, and there is no need to allow the thicker interlayer insulation layer 105 to extend to the first auxiliary via hole V001, thereby preventing the thicker interlayer insulation layer 105 from affecting the connection of each layer at the first auxiliary via V001.

For example, the lateral portion 821, the first auxiliary electrode 91 and the first auxiliary via hole V001 illustrated in FIG. 11B constitute an auxiliary unit, and the display unit P includes a plurality of auxiliary units. The plurality of auxiliary units are arranged at intervals in the second direction D2.

For example, the plurality of auxiliary units arranged at intervals in the second direction D2 are all located in the non-light-emitting region 12, and have the same or different distances from the display region 11 in the first direction D1.

For example, the plurality of auxiliary units include a first auxiliary unit H1 and a second auxiliary unit H2, the specific structures of the first auxiliary unit H1 and the second auxiliary unit H2 are similar, the first auxiliary unit H1 and the second auxiliary unit H2 are both auxiliary units as illustrated in FIG. 11B above, but specific positions of the first auxiliary unit H1 and the second auxiliary unit H2 are different.

For example, as illustrated in FIG. 3A, the plurality of auxiliary units include a first auxiliary unit H1 and a second auxiliary unit H2, both the first auxiliary unit H1 and the second auxiliary unit H2 are in the non-light-emitting region 12, and the first auxiliary unit H1 and the second auxiliary unit H2 have different distances from the display region 11 in the first direction D1.

Figure 12A:
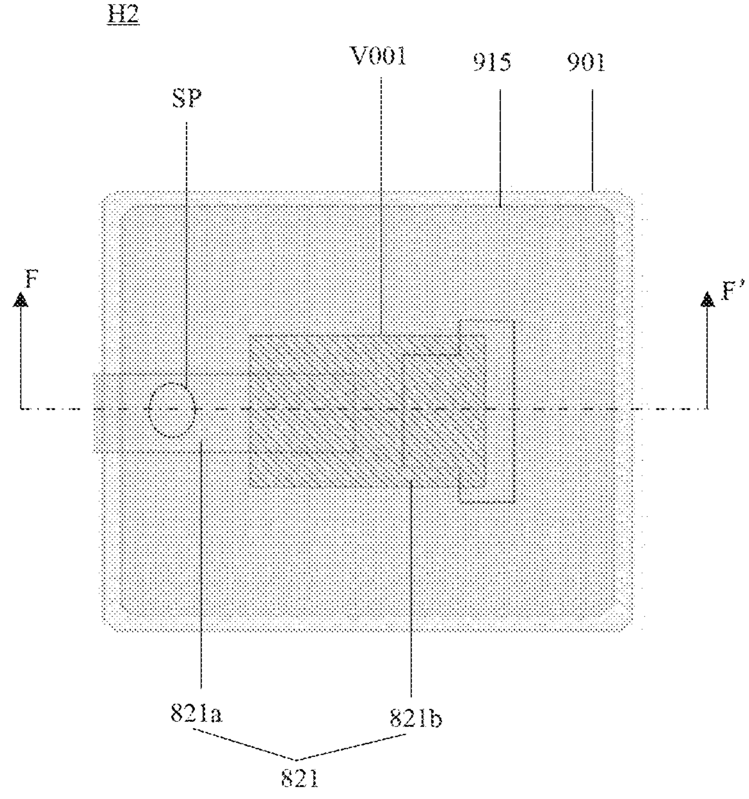
FIG. 12A is a schematic partial planar view of a second auxiliary unit H2 of the display unit illustrated in FIG. 3A.
Figure 12B:
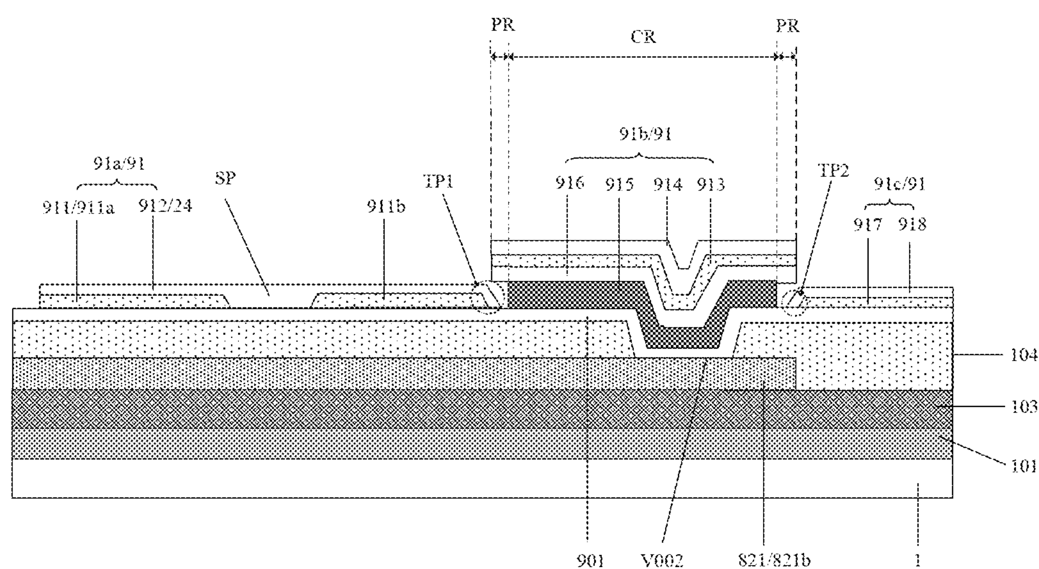
FIG. 12B is a schematic cross-sectional view taken along the line F-F' in FIG. 12A.

FIG. 12A is a schematic partial planar view of the second auxiliary unit H2 of the display unit illustrated in FIG. 3A, and FIG. 12B is a schematic cross-sectional view taken along line F-F' in FIG. 12A.

The second auxiliary unit H2 is different from the first auxiliary unit H1 as follows. As illustrated in FIG. 12A and FIG. 12B, the distance between a first auxiliary via hole V002 of the second auxiliary unit H2 and the display region 11 in the first direction D1 is greater than the distance between a first auxiliary via hole V001 of the first auxiliary unit H1 and the display region 11 in the first direction D1, that is, referring to FIG. 3A, FIG. 12A and FIG. 12B, the distance between an edge of the first auxiliary via hole V002 of the second auxiliary unit H2 close to the display region 11 and an edge of the second power supply line vss close to non-light-emitting region 12B is greater than the distance between an edge of the first auxiliary via hole V001 of the first auxiliary unit H1 close to the display region 11 and the edge of the second power supply line vss close to the non-light-emitting region 12B. Therefore, the second auxiliary unit H2 and the first auxiliary unit H1 are staggered in the second direction D2, which is beneficial to the utilize of limited space, especially in the case where the area of each display unit is smaller in a high PPI (Pixels Per Inch) display substrate and it is necessary to utilize a limited area to arrange a plurality of auxiliary units, ensuring the second auxiliary unit H2 and the first auxiliary unit H1 staggered in the second direction D2 can make the plurality of auxiliary units better adapt to the arrangement of the lines nearby.

For example, referring to FIG. 5G and FIG. 12A, the planar shape of the first auxiliary via hole V002 of the second auxiliary unit H2 is a trapezoid, so as to increase the contact area between the first sub-conductive layer 901 and the lateral portion 821. Of course, the planar shape of the first auxiliary via hole V002 may also be circular, rectangular, etc.

For example, as illustrated in FIG. 12A and FIG. 12B, the length of the lateral portion 821 of the second auxiliary unit H2 in the first direction D1 is greater than the length of the lateral portion 821 of the first auxiliary unit H1 in the first direction D1, so as to achieve that the via hole of the second auxiliary unit H2 is provided farther away from the display region 22.

For example, one display unit P includes at least three first auxiliary units H1, the amount of the second auxiliary unit H2 is greater than or equal to one, and in the second direction D2, at least one second auxiliary unit H2 is located between the at least three first auxiliary units H1. For example, as illustrated in FIG. 3A, one display unit P includes three first auxiliary units H1 and one second auxiliary unit H2, and the one second auxiliary unit H2 is located between the three first auxiliary units H1. Of course, in other embodiments, the amount of the first auxiliary unit H1 and the second auxiliary unit H2 in each display unit can also be designed according to the size of the display substrate and the requirement to reduce the resistance of the original common electrode. The present disclosure does not limit the amount of the first auxiliary unit H1 and the second auxiliary unit H2.

Table 1 below is a table of the relationship between one auxiliary unit and the voltage drop of the common electrode, and Table 1 illustrates the influence of providing one auxiliary unit on the voltage drop of the common electrode.

TABLE 1 the relationship between one auxiliary unit and voltage drop of the common electrode

| | resistance of one auxiliary unit/Ω | | | | |
|---|---|---|---|---|---|
| | 2000 | 20000 | 200000 | 4000000 | 17500000 |
| voltage drop of common electrode/V | 1.336 | 1.427 | 2.338 | 3.029 | 8.339 |

For example, as illustrated in FIG. 12B, the first stacked layer 911 of the first stacked portion 91*a* of the second auxiliary unit H2 includes an intermediate via hole SP, and the second stacked layer 912 of the first stacked portion 91*a* is electrically connected to the first sub-conductive layer 901 of the second auxiliary unit H2 through the intermediate via hole SP. That is, as illustrated in FIG. 12B, the first stacked layer 911 of the first stacked portion 91*a* of the second auxiliary unit H2 includes a first portion 911*a* close to the display region 11 and a second portion 911*b* away from the display region 11, and the intermediate via hole SP exposing the first sub-conductive layer 901 of the second auxiliary unit H2 is between the first portion 911*a* of the first stacked layer 911 and the second portion 911*b* of the first stacked layer 911 to ensure that the first portion 911*a* of the first stacked layer 911 is at least partially disconnected to the second portion 911*b* of the first stacked layer 911; the second stacked layer 912 is electrically connected to the first sub-conductive layer 901 of the second auxiliary unit H2 through the intermediate via hole SP, thereby further increasing the contact area between the first sub-conductive layer 901 and the second stacked layer 912; in addition to achieving the electrical connection between the common electrode 24 and the first sub-conductive layer 901 in the first region TP1 and the second region TP2, the electrical connection between the common electrode 24 and the first sub-conductive layer 901 is also achieved through the intermediate via hole SP, thereby further ensuring the reliability of the electrical connection between the common electrode 24 and the first sub-conductive layer 901, and ensuring that the first auxiliary electrode 91 of the second auxiliary unit H2 is electrically connected in parallel with the common electrode 24 to reduce the resistance of the original common electrode 24. In addition, because the distance between the first auxiliary via hole V002 of the second auxiliary unit H2 and the display region 11 in the first direction D1 is greater than the distance between the first auxiliary via hole V001 of the first auxiliary unit H1 and the display region 11 in the first direction D1, and the length of the lateral portion 821 of the second auxiliary unit H2 in the first direction D1 is greater than the length of the lateral portion 821 of the first auxiliary unit H1 in the first direction D1, therefore, the above-mentioned design provides sufficient space for providing the intermediate via hole SP.

For example, the intermediate via hole SP in FIG. 12B can be formed by laser drilling, that is, the first stacked layer 911 is punctured by laser, thereby exposing the first sub-conductive layer 901, and the first auxiliary via hole V002 of the second auxiliary unit H2 is far from the display region 11 in the first direction D1, which provides sufficient space for performing the laser drilling to avoid damaging other structures near the intermediate via hole SP due to too dense wiring.

For example, the distance from the first auxiliary via hole V002 of the second auxiliary unit H2 to the display region 11 in the first direction D1 is at least twice the distance from the first auxiliary via hole V001 of the first auxiliary unit H1 to the display region 11 in the first direction D1, to provide sufficient space for providing the intermediate via hole SP, provide sufficient space for laser drilling, and avoid damaging other structures near the intermediate via hole SP due to too dense wiring.

Other structures of the second auxiliary unit H2 illustrated in FIG. 12B, such as the second stacked layer 912 connected to the common electrode 24, the first stacked layer 911, the third stacked layer 913, . . . , the eighth stacked layer 918, etc. are all the same as that illustrated in FIG. 11B, reference may be made to the description in FIG. 11B, and are not repeated here.

For example, the area of the planar shape of the first auxiliary via hole V001 of the second auxiliary unit H2 is larger than the area of the planar shape of the first auxiliary via hole V001 of the first auxiliary unit H1, that is, the area of the orthographic projection of the first auxiliary via hole V001 of the second auxiliary unit H2 on the base substrate 1 is larger than the area of the orthographic projection of the first auxiliary via hole V001 of the first auxiliary unit H1 on the base substrate 1. Because the second auxiliary unit H2 is farther away from the display region 11, and the lateral portion 821 of the second auxiliary unit is longer and thus lateral portion 821 has a larger resistance. Therefore, the area of the first auxiliary via hole V001 of the second auxiliary unit H2 is larger, to reduce the resistance of the whole structure formed by connecting the first auxiliary electrode 91 to the lateral portion 821 through the first auxiliary via hole V001 of the second auxiliary unit H2, thereby reducing the resistance of the whole second auxiliary unit H2.

For example, one display unit P includes at least two first auxiliary units H1, and the amount of the second auxiliary unit H2 is greater than or equal to one, so as to reduce the resistance of the original common electrode more effectively. For example, one display unit P includes at least three first auxiliary units H1, and in the second direction D2, at least one second auxiliary unit H2 is located between any two first auxiliary units of the at least three first auxiliary units H1, so as to reasonably arrange the positions of auxiliary units with different distances from the display region 11 in one display unit P, make full use of the limited space, and in addition, reduce the resistance of the original common electrode more effectively.

For example, referring to FIG. 3A, in one display unit P, the at least two first auxiliary units H1 include the No. 1 first auxiliary unit H1, the No. 2 first auxiliary unit H1, and the No. 3 first auxiliary unit H1; the No. 1 auxiliary unit H1 and the No. 2 first auxiliary unit H1 are located in the second sub-pixel P2, and the No. 3 auxiliary unit H1 and the second auxiliary unit H2 are located in the fourth sub-pixel P4. In this way, the auxiliary units are laid out along the whole display unit P in the second direction D2, the resistance of the original common electrode is reduced in a relatively balanced manner at each position, and the display uniformity of the display substrate is improved.

For example, as illustrated in FIG. 3A, the No. 1 first auxiliary unit H1 and the No. 2 first auxiliary unit H1 are respectively located on two opposite sides of the connection portion 30 of the second sub-pixel P2 in the second direction D2, and the No. 3 first auxiliary unit H1 and the second auxiliary unit H2 are respectively located on two opposite sides of the connection portion 30 of the fourth sub-pixel P4 in the second direction D2 to coordinate with the position of the connection portion 30, and make full use of the blank region at the opposite sides of the connection portion 30 in the second direction D2 to provide the first auxiliary unit H1 as much as possible.

For example, as illustrated in FIG. 3A, in the second direction D2, the second auxiliary unit H2 is located on a side of the connection portion 30 of the fourth sub-pixel P4 close to the junction of the fourth sub-pixel P4 and the second sub-pixel P2; alternatively, in other embodiments, the second auxiliary unit H2 may also be located on a side of the connection portion 30 of the fourth sub-pixel P4 away from the junction of the fourth sub-pixel P4 and the second sub-pixel P2.

For example, referring to FIG. 11B, FIG. 3A, FIG. 3C, and FIG. 4A, the area of the planar shape of the first auxiliary via hole V001 of the first auxiliary unit H1 is larger than the area of the planar shape of the first via hole V0. Because the structure provided in the first auxiliary via hole V001 of the first auxiliary unit H1 is relatively complicated and is used to reduce the resistance of the original common electrode, the area of the first auxiliary via hole V001 of the first auxiliary unit H1 is larger than the area of an ordinary via hole such as the first via hole V0, which is beneficial to fully ensuring the reliability of the connection between the first auxiliary electrode 91 and the lateral portion 821 through the first auxiliary via hole V001 of the second auxiliary unit H2.

Figure 13A:
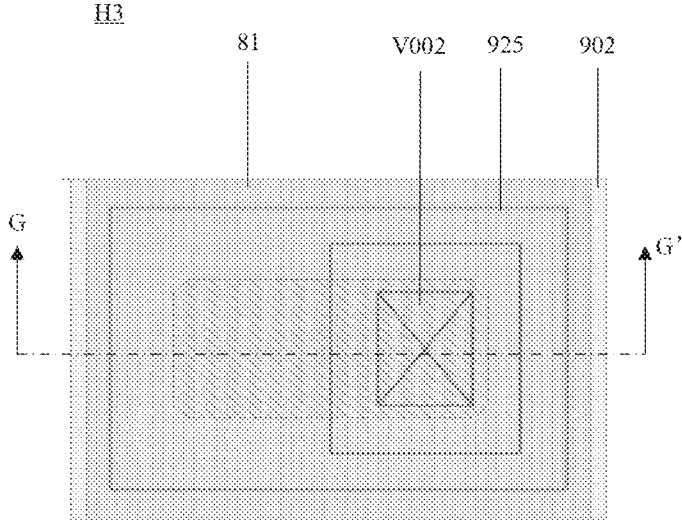
FIG. 13A is a schematic partial planar view of a third auxiliary unit H3 of the display unit illustrated in FIG. 3A.
Figure 13B:
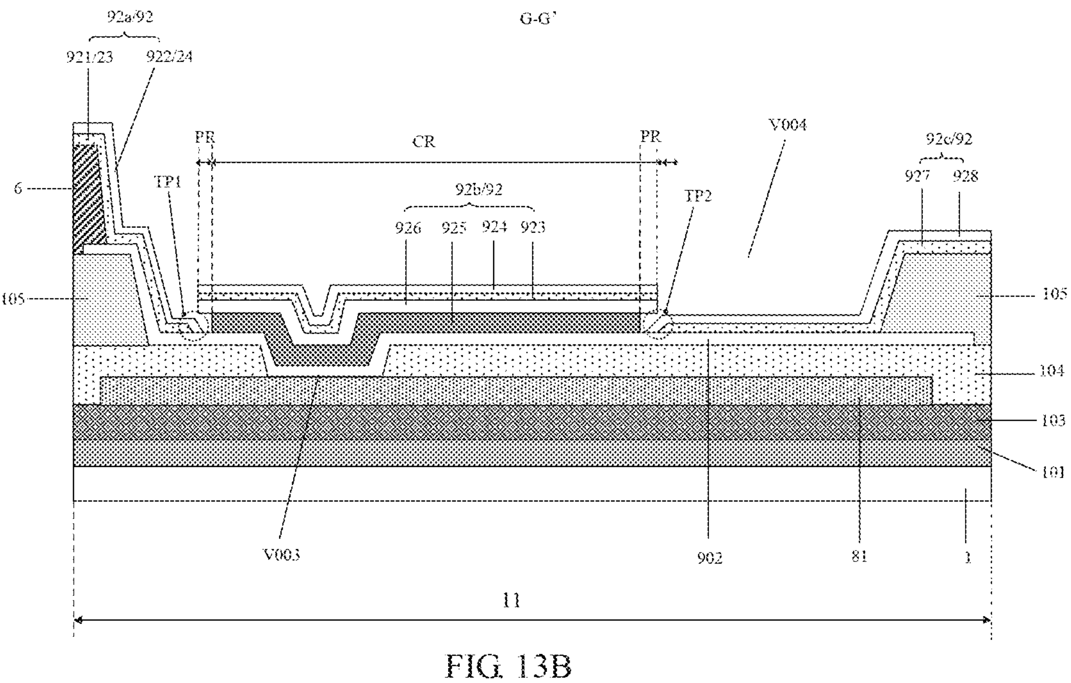
FIG. 13B is a schematic cross-sectional view taken along the line G-G' in FIG. 13A.

FIG. 13A is a schematic partial planar view of the third auxiliary unit H3 of the display unit illustrated in FIG. 3A, and FIG. 13B is a schematic cross-sectional view taken along line G-G' in FIG. 13A.

Referring to FIG. 3A and FIG. 13A-FIG. 13B, for example, the display unit P further includes a second auxiliary electrode 92, and the second auxiliary electrode 92 is located in the display region 11 and is electrically connected to the common electrode 24. The auxiliary insulation layer 104 further includes a second auxiliary via hole V003 which is located in the display region 11 and exposes at least part of the longitudinal portion 81 of the auxiliary electrode line 8, and the second auxiliary electrode 92 is connected to the longitudinal portion 81 of the auxiliary electrode line 8 through the second auxiliary via hole V003. That is, the longitudinal portion 81 of the auxiliary electrode line 8 is connected to the common electrode 24 through the second auxiliary electrode 92 by utilizing the second auxiliary via hole V003. In this way, in addition to providing the first auxiliary via hole V001 and the first auxiliary electrode 91 in the non-light-emitting region 12, by providing the second auxiliary via hole V003 and the second auxiliary electrode 92 in the display region 11, the second auxiliary electrode 92 is electrically connected with the common electrode 2 in parallel to further reduce the resistance of the original common electrode 24; and the auxiliary insulation layer 104 is the existing fourth insulation layer 104 in the display region 11, thus providing the second auxiliary via V003 does not occupy an additional area of the display region 11, which is beneficial to provide the second auxiliary electrode 92 by utilizing the limited space.

For example, as illustrated in FIG. 13B, the orthographic projection of the first sub-conductive layer 901 on the base substrate 1 is located within the orthographic projection of the longitudinal portion 81 of the auxiliary electrode line 8 on the base substrate 1. Therefore, providing the first sub-conductive layer 901 does not occupy an additional area of the display region 11, which is beneficial to saving space, especially in a high PPI (Pixels Per Inch) display substrate, the area of each display unit is smaller, so it is particularly important to use the limited space to provide the second auxiliary electrode 92.

For example, as illustrated in FIG. 13B, the second auxiliary electrode 92 includes a second sub-conductive layer 902, a first stacked portion 92*a* and a second stacked portion 92*b*. The second sub-conductive layer 902 is connected to the longitudinal portion 81 of the auxiliary electrode line 8 through the second auxiliary via hole V003; the first stacked portion 92*a* is electrically connected to the second sub-conductive layer 902 of the second auxiliary electrode 92 and stacked in the direction perpendicular to the base substrate 1, is located on a side of the second sub-conductive layer 902 of the second auxiliary electrode 92 away from the base substrate 1, and includes a first stacked layer 912 and a second stacked layer 922 that are stacked with each other in the direction perpendicular to the base substrate 1, and the second stacked layer 922 of the second auxiliary electrode 92 is located on a side of the first stacked layer 921 of the second auxiliary electrode 92 away from the base substrate 1 and is connected to the common electrode 24; the second stacked portion 92*b* is stacked on the second sub-conductive layer 902 of the second auxiliary electrode 92 in the direction perpendicular to the base substrate 1, is located on the side of the second sub-conductive layer 902 of the second auxiliary electrode 92 away from the base substrate 1, and the second stacked portion 92*b* is located on a side of the first stacked portion 92*a* of the second auxiliary electrode 92 away from the base substrate 1, is electrically connected to the first stacked portion 92*a* of the second auxiliary electrode 92 through the second sub-conductive layer 902, and includes a third stacked layer 923 and a fourth stacked layer 924 that are stacked with each other in the direction perpendicular to the base substrate 1. The third stacked layer 923 of the second auxiliary electrode 92 and the first stacked layer 921 of the second auxiliary electrode 92 are made of the same material, provided in the same layer, and spaced apart from each other in the direction parallel to the base substrate 1, and the fourth stacked layer 924 of the second auxiliary electrode 92 and the second stacked layer 922 of the second auxiliary electrode 92 are made of the same material, provided in the same layer, and spaced apart from each other in the direction parallel to the base substrate 1.

For example, referring to FIG. 13B, the third stacked layer 923 and the first stacked layer 921 are formed through the same one process. The same one process may be a same one patterning process, and the patterning process includes, for example, using an evaporation mask to perform evaporation to form the third stacked layer 923 and the first stacked layer 921; or, the patterning process includes, for example, using a mask to perform an exposure process, a development process, an etching process, and other processes. Alternatively, for example, the same one process may not include a patterning process, but only include a deposition process or an evaporation process so that the third stacked layer 923 is naturally disconnected from the first stacked layer 921 (described below), thereby simplifying the manufacturing process of the display substrate.

Similarly, for example, referring to FIG. 13B, the fourth stacked layer 924 and the second stacked layer 922 are formed through the same one process. The same one process may be the same one patterning process, and the patterning process includes, for example, using an evaporation mask to perform evaporation to form the fourth stacked layer 924 and the second stacked layer 922; or, the patterning process includes, for example, using a mask to perform an exposure process, a development process, an etching process, and other processes. Alternatively, for example, the same one process may not include a patterning process, but only include a deposition process or an evaporation process so that the fourth stacked layer 924 is naturally disconnected from the second stacked layer 922 (described below), thereby simplifying the manufacturing process of the display substrate.

For example, as illustrated in FIG. 13B, the second stacked layer 922 of the second auxiliary electrode 92 is connected to the common electrode 24 and is in direct contact with the second sub-conductive layer 902 of the second auxiliary electrode 92. For example, the second stacked layer 922 is in contact with the first sub-conductive layer 901 in the first region TP1. For example, the first stacked layer 921 of the second auxiliary electrode 92 is in contact with the first sub-conductive layer 901; and the second stacked layer 922 of the second auxiliary electrode 92 includes an upper portion covering an upper surface, of the first stacked layer 921 of the second auxiliary electrode 92, away from the base substrate 1 and a side portion covering a side surface, of the first stacked layer 911 of the second auxiliary electrode 92, intersecting with the upper surface of the first stacked layer 921, and the side portion of the second auxiliary electrode 92 is in contact with the second sub-conductive layer 902. That is, the first region TP1 is located at an edge of the second stacked layer 922 close to the second stacked portion 92*b*, the side portion of the second stacked layer 922 is also an edge portion (a portion of the second stacked layer 922 located in the first region TP1) of the second stacked layer 922 close to the second stacked portion 92*b*, and the edge portion of the second stacked layer 922 is in direct contact with the second sub-conductive layer 902.

For example, as illustrated in FIG. 13B, the second stacked layer 922 covers the upper surface of the first stacked layer 921 away from the base substrate 1 and the side surface intersecting with the upper surface of the first stacked layer 921, and the edge portion of the second stacked layer 922 close to the second stacked portion 92*b* at least covers the side surface of the first stacked layer 921, that is, covers an edge of the first stacked layer 921 close to the second stacked portion 92*b*, so that the edge portion of the second stacked layer 922 close to the second stacked portion 92*b* is capable of being in direct contact with the second sub-conductive layer 902.

For example, as illustrated in FIG. 13B, the second stacked portion 92*b* further includes a fifth stacked layer 925 and a sixth stacked layer 926. The fifth stacked layer 925 is located between the second sub-conductive layer 902 and the third stacked layer 923; the sixth stacked layer 926 is located between the fifth stacked layer 925 and the third stacked layer 923; the fifth stacked layer 925 and the sixth stacked layer 926 are stacked on the second sub-conductive layer 902, the third stacked layer 923, and the fourth stacked layer 924 in the direction perpendicular to the base substrate 1 and are electrically connected to each other, and the fifth stacked layer 925 and the sixth stacked layer 926 are both spaced apart from the first stacked layer 921 and the second stacked layer 922 in the direction parallel to the base substrate 1, that is, the third stacked layer 923, the fourth stacked layer 924, the fifth stacked layer 925, and the sixth stacked layer 926 are all spaced apart from the first stacked layer 921 and the second stacked layer 922 in the direction parallel to the base substrate 1. For example, the orthographic projection of the sixth stacked layer 926 on the base substrate 1 includes a middle region CR and an edge region PR surrounding the middle region CR, and the orthographic projection of the fifth stacked layer 925 on the base substrate 1 overlaps with the middle region CR, and does not overlap with the edge region PR. The orthographic projection of the first region TP1 on the base substrate 1 is at least partially within the orthographic projection of the edge region PR on the base substrate 1. In this way, a plurality of conductive layers are stacked with each other to form the second stacked portion 92*b*, which is beneficial to better reduce the resistance of the original common electrode. For example, referring to FIG. 4A, the light-emitting device 20 includes the above-mentioned first electrode 2 and the light-emitting layer 23 that are located in the display region 11, the light-emitting layer 23 is sandwiched between the first electrode 2 and the common electrode 24, and the first electrode 2 includes a first sub-electrode layer 2*a*, a second sub-electrode layer 2*b* and a third sub-electrode layer 2*c* sequentially stacked in the direction perpendicular to the base substrate 1 and along a direction from a position close to the base substrate 1 to a position away from the base substrate 1. For example, the second sub-conductive layer 902 of the first auxiliary electrode 92 and the first sub-electrode layer 2*a* are made of the same material and in the same layer, the first stacked layer 921 and the light-emitting layer 23 constitute a continuous and integrated structure, the second stacked layer 922 and the common electrode 24 constitute a continuous and integrated structure, the third stacked layer 923 and the light-emitting layer 23 are made of the same material and in the same layer, the fourth stacked layer 924, the second stacked layer 922 and the common electrode 24 are made of the same material and in the same layer, the fifth stacked layer 925 and the second sub-electrode layer **2*b* are made of the same material and in the same layer, and the sixth stacked layer 926 and the third sub-electrode layer 2*c* are made of the same material and in the same layer. In this way, the second sub-conductive layer 902 of the first auxiliary electrode 92 and the first sub-electrode layer 2*a* can be formed through the same one process, the first stacked layer 921, the light-emitting layer 23, and the third stacked layer 923 can be formed through the same one process, the fourth stacked layer 924, the second stacked layer 922, and the common electrode 24 can be formed through the same one process, the fifth stacked layer 925 and the second sub-electrode layer 2*b* can be formed through the same one process, and the sixth stacked layer 926 and the third sub-electrode layer 2*c* can be formed through the same one process. The "same one process" here can refer to the above-mentioned explanation. In this way, each layer structure of the first auxiliary electrode 92 can be formed using the processes corresponding to the above-mentioned various functional layers in the display region 11, without adding additional film manufacturing process or patterning process for providing the first auxiliary electrode 92**.

For example, in the process of manufacturing the display substrate as illustrated in FIG. 13B, the fifth stacked layer 925 and the sixth stacked layer 926 are formed through the same one patterning process using the same one mask, for example, using an etching process such as a wet etching process to simplify the manufacturing process of the display substrate; moreover, because the materials of the fifth stacked layer 925 and the sixth stacked layer 926 are different, the material of the fifth stacked layer 925 and the material of the sixth stacked layer 926 are respectively the same as the material of the second sub-electrode layer **2*b* and the material of the third sub-electrode layer 2*c*, and reference can be made to the previous description of the material of the second sub-electrode layer 2*b* and the material of the third sub-electrode layer 2*c*, so that the etching rates of forming the fifth stacked layer 925 and the sixth stacked layer 926 in the etching process are different, and the fifth stacked layer 925 shrinks inward relative to the sixth stacked layer 926 as illustrated in FIG. 13B, that is, the orthographic projection of the fifth stacked layer 925 on the base substrate 1 overlaps with the middle region CR and does not overlap with the edge region PR. After forming the fifth stacked layer 925 and the sixth stacked layer 926, the steps of forming the first stacked layer 921, the light-emitting layer 23, the third stacked layer 923, the fourth stacked layer 924 and the second stacked layer 922** are sequentially performed.

In the process of forming the first stacked layer 921, the light-emitting layer 23, and the third stacked layer 923 on a side of the sixth stacked layer 926 away from the base substrate 1, for example, the first stacked layer 921, the light-emitting layer 23 and the third stacked layer 923 are formed by an evaporation process, and the first stacked layer 921 and the light-emitting layer 23 may be formed into a continuous and integrated structure. Due to the existence of the fifth stacked layer 925 and the sixth stacked layer 926, the fifth stacked layer 925 and the sixth stacked layer 926 have a certain thickness so that there is a segment difference between the upper surface of the sixth stacked layer 926 away from the base substrate 1 and the upper surface of the second sub-conductive layer 902 away from the base substrate 1, and thus the third stacked layer 923 and the first stacked layer 921 can be disconnected from each other due to the segment difference. Moreover, there is a segment difference between the upper surface of the third stacked layer 923 away from the base substrate 1 and the upper surface of the first stacked layer 921 away from the base substrate 1.

Next, in the process of forming the fourth stacked layer 924, the second stacked layer 922, and the common electrode 24, for example, the fourth stacked layer 924, the second stacked layer 922 and the common electrode 24 are formed by a deposition process, and the second stacked layer 922 and the common electrode 24 may be formed into a continuous and integrated structure. Due to the segment difference between the upper surface of the third stacked layer 923 away from the base substrate 1 and the upper surface of the first stacked layer 921 away from the base substrate 1, the fourth stacked layer 924 and the second stacked layer 922 can be disconnected from each other; moreover, because the fifth stacked layer 925 shrinks inward relative to the sixth stacked layer 926, that is, the orthographic projection of the fifth stacked layer 925 on the base substrate 1 overlaps with the middle region CR, and does not overlap with the edge region PR, therefore, the second stacked layer 922 is in contact with the second sub-conductive layer 902 in the first region TP1, and the orthographic projection of the first region TP1 on the base substrate 1 is at least partially located within the orthographic projection of the edge region PR on the base substrate 1.

In this way, the common electrode 24 can be connected to the second sub-conductive layer 902, so that the first auxiliary electrode 92 can be electrically connected with the common electrode 24 in parallel to reduce the resistance of the original common electrode 24.

For example, as illustrated in FIG. 13B, the sum of the thickness of the fifth stacked layer 925 in the direction perpendicular to the base substrate 1 and the thickness of the sixth stacked layer 926 in the direction perpendicular to the base substrate 1 is greater than or equal to 6000 angstroms, so that the fifth stacked layer 925 has enough thickness to form a sufficient segment difference between the upper surface of the sixth stacked layer 926 away from the base substrate 1 and the upper surface of the second sub-conductive layer 902 away from the base substrate 1 to further ensure the reliability of that the third stacked layer 923 and the first stacked layer 921 can be disconnected from each other due to the segment difference, and the reliability of that the fourth stacked layer 924 and the second stacked layer 922 can be disconnected from each other.

For example, as illustrated in FIG. 13B, the first auxiliary electrode 92 further includes a third stacked portion **92*c*. The third stacked portion 92*c* is stacked on the second sub-conductive layer 902 in the direction perpendicular to the base substrate 1, is located on the side of the second sub-conductive layer 902 away from the base substrate 1, is electrically connected to the first stacked portion 92*a* and the second stacked portion 92*b* through the second sub-conductive layer 902, and includes a seventh stacked layer 927 and an eighth stacked layer 928 that are stacked with each other in the direction perpendicular to the base substrate 1, the seventh stacked layer 927 and the third stacked layer 923 are in the same layer and are spaced apart from each other in the direction parallel to the base substrate 1, and the eighth stacked layer 928 and the fourth stacked layer 924 are in the same layer and are spaced from each other in the direction parallel to the base substrate 1**.

For example, the eighth stacked layer 928 is in direct contact with the second sub-conductive layer 902. For example, the eighth stacked layer 928 is in direct contact with the second sub-conductive layer 902 in a second region TP2, and the orthographic projection of the second region TP2 on the base substrate 1 is at least partially within the orthographic projection of the edge region PR on the base substrate 1. Similar to the case of the first region TP1, the eighth stacked layer 928 covers the upper surface of the seventh stacked layer 927 away from the base substrate 1 and the side surface intersecting with the upper surface of the seventh stacked layer 927, and the edge portion of the eighth stacked layer 928 close to the second stacked portion 92*b* at least covers the side surface of the seventh stacked layer 927, that is, covers an edge of the seventh stacked layer 927 close to the second stacked portion 92*b*, so that the edge portion of the eighth stacked layer 928 close to the second stacked portion 92*b* is capable of being in direct contact with the second sub-conductive layer 902.

For example, the seventh stacked layer 927, the third stacked layer 923 and the light-emitting layer 23 are made of the same material and provided in the same layer, and the eighth stacked layer 928, the fourth stacked layer 924 and the second stacked layer 922 are made of the same material and provided in the same layer. In this way, the seventh stacked layer 927, the third stacked layer 923 and the light-emitting layer 23 can be formed through the same one process, and the eighth stacked layer 928 and the fourth stacked layer 924 are formed through the same one process. The "same one process" here can refer to the above-mentioned explanation. Similar to the case of forming the structure in the first region TP1, in the process of forming the seventh stacked layer 927, the third stacked layer 923, and the light-emitting layer 23 using the same one process, the segment difference formed by the fifth stacked layer 925 and the sixth stacked layer 926 can make the seventh stacked layer 927 to be disconnected to the third stacked layer 923, and in the process of forming the eighth stacked layer 928, the fourth stacked layer 924 and the second stacked layer 922 using the same one process, the eighth stacked layer 928 is disconnected to the fourth stacked layer 924.

Referring to FIG. 13B and FIG. 5H, for example, the interlayer insulation layer 105 is the fifth insulation layer 105, that is, the interlayer insulation layer 105 and the fifth insulation layer 105 are in the same layer and made of the same material. The fifth insulation layer 105 includes a third auxiliary via hole V004, and the orthographic projection of the third auxiliary via hole V004 on the base substrate 1 is located within the orthographic projection of the longitudinal portion 81 of the auxiliary electrode line 8 on the base substrate 1. The second auxiliary via hole V003 of the second auxiliary unit H2 communicates with the third auxiliary via hole V004, and the third auxiliary via hole V004 exposes the second auxiliary via hole V003. For example, a portion of the first stacked portion 92*a* of the second auxiliary unit H2 is located in the third auxiliary via hole V004, and the first region TP1 is located in the third auxiliary via hole V004; the second stacked portion 92*b* of the second auxiliary unit H2 is located in the third auxiliary via hole V004; a portion of the third stacked portion 92*c* of the second auxiliary unit H2 is located in the third auxiliary via hole V004; and the second sub-conductive layer 902 is at least partially located in the third auxiliary via hole V004, and the second region TP2 is located in the third auxiliary via hole V004.

Figure 14A:
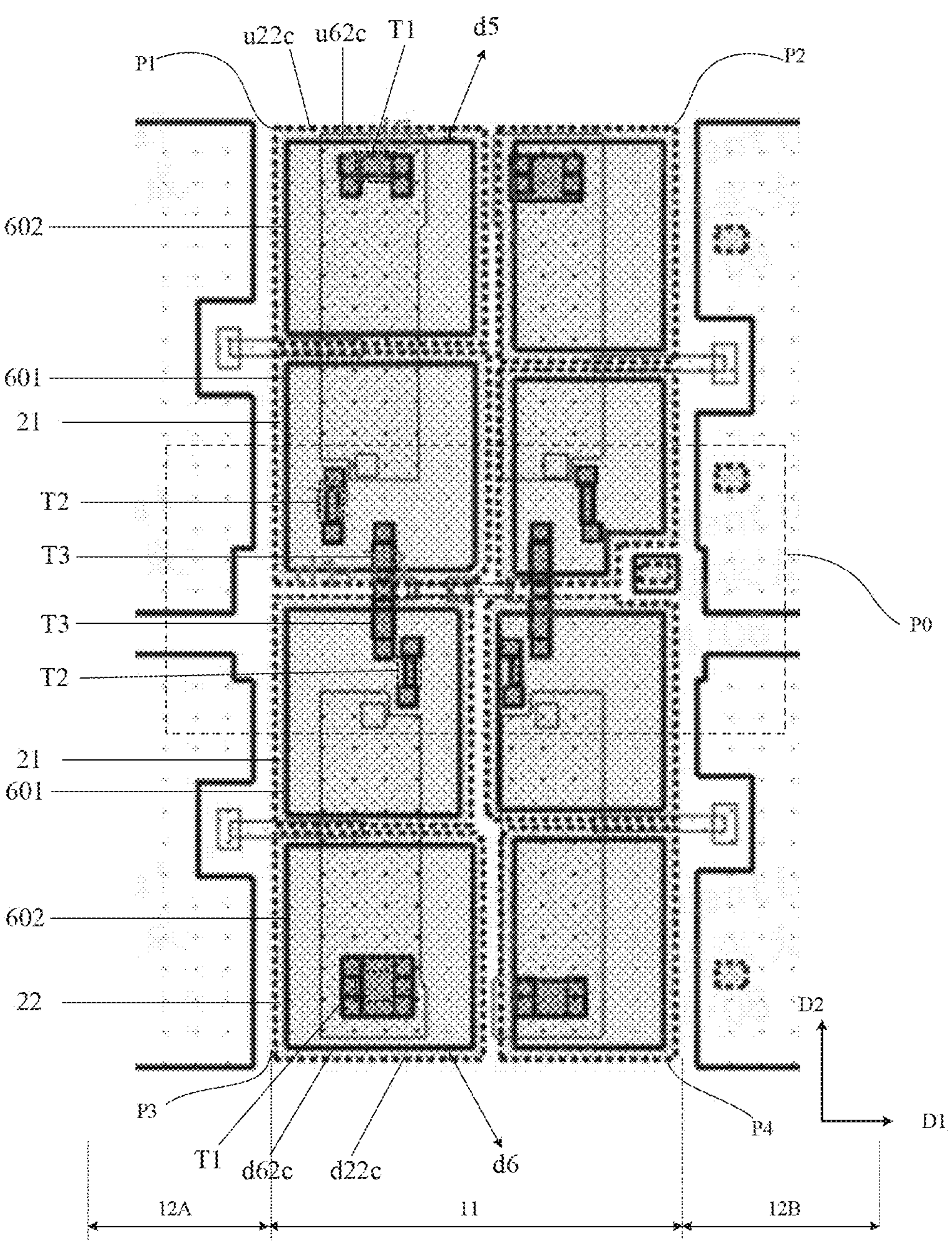
FIG. 14A is a schematic diagram of a part of layers that includes the pixel definition layer and the first electrode of the display unit illustrated in FIG. 3A.
Figure 14B:
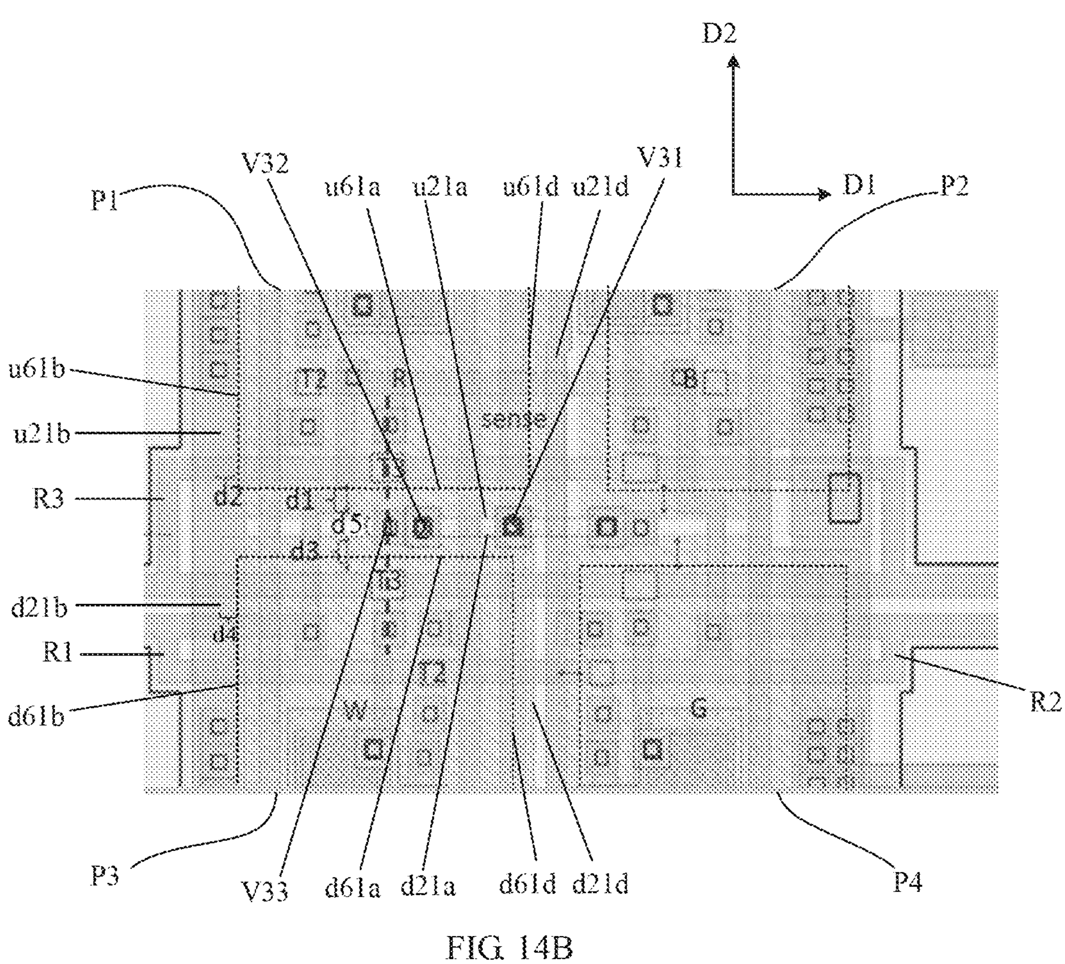
FIG. 14B is a schematic enlarged view of part P0 indicated by a dashed box in FIG. 14A.

FIG. 14A is a schematic diagram of a part of layers, including a pixel definition layer and a first electrode, of the display unit illustrated in FIG. 3A; and FIG. 14B is a schematic enlarged view of part P0 indicated by a dashed box in FIG. 14A, FIG. 14B contains more layers than in FIG. 14A, which includes the layers in FIG. 3A.

Referring to FIG. 14A-FIG. 14B and FIG. 5K, the pixel definition layer 6 defines the opening region 60, the opening region 60 includes a plurality of pixel openings located in the display region 111, the plurality of pixel openings correspond to the plurality of sub-pixels one by one, and the plurality of pixel openings are the opening regions of the plurality of sub-pixels. For example, in each of the plurality of sub-pixels, the orthographic projection of the pixel opening on the base substrate 1 is located within the orthographic projection of the first electrode 2 on the base substrate 1. Two adjacent sub-pixels among the plurality of sub-pixels of the display unit P are respectively an upper sub-pixel and a lower sub-pixel, and the direction perpendicular to an arrangement direction of the upper sub-pixel and the lower sub-pixel is a reference direction. For example, the reference direction is the above-mentioned first direction D1, and the arrangement direction of the upper sub-pixel and the lower sub-pixels is the above-mentioned second direction D2. The following description will be made by taking the case where the first sub-pixel P1 serves as the upper sub-pixel and the third sub-pixel P3 serves as the lower sub-pixel as an example. In the present embodiment, the second sub-pixel P2 may also serve as the upper sub-electrode, and the fourth sub-pixel P4 may serve as the lower sub-electrode. Alternatively, in some other embodiments, the upper sub-pixel and the lower sub-pixel may also be arranged along the first direction D1, or along any direction, and the embodiments of the present disclosure impose no limitation on the position and arrangement direction of the upper sub-pixel and the lower sub-pixel.

Referring to FIG. 14A-FIG. 14B, a first electrode 2 of the first sub-pixel P1 includes a first edge u21*a* close to the third sub-pixel P3 and a second edge u21*b* which intersects with the first edge u21*a* of the first electrode 2 and is located on a first side of the first edge u21*a* of the first electrode 2 in the first direction D1, and an opening region of the first sub-pixel P1 includes a first edge u61*a* close to the third sub-pixel P3 and a second edge u61*b* which intersects the first edge u61*a* of the opening region and is located on a first side of the first edge u61*a* of the opening region in the first direction D1. The distance between the first edge u21*a* of the first electrode 2 of the first sub-pixel P1 and the first edge u61*a* of the opening region of the first sub-pixel P1 is a first distance d1, the distance between the second edge u21*b* of the first electrode 2 of the first sub-pixel P1 and the second edge u61*b* of the opening region of the first sub-pixel P1 is a second distance d2, and the first distance d1 is greater than the second distance d2, so that in the first sub-pixel P1, in the first direction D1, the first edge u21*a* of the first electrode 2 is further beyond the corresponding edge of the opening region of the corresponding sub-pixel in the arrangement direction of the two adjacent sub-pixels, i.e., first sub-pixel P1 and the third sub-pixel P3, so as to ensure that the first electrode 2 of the first sub-pixel P1 can cover a larger area in the boundary region between the first sub-pixel P1 and the third sub-pixel P3 in the second direction D2. Therefore, in the case where the transistor of the pixel circuit is provided in the boundary region between the first sub-pixel P1 and the third sub-pixel P3 (for example, the detection transistor T3 of the first sub-pixel P1 is at least partially located in the boundary region), a portion of the first electrode 2 of the first sub-pixel P1 close to the boundary region between the first sub-pixel P1 and the third sub-pixel P3 can fully cover at least part of the channel region of the transistor located in the boundary region, thereby preventing the performance of the transistor from being affected by light irradiation on the channel region.

For example, the first distance d1 is the average distance in the first direction D1, for example, the first edge u21*a* of the first electrode 2 of the first sub-pixel P1 is substantially parallel to the first edge u61*a* of the opening region 60 of the first sub-pixel P1, and the second edge u21*b* of the first electrode 2 of the first sub-pixel P1 is substantially parallel to the second edge u61*b* of the opening region 60 of the first sub-pixel P1. The term "substantially parallel" is not limited to the case of being absolutely parallel, each edge of the first electrode of each sub-pixel and each edge of the opening region of each sub-pixel in the present disclosure are not limited to straight line segments, and these edges may include curved portions, as long as the above-mentioned distance relationship is satisfied at each position along the first direction D1.

For example, referring to FIG. 14A-FIG. 14B, in each of the plurality of sub-pixels, the first electrode 2 includes a first portion 21 and a second portion 22 that are spaced apart from each other in the second direction D2, the first portion 21 of the first electrode 2 and the second portion 22 of the first electrode 2 are connected to the first electrode of the driving transistor, the opening region of the sub-pixel includes a first sub-opening 601 and a second sub-opening 602, the first portion 21 of the first electrode 2 covers the first sub-opening 601, and the second portion 22 of the first electrode 2 covers the second sub-opening 602.

The non-light-emitting region 12A and the display region 11 are arranged in the first direction D1 and are adjacent to the first sub-pixel P1 and the third sub-pixel P3. Here, the case where an edge of the first portion 21 of the first electrode 2 of the first sub-pixel P1 close to the third sub-pixel P3 serves as the first edge u21*a* of the first electrode 2 of the first sub-pixel P1, an edge, intersecting with the first edge u21*a* and close to the non-light-emitting region 12A, of the first portion 21 of the first electrode 2 of the first sub-pixel P1 serves as the second edge u21*b* of the first electrode 2 of the first sub-pixel P1, an edge of the first sub-opening 601 of the first sub-pixel P1 close to the third sub-pixel P3 serves as the first edge u61*a* of the first sub-opening 601 of the first sub-pixel P1, and an edge of the first sub-opening 601 of the first sub-pixel P1 close to the non-light-emitting region 12A serves as the second edge u61*b* of the opening region 60 of the first sub-pixel P1.

For example, referring to FIG. 14A-FIG. 14B, in the first sub-pixel P1, the orthographic projection of the channel region T3*a* of the detection transistor T3 on the base substrate 1 is located within the orthographic projection of the first electrode 2 on the base substrate 1, for example, the orthographic projection of the channel region T3*a* of the detection transistor T3 is located within the orthographic projection of the first portion 21 of the first electrode 2 on the base substrate 1; and the first edge u21*a* of the first electrode 2 of the first sub-pixel P1 is located on a side of the channel region C3 of the detection transistor T3 of the first sub-pixel P1 close to the third sub-pixel P3 in the second direction D2, that is, the first edge u21*a* of the first electrode 2 of the first sub-pixel P1 is located at the outer side of the channel region C3 of the detection transistor T3 of the first sub-pixel P1, so as to more fully ensure that the first electrode 2 of the first sub-pixel P1 can cover at least part of the channel region C3 of the detection transistor T3 which is in the boundary region between the first sub-pixel P1 and the third sub-pixel P3. In the third sub-pixel P3, the first edge d21*a* of the first electrode 2 of the third sub-pixel P3 is located on a side, of the channel region C3 of the detection transistor T3 of the third sub-pixel P3, close to the first sub-pixel P1 in the second direction D2, that is, the first edge d21*a* of the first electrode 2 of the third sub-pixel P3 is located at the outer side of the channel region C3 of the detection transistor T3 of the third sub-pixel P3, so as to more fully ensure that the first electrode 2 of the third sub-pixel P3 can cover at least part of the channel region C3 of the detection transistor T3 which is in the boundary region between the first sub-pixel P1 and the third sub-pixel P3.

For example, the first pole T3*s* of the detection transistor T3 of the first sub-pixel P1 is located on a side of the second pole T3*d* away from the third sub-pixel P3, and the first pole T3*s* of the detection transistor T3 of the third sub-pixel P3 is located on a side of the second pole T3*d* of the detection transistor T3 away from the upper sub-electrode; and in the second direction D2, the distance between the first pole T3*s* of the detection transistor T3 of the first sub-pixel P1 and the first pole T3*s* of the detection transistor T3 of the third sub-pixel P3 is smaller than the length of the opening region of the first sub-pixel P1 in the second direction D2 and smaller than the length of the opening region of the third sub-pixel P3 in the second direction D2, so as to ensure that the detection transistor T3 is close to the boundary region between the first sub-pixel P1 and the third sub-pixel P3, which is beneficial to reduce the distance between adjacent sub-pixels in the second direction D2, thereby ensuring the layout of the pixel array more compact and achieving a high PPI.

It should be noted that the length of the opening region of the first sub-pixel P1 in the second direction D2 refers to the length of the first opening region 601 of the first sub-pixel P1 in the second direction D2, and the length of the opening region of the third sub-pixel P3 in the second direction D2 refers to the length of the first opening region 601 of the third sub-pixel P3 in the second direction D2.

For example, in at least one embodiment, the distance between the first pole T3*s* of the detection transistor T3 of the first sub-pixel P1 and the first pole T3*s* of the detection transistor T3 of the third sub-pixel P3 is smaller than ½ of the width of the opening region 60 to effectively reduce the distance between adjacent sub-pixels in the second direction D2, thereby ensuring the layout of the pixel array more compact and achieving high PPI.

For example, referring to FIG. 14A-FIG. 14B and the previous FIG. 6A, the second sub-scanning signal line G2 includes a ring portion, i.e., the third outer ring portion R3, and a portion, overlapping with the active layer T3*a* of the detection transistor T3 of the first sub-pixel P1 in the direction perpendicular to the base substrate 1, of the third outer ring portion R3 and a portion, overlapping with the active layer T3*a* of the detection transistor T3 of the third sub-pixel P3 in the direction perpendicular to the base substrate 1, of the third outer ring portion R3 respectively constitute the gate electrode of the detection transistor T3 of the first sub-pixel P1 and the gate electrode of the detection transistor T3 of the third sub-pixel P3; and the orthographic projection of the third outer ring portion R3 on the base substrate 1 constitutes a ring-shaped region, and the orthographic projection of the second pole T3*d* of the detection transistor T3 of the first sub-pixel P1 on the base substrate 1 and the orthographic projection of the second pole T3*d* of the detection transistor T3 of the third sub-pixel P3 on the base substrate 1 are both located within the ring-shaped region, so as to reasonably utilize the limited space to design the position relationship between the third outer ring portion R3 and both of the first pole T3*s* and the second pole T3*d* of the two detection transistors T3 that are at least partially located in the boundary region, so that the channel region of the detection transistor T3 can be covered by the first electrode of the sub-pixel where the detection transistor T3 is located, while achieving a compact structure design, thereby taking into account both the performance of the detection transistor T3 and improving the PPI.

For example, a first electrode 2 of the third sub-pixel P3 includes a first edge d21*a* close to the first sub-pixel P1 and a second edge d21*b* which intersects with the first edge d21*a* of the first electrode 2 and is close to the non-light-emitting region 12A; an opening region of the third sub-pixel P3 includes a first edge d61*a* close to the first sub-pixel P1 and a second edge d61*b* which intersects the first edge d61*a* of the opening region and is close to the non-light-emitting region 12A; the distance between the first edge d21*a* of the first electrode 2 of the third sub-pixel P3 and the first edge d61*a* of the opening region of the third sub-pixel P3 is a third distance d3, the distance between the second edge d21*b* of the first electrode 2 of the third sub-pixel P3 and the second edge d61*b* of the opening region of the third sub-pixel P3 is a fourth distance d4, and the third distance d3 is greater than the fourth distance d4, so that in the third sub-pixel P3, compared with the case in the first direction D1, the first edge of the first electrode 2 is further beyond the corresponding edges of the opening region of the respective sub-pixel in the arrangement direction of two adjacent sub-pixels (such as the second direction D2), so as to ensure that the first electrode 2 of the third sub-pixel P3 can cover a larger area in the boundary region between the first sub-pixel P1 and the third sub-pixel P3 in the second direction D2. Therefore, in the case where the transistor of the pixel circuit is provided in the boundary region between the first sub-pixel P1 and the third sub-pixel P3 (for example, the detection transistor T3 of the third sub-pixel P3), the portion of the first electrode 2 of the third sub-pixel P3 close to the boundary region between the first sub-pixel P1 and the third sub-pixel P3 can fully cover the channel region of the transistor located in the boundary region, thereby preventing the performance of the transistor from being affected by light irradiation on the channel region.

Here, the edge of the first portion 21 of the first electrode 2 of the third sub-pixel P3 close to the first sub-pixel P1 serves as the first edge d21*a* of the first electrode 2 of the third sub-pixel P3, the edge, intersecting with the first edge d21*a* and close to the non-light-emitting region 12A, of the first portion 21 of the first electrode 2 of the third sub-pixel P3 serves as the second edge d21*b* of the first electrode 2 of the third sub-pixel P3, the edge of the first sub-opening 601 of the third sub-pixel P3 close to the first sub-pixel P1 serves as the first edge d61*a* of the opening region of the third sub-pixel P3, and the edge, intersecting with the first edge d61*a* and close to the non-light-emitting region 12A, of the first sub-opening 601 of the third sub-pixel P3 serves as the second edge d61*b* of the opening region of the third sub-pixel P3.

For example, as illustrated in FIG. 14B, the first electrode 2 of the first sub-pixel P1 further has a fourth edge u21*d* opposite to second edge u21*b* of the first electrode of 2, and the opening region of the first sub-pixel P1, such as the first sub-opening 601, further has a fourth edge u61*d* opposite to the second edge u61*b* of the opening region. For example, in some embodiments, the first distance d1 is greater than the distance between the fourth edge u21*d* of the first electrode 2 of the first sub-pixel P1 and the fourth edge u61*d* of the opening region of the first sub-pixel P1, so as to ensure that the channel region, at least partially located in the boundary region, of the detection transistor T3 of the first sub-pixel P1 is covered and shielded by the first electrode. Similarly, in some embodiments, the same may be true for the third sub-pixel P3, that is, the first electrode 2 of the third sub-pixel P1 further has a fourth edge d21*d* opposite to second edge d21*b* of the first electrode 2, and the opening region of the third sub-pixel P3, such as the first sub-opening 601, further has a fourth edge d61*d* opposite to the second edge d61*b* of the opening region. For example, in some embodiments, the third distance d3 is greater than the distance between the fourth edge d21*d* of the first electrode 2 of the third sub-pixel P3 and the fourth edge d61*d* of the opening region of the third sub-pixel P3, so as to ensure that the channel region, at least partially located in the boundary region, of the detection transistor T3 of the third sub-pixel P3 is covered and shielded by the first electrode.

For example, referring to FIG. 14B, FIG. 3A and FIG. 5E, in the first sub-pixel P1, the first pole T3*s* of the detection transistor T3 is electrically connected to the active layer T3*a* of the detection transistor T3 through an upper via hole V51; and in the third sub-pixel P3, the first pole T3*s* of the detection transistor T3 is electrically connected to the active layer T3*a* of the detection transistor T3 through a lower via hole V52. Referring to FIG. 14B and FIG. 4C, the orthographic projection of the first edge u21*a* of the first electrode 2 of the first sub-pixel P1 on the base substrate 1 at least partially overlaps with the orthographic projection of the edge of the intermediate via hole V33 away from the third sub-pixel P3 in the second direction D2, that is, the first electrode 2 of the first sub-pixel P1 extends along the second direction D2 to the edge of the intermediate via hole V33 away from the third sub-pixel P3 in the second direction D2. Moreover, the orthographic projection of the first edge d21*a* of the first electrode 2 of the third sub-pixel P3 on the base substrate 1 at least partially overlaps with the orthographic projection of the edge of the intermediate via hole V33 away from the first sub-pixel P1 in the second direction D2, that is, the first electrode 2 of the third sub-pixel P3 extends along the second direction D2 to the edge of the intermediate via hole V33 away from the first sub-pixel P1 in the second direction D2. In this way, while ensuring that the first electrode 2 of the first sub-pixel P1 and the first electrode 2 of the third sub-pixel P3 respectively cover the channel region C3, located in the boundary region, of the detection transistor T3 of the corresponding sub-pixel, it can further ensure that there is sufficient space between the first electrode 2 of the first sub-pixel P1 and the second electrode 2 of the third sub-pixel P3, and ensure that the edge of the first electrode is aligned with the edge of the via hole, thereby reducing the manufacturing difficulty and improving the manufacturing yield of the display substrate.

For example, as illustrated in FIG. 14B, the continuous and integrated electrode IAL crosses a space between the first electrode 2 of the first sub-pixel P1 and the first electrode 2 of the third sub-pixel P3 along the second direction D2, and two ends, opposite to each other in the second direction D2, of the continuous and integrated electrode IAL are respectively located on two sides of the space between the first electrode 2 of the first sub-pixel P1 and the first electrode 2 of the third sub-pixel P3 in the second direction D2.

For example, as illustrated in FIG. 14B, FIG. 5B and FIG. 5E, the intermediate connection portion 43 is located on the side of the active layer T3*a* of the detection transistor T3 close to the base substrate 1, for example, the intermediate connection portion 43 is in the first conductive layer 100, as illustrated in FIG. 5A; moreover, the orthographic projection of the intermediate connection portion 43 on the base substrate 1 is at least partially located within the orthographic projection of the space between the first electrode 2 of the first sub-pixel P1 and the first electrode 2 of the third sub-pixel P3 on the base substrate 1; and the detection signal line S is connected to the intermediate connection portion 43 through the first connection via hole V31, and the active layer IAL which is continuous and integrated is connected to the intermediate connection portion 43 through the second connection via hole V32. The first connection via hole V31 and the second connection via hole V32 corresponding to the intermediate connection portion 43 are provided in the space between the first electrode 2 of the first sub-pixel P1 and the first electrode 2 of the third sub-pixel P3, and the first connection via hole V31, the second connection via hole V32 and the intermediate via hole V33, that are located in the boundary region between the adjacent upper sub-pixel and the lower sub-pixel in the pixel array, are arranged neatly, so that the edge of the first electrode is aligned with the edge of the via hole, thereby reducing the manufacturing difficulty and improving the manufacturing yield of the display substrate.

For example, as illustrated in FIG. 14B, the orthographic projection of the first edge u21*a* of the first electrode 2 of the first sub-pixel P1 on the base substrate 1 at least partially overlaps with both the orthographic projection of an edge, away from the third sub-pixel P3 in the second direction D2, of the first connection via hole V31 on the base substrate 1 and the orthographic projection of an edge, away from the third sub-pixel P3 in the second direction D2, of the second connection via hole V32; and the orthographic projection of the first edge d21*a* of the first electrode 2 of the third sub-pixel P3 on the base substrate 1 at least partially overlaps with both the orthographic projection of the edge, away from the first sub-pixel P1 in the second direction D2, of the second connection via hole V32 on the base substrate 1 and the orthographic projection of the edge, away from the first sub-pixel P1 in the second direction D2, of the first connection via hole V31, that is, the first electrode 2 of the first sub-pixel P1 extends along the second direction D2 to the edge of the first connection via hole V31 away from the lower sub-pixel, and extends to the edge of the second connection via hole V32 away from the lower sub-pixel. The first electrode 2 of the third sub-pixel P3 extends along the second direction D2 to the edge of the first connection via hole V31 away from the upper sub-pixel in the second direction D2, and extends to the edge of the second connection via hole V32 away from the upper sub-pixel in the second direction D2. In this way, the intermediate via hole V33, the first connection via hole V31 and the second connection via hole V32 that are located in the boundary region between the adjacent upper sub-pixel and the lower sub-pixel in the pixel array can be arranged neatly, thereby reducing the manufacturing difficulty, and improving the manufacturing yield of the display substrate.

For example, as illustrated in FIG. 14B, the third distance d3 and the first distance d1 are both greater than the width, in the second direction D2, of the space between the first electrode 2 of the first sub-pixel P1 and the first electrode 2 of the third sub-pixel P3. The width, in the second direction D2, of the space between the first electrode 2 of the first sub-pixel P1 and the first electrode 2 of the third sub-pixel P3 refers to the distance between the first edge u21*a* of the first electrode 2 of the first sub-pixel P1 and the first edge d21*a* of the first electrode 2 of the third sub-pixel P3, for example, the distance is the average value of the distances between the two at various position along the first direction D1. Therefore, it can be ensured that the third distance d3 and the first distance d1 are sufficiently large, thereby ensuring that the first electrode 2 of the first sub-pixel P1 and the first electrode 2 of the third sub-pixel P3 can respectively fully cover the channel region C3 of the detection transistor T3 of the first sub-pixel P1 and the channel region C3 of the detection transistor T3 of the third sub-pixel P3.

For example, as illustrated in FIG. 14B, the first electrode 2 of the first sub-pixel P1 further has a third edge u22*c* away from the third sub-pixel P3, and the first sub-opening 601 of the first sub-pixel P1 further has a third edge u62*c* away from the third sub-pixel P3. The distance between the third edge u22*c* of the first electrode 2 of the first sub-pixel P1 and the third edge u62*c* of the first sub-opening 601 of the first sub-pixel P1 is a fifth distance d5, and the first distance d1 is greater than the fifth distance d5. In each sub-pixel, for example, in the first sub-pixel P1, the orthographic projections of the driving transistor T1 and the data writing transistor T2 on the base substrate 1 are located within the orthographic projection of the opening region of the sub-pixel where the driving transistor T1 is located on the base substrate 1, for example, the orthographic projections of the driving transistor T1 and the data writing transistor T2 of the first sub-pixel P1 on the substrate 1 are respectively located within the orthographic projections of the second opening 602 and the first opening 601 of the first sub-pixel P1 on the base substrate 1, and the orthographic projections of the driving transistor T1 and the data writing transistor T2 of the third sub-pixel P3 on the base substrate 1 are respectively located within the orthographic projection of the second opening 602 of the third sub-pixel P3 and the orthographic projection of the first opening 601 of the third sub-pixel P3 on the base substrate 1; and in the first sub-pixel P1, the distance between the channel region C1 of the driving transistor T1 and the third edge u62*c* of the second sub-opening 602 is greater than the distance between the channel region C3 of the detection transistor T3 and the first edge u61*a* of the first sub-opening 601. Therefore, the channel region C1 of the driving transistor T1 is covered and shielded by the corresponding first electrode, and the first distance d1 being greater than the fifth distance d5 can further ensure that the channel region C3 of the detection transistor T3 of the first sub-pixel P1 is covered and shielded by the corresponding first electrode.

Here, an edge of the second portion 22 of the first electrode 2 of the first sub-pixel P1 away from the third sub-pixel P3 serves as the third edge u22*c* of the first electrode 2 of the first sub-pixel P1, and an edge of the second sub-opening 602 of the first sub-pixel P1 away from the third sub-pixel P3 serves as the third edge u62*c* of the opening region of the first sub-pixel P1.

For example, the distance between the third edge of the first electrode 2 of the third sub-pixel P3 away from the first sub-pixel P1 and the third edge of the opening region 60 of the third sub-pixel P3 away from the first sub-pixel P1 is a sixth distance d6, and the third distance d3 is greater than the sixth distance d6. Moreover, in the third sub-pixel P1, the distance between the channel region C1 of the driving transistor T1 and the third edge d62*c* of the second sub-opening 602 is greater than the distance between the channel region C3 of the detection transistor T3 and the first edge d61*a* of the first sub-opening 601. Therefore, the channel region C1 of the driving transistor T1 is covered and shielded by the corresponding first electrode, and the third distance d3 is greater than the sixth distance d6, which can further ensure that the channel region C3 of the detection transistor T3 of the third sub-pixel P3 is covered and shielded by the corresponding first electrode.

Here, an edge of the second portion 22 of the first electrode 2 of the third sub-pixel P3 away from the first sub-pixel P1 serves as the third edge d22*c* of the first electrode 2 of the third sub-pixel P3, and the edge of the second sub-opening 602 of the third sub-pixel P3 away from the first sub-pixel P1 serves as the third edge d62*c* of the opening region of the third sub-pixel P3.

For example, referring to FIG. 5C and FIG. 14B, the orthographic projection of the data writing transistor T2 on the base substrate 1 is also located within the orthographic projection of the opening region on the base substrate 1, so that the orthographic projection of the channel region C2 of the data writing transistor T2 on the base substrate 1 is located within the orthographic projection of the opening region on the base substrate 1, and is also covered and shielded by the first electrode. Therefore, the orthographic projections of the channel regions of all the transistors of the pixel circuit on the base substrate are all located within the orthographic projections of the first electrodes, of the respective sub-pixels where they are respectively located, on the base substrate. For example, referring to FIG. 5C and FIG. 14B, in each sub-pixel of the plurality of sub-pixels, the orthographic projection of the channel region C1 of the driving transistor T1 on the base substrate 1 is located within the orthographic projection of the second portion 22 of the first electrode 2 on the base substrate 1; and the orthographic projection of the channel region C2 of the data writing transistor on the base substrate 1 is located within the orthographic projection of the first portion 21 of the first electrode 2 on the base substrate 1, and is located on the side, close to the second portion 22 of the first electrode 2, of the orthographic projection of the channel region C3 of the detection transistor T3 on the base substrate 1.

For example, at least part of the orthographic projection of the detection transistor T3 on the base substrate 1 is located outside the orthographic projection of the opening region on the base substrate 1, for example, at least part of the orthographic projection of the second pole T3*d* of the detection transistor T3 on the base substrate 1 is located outside the orthographic projection of the opening region on the base substrate 1. With such design, while meeting the requirement that the first electrode covers and shields the channel regions of all transistors in the pixel circuit of the sub-pixel where the first electrode is located, the first electrode does not need to be made too large, thereby ensuring the space between the first electrode of the first sub-pixel P1 and the first electrode of the third sub-pixel P3 adjacent to the first sub-pixel P1, ensuring that a portion of the detection transistor T3 that is not necessarily shielded is located in the space between the first electrode of the first sub-pixel P1 and the first electrode of the third sub-pixel P3 adjacent to the first sub-pixel P1, so as to make full use of the limited space, and achieve a high PPI.

For example, referring to FIG. 14A-FIG. 14B, the area of the opening region of the third sub-pixel P3 is larger than the area of the opening region 60 of the first sub-pixel P1, and the third distance d3 is greater than the first distance d1. For example, the area of the first sub-opening 601 of the third sub-pixel P3 is larger than the area of the first sub-opening 601 of the first sub-pixel P1; or, the sum of the areas of the first sub-opening 601 and the second sub-opening 602 of the third sub-pixel P3 is larger than the sum of the areas of the first sub-opening 601 and the second sub-opening 602 of the first sub-pixel P1. For example, the first sub-pixel P1 emits red light, the third sub-pixel P3 emits white light, and the third distance d3 is greater than the first distance d1, so as to ensure that in both the first sub-pixel P1 and third sub-pixel P3 adjacent to the first sub-pixel P1, the first electrode can block the channel region of the detection transistor located in the boundary region between the first sub-pixel P1 and the third sub-pixel P3.

It should be noted that, the above-mentioned embodiment introduces each edge of the first electrode of one sub-pixel and each edge of the opening region of one sub-pixel by taking the case that the first electrode of one sub-pixel includes the first portion and the second portion that are spaced apart from each other as an example. However, the embodiments of the present disclosure are not limited to this case, in other embodiments, the first electrode of the sub-pixel may be a continuous and integrated structure, or may include more than two portions spaced apart from each other, in all cases, the first electrode, the second edge, the third edge and the fourth edge are determined by taking the entire first electrode as a whole structure.

Figure 15:
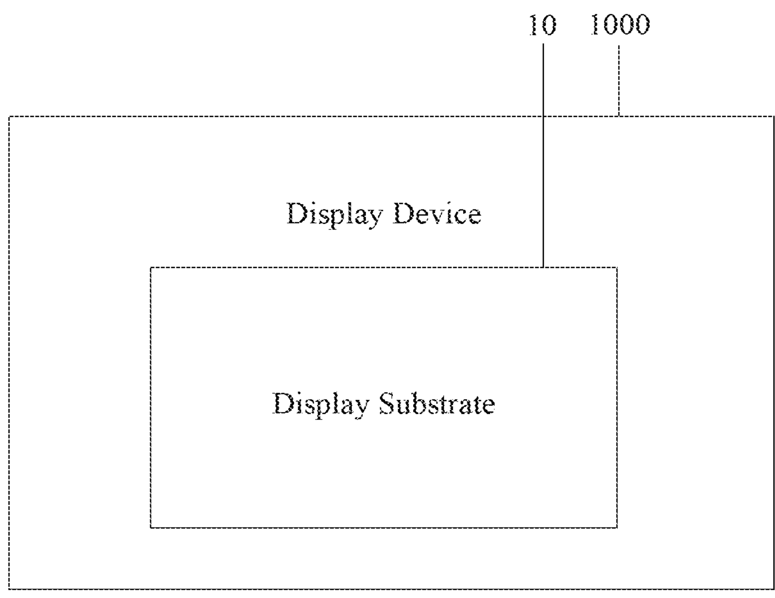
FIG. 15 is a schematic diagram of a display apparatus provided by an embodiment of the present disclosure.

As illustrated in FIG. 15, at least one embodiment of the present disclosure further provides a display apparatus 1000. As illustrated in FIG. 15, the display apparatus 1000 includes any one of the display substrates 10 provided by the embodiments of the present disclosure. The display apparatus 1000 may be, for example, a device with a display function, such as an organic light emitting diode display apparatus, a quantum dot light emitting diode display apparatus, etc., or other types of devices. The embodiments of the present disclosure impose no limitation to this aspect.

The structure, function and technical effects of the display apparatus provided by the embodiments of the present disclosure can refer to the corresponding descriptions of the display substrate 10 provided by the embodiments of the present disclosure, and details are not described here again.

For example, the display apparatus 1000 provided by at least one embodiment of the present disclosure may be any product or component with display function, such as a display panel, a mobile phone, a tablet computer, a television, a monitor, a notebook computer, a digital photo frame, a navigator, etc., and the embodiments of the present disclosure are not limited in this aspect.

What have been described above are only exemplary embodiments of the present disclosure, and are not intended to limit the protection scope of the present disclosure, and the protection scope of the present disclosure is determined by the appended claims.

What is claimed is:

1. A display substrate, comprising:

a base substrate; and a display unit which is on the base substrate and comprises a display region and a non-light-emitting region, wherein the display region comprises a sub-pixel, the sub-pixel comprises a driving transistor and a light-emitting device, the driving transistor is configured to control magnitude of a driving current flowing through the light-emitting device, and the light-emitting device is configured to receive the driving current and be driven by the driving current to emit light; the light-emitting device comprises a first electrode and a common electrode, and the common electrode is connected to a common voltage terminal;

the display unit comprises:

an auxiliary electrode line, comprising a longitudinal portion located in the display region and a lateral portion at least partially located in the non-light-emitting region, wherein the lateral portion is connected to the longitudinal portion;

a first auxiliary electrode, in the non-light-emitting region and electrically connected to the common electrode; and an auxiliary insulation layer, comprising a first auxiliary via hole located in the non-light-emitting region and exposing at least part of the lateral portion, wherein the first auxiliary electrode is connected to the lateral portion through the first auxiliary via hole;

the lateral portion, the first auxiliary electrode, and the first auxiliary via hole constitute one auxiliary unit, and the display unit comprises a plurality of the auxiliary units; the lateral portion of the auxiliary electrode line extends along a first direction, the longitudinal portion of the auxiliary electrode line extends along a second direction intersecting with the first direction, and the plurality of the auxiliary units are arranged at intervals in the second direction.

2. The display substrate according to claim 1, wherein the plurality of the auxiliary units comprise a first auxiliary unit and a second auxiliary unit, and the first auxiliary unit and the second auxiliary unit are respectively the one auxiliary unit; and a distance between a first auxiliary via hole of the second auxiliary unit and the display region in the first direction is greater than a distance between a first auxiliary via hole of the first auxiliary unit and the display region in the first direction.

3. The display substrate according to claim 2, wherein a length of the lateral portion of the second auxiliary unit in the first direction is greater than a length of the lateral portion of the first auxiliary unit in the first direction.

4. The display substrate according to claim 3, wherein the first auxiliary electrode comprises:

a first sub-conductive layer, connected to the lateral portion through the first auxiliary via hole;

a first stacked portion which is electrically connected to the first sub-conductive layer and stacked with the first stacked portion in a direction perpendicular to the base substrate, located on a side of the first sub-conductive layer away from the base substrate, and comprises a first stacked layer and a second stacked layer that are stacked with each other in the direction perpendicular to the base substrate, wherein the second stacked layer is located on a side of the first stacked layer away from the base substrate and is connected to the common electrode; and a second stacked portion which is stacked with the first sub-conductive layer in the direction perpendicular to the base substrate, located on the side of the first sub-conductive layer away from the base substrate and located on a side of the first stacked portion away from the base substrate, electrically connected to the first stacked portion through the first sub-conductive layer, and comprises a third stacked layer and a fourth stacked layer that are stacked with each other in the direction perpendicular to the base substrate, wherein the third stacked layer, the first stacked layer and a light-emitting layer of the light-emitting device located in the display region are made of a same material, in a same layer, and spaced apart from each other in a direction parallel to the base substrate, and the fourth stacked layer, the second stacked layer and the common electrode of the light-emitting device located in the display region are in a same layer, and spaced apart from each other in the direction parallel to the base substrate; and the first stacked layer of the first stacked portion of the second auxiliary unit comprises an intermediate via hole, and the second stacked layer of the first stacked portion of the second auxiliary unit is electrically connected to the first sub-conductive layer of the second auxiliary unit through the intermediate via hole.

5. The display substrate according to claim 1, wherein an area of a planar shape of a first auxiliary via hole of the second auxiliary unit is larger than an area of a planar shape of a first auxiliary via hole of the first auxiliary unit.

6. The display substrate according to claim 2, wherein one display unit comprises at least two first auxiliary units, and an amount of the second auxiliary units is greater than or equal to one.

7. The display substrate according to claim 6, wherein the one display unit comprises at least three first auxiliary units, and in the second direction, at least one second auxiliary unit is located between any two of the at least three first auxiliary units.

8. The display substrate according to claim 6, wherein the display unit comprises a plurality of sub-pixels arranged in an array, and the array comprises a first pixel row extending along the first direction and a second pixel row extending along the first direction;

the first pixel row comprises a first sub-pixel and a second sub-pixel that are arranged adjacent to each other, and the second pixel row comprises a third sub-pixel and a fourth sub-pixel that are arranged adjacent to each other;

in one display unit, the at least two first auxiliary units comprise No. 1 first auxiliary unit, No. 2 first auxiliary unit and No. 3 first auxiliary unit; and the No. 1 first auxiliary unit and the No. 2 first auxiliary unit are in the second sub-pixel, and the No. 3 auxiliary unit and the second auxiliary unit are in the fourth sub-pixel.

9. The display substrate according to claim 8, wherein each sub-pixel of the display unit comprises:

a connection structure, electrically connecting a first portion of the first electrode and a second portion of the first electrode, and comprising a connection portion located in the non-light-emitting region; and a first transfer electrode, electrically connected to a first pole of the driving transistor and comprising a portion located in the non-light-emitting region, wherein the connection portion is electrically connected, in the non-light-emitting region, to the portion of the first transfer electrode located in the non-light-emitting region;

the first transfer electrode comprises:

a first transfer portion, located in the display region and electrically connected to the first pole of the driving transistor, wherein a portion of the first transfer electrode located in the non-light-emitting region is a second transfer portion of the first transfer electrode, the second transfer portion is electrically connected to the first transfer portion, the connection portion and the second transfer portion are respectively in different layers, and the connection portion is electrically connected, in the non-light-emitting region, to the second transfer portion through a first via hole; and the No. 1 first auxiliary unit and the No. 2 first auxiliary unit are respectively located on two opposite sides of the connection portion of the second sub-pixel in the second direction, and the No. 3 first auxiliary unit and the second auxiliary unit are respectively located on two opposite sides of the connection portion of the fourth sub-pixel in the second direction.

10. The display substrate according to claim 9, wherein in the second direction, the second auxiliary unit is located on a side of the connection portion of the fourth sub-pixel close to a junction of the fourth sub-pixel and the second sub-pixel; or in the second direction, the second auxiliary unit is located on a side of the connection portion of the fourth sub-pixel away from the junction of the fourth sub-pixel and the second sub-pixel.

11. The display substrate according to claim 8, wherein an area of a planar shape of the first auxiliary via hole of the first auxiliary unit is larger than an area of a planar shape of the first via hole.

12. The display substrate according to claim 1, wherein in one auxiliary unit of the at least one auxiliary unit, the first auxiliary electrode comprises:

a first sub-conductive layer, connected to the lateral portion through the first auxiliary via hole;

a first stacked portion which is electrically connected to the first sub-conductive layer and stacked with the first sub-conductive layer in a direction perpendicular to the base substrate, located on a side of the first sub-conductive layer away from the base substrate, and comprises a first stacked layer and a second stacked layer that are stacked with each other in the direction perpendicular to the base substrate, wherein the second stacked layer is located on a side of the first stacked layer away from the base substrate and is connected to the common electrode; and a second stacked portion which is stacked with the first sub-conductive layer in the direction perpendicular to the base substrate, located on the side of the first sub-conductive layer away from the base substrate and located on a side of the first stacked portion away from the base substrate, electrically connected to the first stacked portion through the first sub-conductive layer, and comprises a third stacked layer and a fourth that are stacked layer stacked with each other in the direction perpendicular to the base substrate, wherein the third stacked layer and the first stacked layer are made of a same material, in a same layer, and spaced apart from each other in a direction parallel to the base substrate, and the fourth stacked layer and the second stacked layer are made of a same material, in a same layer, and spaced apart from each other in the direction parallel to the base substrate.

13. The display substrate according to claim 12, wherein the second stacked layer is electrically connected to the common electrode and is in contact with the first sub-conductive layer; the first stacked layer is in contact with the first sub-conductive layer; and the second stacked layer comprises an upper portion covering an upper surface of the first stacked layer away from the base substrate and a side portion covering a side surface of the first stacked layer intersecting with the upper surface of the first stacked layer, and the side portion is in contact with the first sub-conductive layer.

14. The display substrate according to claim 13, wherein the second stacked portion further comprises:

a fifth stacked layer, located between the first sub-conductive layer and the third stacked layer; and a sixth stacked layer, located between the fifth stacked layer and the third stacked layer, wherein the fifth stacked layer and the sixth stacked layer are stacked with the first sub-conductive layer, the third stacked layer, and the fourth stacked layer in a direction perpendicular to the base substrate and are electrically connected to each other, and the fifth stacked layer and the sixth stacked layer are both spaced apart from both of the first stacked layer and the second stacked layer in a direction parallel to the base substrate;

an orthographic projection of the sixth stacked layer on the base substrate comprises a middle region and an edge region surrounding the middle region, and an orthographic projection of the fifth stacked layer on the base substrate overlaps with the middle region, and does not overlap with the edge region; and the second stacked layer is in contact with the first sub-conductive layer in a first region, and an orthographic projection of the first region on the base substrate is at least partially within an orthographic projection of the edge region on the base substrate.

15. The display substrate according to claim 14, wherein the light-emitting device further comprises a first electrode and a light-emitting layer that are located in the display region, the light-emitting layer is sandwiched between the first electrode and the common electrode, and the first electrode comprises a first sub-electrode layer, a second sub-electrode layer and a third sub-electrode layer that are sequentially stacked in the direction perpendicular to the base substrate and along a direction from a position close to the base substrate to a position away from the base substrate; and the first sub-conductive layer of the first auxiliary electrode and the first sub-electrode layer are made of a same material and in a same layer, the first stacked layer and the light-emitting layer constitute a continuous and integrated structure, the second stacked layer and the common electrode constitute a continuous and integrated structure, the third stacked layer and the light-emitting layer are made of a same material and in a same layer, the fourth stacked layer, the second stacked layer, and the common electrode are made of a same material and in a same layer, the fifth stacked layer and the second sub-electrode layer are made of a same material and in a same layer, and the sixth stacked layer and the third sub-electrode layer are made of a same material and in a same layer.

16. The display substrate according to claim 1, wherein the display unit further comprises:

a second auxiliary electrode, located in the display region and electrically connected to the common electrode; and the auxiliary insulation layer further comprises a second auxiliary via hole which is located in the display region and exposes at least part of the longitudinal portion of the auxiliary electrode line, and the second auxiliary electrode is connected to the longitudinal portion of the auxiliary electrode line through the second auxiliary via hole.

17. The display substrate according to claim 16, wherein the second auxiliary electrode comprises:

a second sub-conductive layer, connected to the longitudinal portion of the auxiliary electrode line through the second auxiliary via hole;

a first stacked portion which is electrically connected to the second sub-conductive layer of the second auxiliary electrode and stacked in a direction perpendicular to the base substrate, located on a side of the second sub-conductive layer of the second auxiliary electrode away from the base substrate, and comprises a first stacked layer and a second stacked layer stacked on each other in the direction perpendicular to the base substrate, wherein the second stacked layer of the second auxiliary electrode is located on a side of the first stacked layer of the second auxiliary electrode away from the base substrate and is connected to the common electrode; and a second stacked portion which is stacked on the second sub-conductive layer of the second auxiliary electrode in the direction perpendicular to the base substrate, located on the side of the second sub-conductive layer of the second auxiliary electrode away from the base substrate and located on a side of the first stacked portion of the second auxiliary electrode away from the base substrate, electrically connected to the first stacked portion of the second auxiliary electrode through the second sub-conductive layer, and comprises a third stacked layer and a fourth stacked layer that are stacked with each other in the direction perpendicular to the base substrate, wherein the third stacked layer of the second auxiliary electrode and the first stacked layer of the second auxiliary electrode are made of a same material, in a same layer, and spaced apart from each other in a direction parallel to the base substrate, and the fourth stacked layer of the second auxiliary electrode and the second stacked layer of the second auxiliary electrode are made of a same material, in a same layer, and spaced apart from each other in the direction parallel to the base substrate.

18. The display substrate according to claim 17, wherein the second stacked layer of the second auxiliary electrode is connected to the common electrode and in contact with the second sub-conductive layer of the second auxiliary electrode.

19. The display substrate according to claim 1, wherein the lateral portion of the auxiliary electrode line extends along a first direction, and the longitudinal portion of the auxiliary electrode line extends along a second direction intersecting with the first direction;

the display substrate further comprises:

a first power supply line, connected to a first voltage terminal and configured to provide a first power supply voltage different from a common voltage to the sub-pixel, and comprising a longitudinal portion extending along the second direction as a whole, wherein the longitudinal portion of the first power supply line and the longitudinal portion of the auxiliary electrode line are arranged at intervals in the first direction, and are respectively located at a first edge of the display region in the first direction and at a second edge, opposite the first edge, of the display region in the first direction; and a region, between an edge of the longitudinal portion of the first power supply line away from the longitudinal portion of the auxiliary electrode line and an edge of the longitudinal portion of the auxiliary electrode line away from the longitudinal portion of the first power supply line, is the display region.

20. A display apparatus, comprising the display substrate according to claim 1.

* * * * *